United States Patent
Goto et al.

(10) Patent No.: US 11,067,890 B2
(45) Date of Patent: Jul. 20, 2021

(54) ACTINIC RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

(71) Applicant: FUJIFILM Corporation, Tokyo (JP)

(72) Inventors: Akiyoshi Goto, Shizuoka (JP); Masafumi Kojima, Shizuoka (JP); Akira Takada, Shizuoka (JP); Keita Kato, Shizuoka (JP); Kyohei Sakita, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 119 days.

(21) Appl. No.: 16/507,150

(22) Filed: Jul. 10, 2019

(65) Prior Publication Data

US 2020/0012189 A1 Jan. 9, 2020

Related U.S. Application Data

(63) Continuation of application No. PCT/JP2018/003996, filed on Feb. 6, 2018.

(30) Foreign Application Priority Data

Mar. 13, 2017 (JP) .............................. JP2017-047572

(51) Int. Cl.
*G03F 7/031* (2006.01)
*G03F 7/038* (2006.01)

(52) U.S. Cl.
CPC ............ *G03F 7/031* (2013.01); *G03F 7/0388* (2013.01)

(58) Field of Classification Search
CPC ........ G03F 7/031; G03F 7/0045; G03F 7/004; G03F 7/0046; C07C 381/12
See application file for complete search history.

(56) References Cited

U.S. PATENT DOCUMENTS

2011/0008735 A1* 1/2011 Ohsawa ................ G03F 7/0045
 430/326
2015/0301451 A1  10/2015 Iwato 2015/0346600 A1  12/2015 Adachi et al.
2016/0004155 A1  1/2016 Ohashi et al.
2016/0349612 A1  12/2016 Fujiwara et al.

FOREIGN PATENT DOCUMENTS

| JP | 2014-170205 A | 9/2004 |
| JP | 2014-102334 A | 6/2014 |
| JP | 2015-225251 A | 12/2015 |
| JP | 2016-018007 A | 2/2016 |
| JP | 2016-222549 A | 12/2016 |
| KR | 10-2011-0004799 A | 1/2011 |

OTHER PUBLICATIONS

International Search Report dated Apr. 24, 2018 from the International Searching Authority in counterpart International Application No. PCT/JP2018/003996.
Written Opinion dated Apr. 24, 2018 from the International Bureau in counterpart International Application No. PCT/JP2018/003996.
International Preliminary Report on Patentability dated Sep. 17, 2019 from the International Bureau in counterpart International Application No. PCT/JP2018/003996.
Office Action dated May 1, 2021 by the Korean Patent Office in Korean application No. 10-2019-7021166.

* cited by examiner

*Primary Examiner* — John A McPherson
*Assistant Examiner* — Nicholas E Brown
(74) *Attorney, Agent, or Firm* — Sughrue Mion, PLLC

(57) ABSTRACT

An actinic ray-sensitive or radiation-sensitive resin composition contains a compound represented by General Formula (1). In General Formula (1), X represents a sulfur atom or an iodine atom. m represents 1 or 2, in a case where X is a sulfur atom, m is 2, and in a case where X is an iodine atom, m is 1. $R_1$'s each independently represent an alkyl group or alkenyl group which may include a heteroatom, an aromatic heterocyclic group, or an aromatic hydrocarbon ring group. Further, in a case where m is 2, two $R_1$'s may be bonded to each other to form a ring. $R_2$ represents a divalent linking group. $R_3$ represents a divalent linking group having no aromatic group. $Y^-$ represents an anionic moiety. The pKa of the compound represented by General Formula (1) as $Y^-$ is protonated is −2.0 to 1.5.

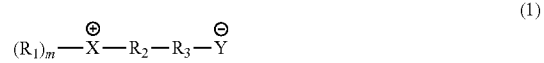

(1)

12 Claims, No Drawings

ACTINIC RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

CROSS-REFERENCE TO RELATED APPLICATIONS

This application is a Continuation of PCT International Application No. PCT/JP2018/3996, filed on Feb. 6, 2018, which claims priority under 35 U.S.C. § 119(a) to Japanese Patent Application No. 2017-047572, filed on Mar. 13, 2017. Each of the above application(s) is hereby expressly incorporated by reference, in its entirety, into the present application.

BACKGROUND OF THE INVENTION

1. Field of the Invention

The present invention relates to an actinic ray-sensitive or radiation-sensitive resin composition, a resist film, a pattern forming method, and a method for manufacturing an electronic device.

2. Description of the Related Art

In processes for manufacturing semiconductor devices such as an integrated circuit (IC) and a large scale integrated circuit (LSI) in the related art, microfabrication by lithography using a resist composition has been carried out.

For example, JP2016-018007A discloses a betaine-type acid generator capable of generating an acid upon irradiation of radiation, and a radiation-sensitive resin composition containing the acid generator. An acid generated by the acid generator has a function to cause a deprotection reaction of a resin component in the composition or generates a cross-linking reaction of the resin component.

SUMMARY OF THE INVENTION

The present inventors have prepared an actinic ray-sensitive or radiation-sensitive resin composition using the betaine-type acid generator described in JP2016-018007A. and have conducted studies on the composition. Thus, they have found that the exposure latitude (EL) is not necessarily sufficient and there is still a room for further improvement.

Therefore, an object of the present invention is to provide an actinic ray-sensitive or radiation-sensitive resin composition having an excellent exposure latitude (EL).

Another object of the present invention is to provide a resist film, a pattern forming method, and a method for manufacturing an electronic device, each of which uses the actinic ray-sensitive or radiation-sensitive resin composition.

The present inventors have conducted studies in order to accomplish the objects, and as a result, they have found that it is possible to accomplish the objects by using a composition containing an acid generator having a specific structure in which the acid generator has a pKa of −2.0 to 1.5 as it is protonated (in other words, an acid generator having a specific structure in which a pKa for a conjugated acid is −2.0 to 1.5), thereby leading to completion of the present invention.

That is, the present inventors have found that the objects can be accomplished by the following configurations.

[1] An actinic ray-sensitive or radiation-sensitive resin composition comprising a compound represented by General Formula (1) which will be described later.

[2] The actinic ray-sensitive or radiation-sensitive resin composition as described in [1],
in which X is a sulfur atom.

[3] The actinic ray-sensitive or radiation-sensitive resin composition as described in [1] or [2],
in which $R_2$ is a divalent linking group represented by General Formula (2) which will be described later.

[4] The actinic ray-sensitive or radiation-sensitive resin composition as described in [3],
in which $L_1$ is a single bond.

[5] The actinic ray-sensitive or radiation-sensitive resin composition as described in any one of [1] to [4],
in which a pKa of the compound represented by General Formula (1) as $Y^-$ is protonated is −1.0 to 1.0.

[6] The actinic ray-sensitive or radiation-sensitive resin composition as described in any one of [1] to [5], further comprising an acid generator other than the compound represented by General Formula (1).

[7] The actinic ray-sensitive or radiation-sensitive resin composition as described in [6],
in which a pKa of an acid generated from the acid generator other than the compound represented by General Formula (1) is lower than the pKa of the compound represented by General Formula (1) as $Y^-$ is protonated.

[8] The actinic ray-sensitive or radiation-sensitive resin composition as described in any one of [1] to [7],
in which the compound represented by General Formula (1) is a compound represented by General Formula (1A) which will be described later.

[9] The actinic ray-sensitive or radiation-sensitive resin composition as described in any one of [1] to [8],
in which $R_3$ —O—, —CO—, —S—, —SO—, —$SO_2$—, —$NR_d$—, an alkylene group which may be substituted with a fluorine atom, or a group formed by combination of two or more of these groups, and $R_d$ is a hydrogen atom or an alkyl group.

[10] The actinic ray-sensitive or radiation-sensitive resin composition as described in any one of [1] to [9], further comprising a resin having a repeating unit having a group whose polarity increases through decomposition by the action of an acid.

[11] A resist film formed using the actinic ray-sensitive or radiation-sensitive resin composition as described in any one of [1] to [10].

[12] A pattern forming method comprising:
forming a resist film using the actinic ray-sensitive or radiation-sensitive resin composition as described in any one of [1] to [10]:
exposing the resist film; and
developing the exposed resist film using a developer.

[13] A method for manufacturing an electronic device, comprising the pattern forming method as described in [12].

According to the present invention, it is possible to provide an actinic ray-sensitive or radiation-sensitive resin composition having an excellent exposure latitude (EL).

In addition, according to the present invention, it is possible to provide a resist film, a pattern forming method, and a method for manufacturing an electronic device, each of which uses the actinic ray-sensitive or radiation-sensitive resin composition.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

"Actinic rays" or "radiation" in the present specification means, for example, a bright line spectrum of a mercury lamp, far ultraviolet rays typified by an excimer laser, extreme ultraviolet rays (EUV rays), X-rays, electron beams (EB), or the like. "Light" in the present specification means actinic rays or radiation.

"Exposure" in the present specification encompasses, unless otherwise specified, not only exposure by a bright line spectrum of a mercury lamp, far ultraviolet rays typified by an excimer laser, extreme ultraviolet rays (EUV rays), X-rays, or the like, but also writing by particle rays such as electron beams and ion beams.

In the present specification, a numerical range expressed using "to" is used in a meaning of a range that includes the preceding and succeeding numerical values of "to" as the lower limit value and the upper limit value, respectively.

In the present specification, (meth)acrylate represents acrylate and methacrylate.

In the present specification, the weight-average molecular weight (Mw), the number-average molecular weight (Mn), and the dispersity (also referred to as a molecular weight distribution (Mw/Mn) of a resin are defined as values in terms of polystyrene by means of gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, and detector: differential refractive index (RI) detector) using a GPC apparatus (HLC-8120GPC manufactured by Tosoh Corporation).

In citations for a group (atomic group) in the present specification, in a case where the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group). In addition, an "organic group" in the present specification refers to a group including at least one carbon atom.

Furthermore, in the present specification, in a case where "a substituent may be contained", the types of substituents, the positions of the substituents, and the number of the substituents are not particularly limited. The number of the substituents may be, for example, one, two, three, or more. Examples of the substituent include a monovalent non-metal atomic group except for a hydrogen atom, and the substituent can be selected from, for example, the following substituent group T.

(Substituent T)

Examples of the substituent T include halogen atoms such as a fluorine atom, a chlorine atom, a bromine atom, and an iodine atom, alkoxy groups such as a methoxy group, an ethoxy group, and a tert-butoxy group: aryloxy groups such as a phenoxy group and a p-tolyloxy group; alkoxycarbonyl groups such as a methoxycarbonyl group, a butoxycarbonyl group, and a phenoxycarbonyl group: acyloxy groups such as an acetoxy group, a propionyloxy group, and a benzoyloxy group; acyl groups such as an acetyl group, a benzoyl group, an isobutyryl group, an acryloyl group, a methacryloyl group, and a methoxalyl group; alkylsulfanyl groups such as a methylsulfanyl group and a tert-butylsulfanyl group; arylsulfanyl groups such as a phenylsulfanyl group and a p-tolylsulfanyl group; an alkyl group; a cycloalkyl group: an aryl group: a heteroaryl group; a hydroxyl group; a carboxyl group; a formyl group; a sulfo group; a cyano group: an alkylaminocarbonyl group; an arylaminocarbonyl group; a sulfonamido group; a silyl group: an amino group; a monoalkylamino group; a dialkylamino group; an arylamino group; and a combination thereof.

[Actinic Ray-Sensitive or Radiation-Sensitive Resin Composition]

The actinic ray-sensitive or radiation-sensitive resin composition of an embodiment of the present invention contains a compound represented by General Formula (1) (acid generator) which will be described later. The compound represented by General Formula (1) has a betaine-type structure and a pKa of the compound represented by General Formula (1) as $Y^-$ is protonated (in other words, a pKa of the compound as $Y^-$ in the compound represented by General Formula (1) (acid generator) is protonated) is −2.0 to 1.5.

That is, since the compound represented by General Formula (1) has a betaine-type structure, it has a cationic moiety having a bulky structure in a molecule thereof and has properties with high polarity, which is presumed to cause it to have low diffusivity. Further, the compound represented by General Formula (1) has a pKa of the compound represented by General Formula (1) as $Y^-$ is protonated of −2.0 to 1.5, that is, a lower acid strength than that of an acid generated by the betaine-type acid generator disclosed in JP2016-018007A. Upon exposure of an actinic ray-sensitive or radiation-sensitive film formed by the actinic ray-sensitive or radiation-sensitive resin composition, the reaction rate of a deprotection reaction is high in a case where the deprotection reaction of an acid-decomposable resin is performed using an acid having a high acid strength, and as a result, the acid is easily diffused as the film is rapidly plasticized. In contrast, since the compound represented by General Formula (1) has a pKa of −2.0 to 1.5 even with respect to an acid generated therewith, the deprotection reaction proceeds smoothly, and thus it is presumed that diffusion of an acid is more suppressed than that in a case of using the acid generator of JP2016-018007A. In addition, the pKa of an acid generated by the acid generator of JP2016-018007A is −3.0 or less in any case.

As a result, it is presumed that the actinic ray-sensitive or radiation-sensitive resin composition of the embodiment of the present invention has excellent EL performance.

Furthermore, the present inventors have found that in a case where the actinic ray-sensitive or radiation-sensitive resin composition contains the compound represented by General Formula (1) and another acid generator, variation in line width roughness (LWR) performance of a pattern thus formed is further improved. In particular, the effect is more significant in a case where an acid generated by such another acid generator has a higher acid strength (in other words, a lower pKa) than the acid generated by the compound represented by General Formula (1).

The acid generated by the compound represented by General Formula (1) has a pKa which is substantially the same as that of the compound represented by General Formula (1) as $Y^-$ is protonated, and the pKa is −2.0 to 1.5. That is, the acid generated from the compound represented by General Formula (1) becomes a relatively weak acid with respect to a general acid generator capable of generating a deprotection reaction of an acid-decomposable resin. In this regard, the acid generated by the compound represented by General Formula (1) itself contributes to the deprotection reaction of the acid-decomposable resin, while has a function to neutralize a strong acid generated by another acid generator. As a result, it is presumed that a variation in acid concentrations in an exposed region is suppressed and the LWR performance of a pattern thus formed is excellent.

Hereinafter, the components included in the actinic ray-sensitive or radiation-sensitive resin composition of the embodiment of the present invention (hereinafter also referred to as a "the composition of the embodiment of the present invention") will be described in details. Incidentally, the radiation-sensitive or actinic ray-sensitive resin composition of the embodiment of the present invention is a so-called resist composition, and may be either a positive-tone resist composition or a negative-tone resist composition. In addition, the composition may be either a resist composition for alkali development or a resist composition for organic solvent development.

The radiation-sensitive or actinic ray-sensitive resin composition of the embodiment of the present invention is typically a chemically amplified resist composition.

Hereinafter, the compound represented by General Formula (1) will be described.

The compound represented by General Formula (1) is a so-called acid generator, and is also a compound capable of generating an acid upon irradiation with actinic rays or radiation.

<Compound Represented by General Formula (1)>

(1)

In General Formula (1), X represents a sulfur atom or an iodine atom, m represents 1 or 2, in a case where X is a sulfur atom, m is 2, and in a case where X is an iodine atom, m is 1. $R_1$ each independently represent an alkyl group or alkenyl group which may have a heteroatom, an aromatic heterocyclic group, or an aromatic hydrocarbon ring group. Further, in a case where m is 2, two $R_1$'s may be bonded to each other to form a ring. $R_2$ represents a divalent linking group. $R_3$ represents a divalent linking group including a non-aromatic group. $Y^-$ represents an anionic moiety.

Here, a pKa of the compound represented by General Formula (1) as $Y^-$ is protonated is −2.0 to 1.5.

X represents a sulfur atom or an iodine atom, and from the viewpoint that the EL performance and/or LWR performance is more excellent, the sulfur atom is preferable.

m represents 1 or 2, in a case where X is a sulfur atom, m is 2, and in a case where X is an iodine atom, m is 1.

The alkyl group which may include a heteroatom represented by $R_1$ is not particularly limited, but examples thereof include an alkyl group having 1 to 30 carbon atoms (which may be in any one of linear, branched, and cyclic forms), and an alkyl group having 1 to 30 carbon atoms (which may be in any one of linear, branched, and cyclic forms), which contains a heteroatom.

Examples of the alkyl group having 1 to 30 carbon atoms, which contains a heteroatom, include an alkyl group in which one or two or more —$CH_2$—'s are substituted with —O—, —S—, —CO—, —$NR_6$—, or an alkyl group substituted with a divalent organic group formed by combination of two or more of these groups. $R_6$ represents a hydrogen atom or an alkyl group having 1 to 6 carbon atoms.

Specific examples of the alkyl group which may include a heteroatom represented by $R_1$ include a methyl group, an ethyl group, a propyl group, a butyl group, a pentyl group, a hexyl group, a heptyl group, an octyl group, a nonyl group, a decyl group, dodecyl group, tetradecyl group, an octadecyl group, isopropyl group, an isobutyl group, a sec-butyl group, a t-butyl group, a 1-ethylpentyl group, and a 2-ethylhexyl group.

The alkenyl group which may include a heteroatom, represented by $R_1$, is not particularly limited, but is, for example, an alkenyl group having 1 to 30 carbon atoms (which may be in any one of linear, branched, and cyclic forms), and an alkenyl group having 1 to 30 carbon atoms (which may be in any one of linear, branched, and cyclic forms), which contains a heteroatom.

Examples of the alkenyl group having 1 to 30 carbon atoms, which contains a heteroatom, include an alkenyl group in which one or two or more —$CH_2$— is substituted with —O—, —S—, —CO—, —$NR_6$—, or a divalent organic group formed by combination of two or more of these groups. $R_6$ represents a hydrogen atom or an alkyl group having 1 to 6 carbon atoms.

Specific examples of the alkenyl group which may include a heteroatom, represented by $R_1$, include a vinyl group, a propenyl group, a butenyl group, a pentenyl group, a hexenyl group, a heptenyl group, an octenyl group, a nonenyl group, and a decenyl group.

The aromatic heterocyclic group represented by $R_1$ may be any one of a monocyclic structure and a polycyclic structure. Examples of the heteroatom included in the aromatic heterocyclic group include a nitrogen atom, an oxygen atom, and a sulfur atom. The number of carbon atoms of the aromatic heterocyclic group is not particularly limited, but is preferably 4 to 18. Specific examples of a ring constituting the aromatic heterocyclic group include a pyridine ring, a pyridazine ring, a pyrimidine ring, a pyrazine ring, a triazine ring, a thiophene ring, a thiazole ring, and an imidazole ring.

The aromatic hydrocarbon ring group represented by $R_1$ may be nay one of a monocyclic structure and a polycyclic structure. The number of carbon atoms of the aromatic hydrocarbon ring group is not particularly limited, but is preferably 5 to 18, and more preferably 5 to 10. Specific examples of the aromatic hydrocarbon ring group include an aryl group (a phenyl group, a tolyl group, a xylyl group, and the like), a naphthyl group, a anthryl group, a phenanthryl group, an indenyl group, an acetonaphtheny group, a fluorenyl group, and a pyrenyl group.

The alkyl group or alkenyl group which may have a heteroatom, the aromatic heterocyclic group, or the aromatic hydrocarbon ring group, represented by $R_1$, may have a substituent. The type of the substituent is not particularly limited, and examples thereof include the group exemplified in the above-mentioned substituent group T.

Moreover, in a case where m is 2, two $R_1$'s may be bonded to each other to form a ring.

The divalent linking group represented by $R_2$ is not particularly limited, but examples thereof include —O—, —CO—, divalent a hydrocarbon group (for example, an alkylene group, an alkenylene group (example: —CH=CH—), an alkynylene group (example: —C≡C—), and an arylene group), and a group formed by combination of two or more of these groups. Among those. $R_2$ is preferably a divalent linking group represented by General Formula (2) from the viewpoint that the EL performance and/or LWR performance is more excellent.

(2)

In General Formula (2). $L_1$ represents a single bond or a divalent linking group. $T_1$ represents a divalent aromatic hydrocarbon ring group or a divalent aromatic heterocyclic group. * represents a bonding position with X. ** represents a bonding position with $R_3$.

In General Formula (2), $L_1$ represents a single bond or a divalent linking group.

The divalent linking group represented by $L_1$ is not particularly limited, but examples thereof include —O—, —CO—, an alkylene group having 1 to 6 carbon atoms, an alkenylene group having 1 to 6 carbon atoms, an alkynylene group having 1 to 6 carbon atoms, and a group formed by combination of two or more of these groups.

Among those, from the viewpoint that the EL performance and/or LWR performance is more excellent, $L_1$ is preferably a single bond.

$T_1$ represents a divalent aromatic hydrocarbon ring group or a divalent aromatic heterocyclic group.

The divalent aromatic hydrocarbon ring group represented by $T_1$ may be may be any one of a monocyclic structure and a polycyclic structure.

The number of carbon atoms of the aromatic hydrocarbon ring, from which the divalent aromatic hydrocarbon ring group represented by $T_1$ is derived, is not particularly limited, but is preferably 5 to 18, and more preferably 5 to 10. Examples of the aromatic hydrocarbon ring include a benzene ring, a naphthalene ring, an anthracene ring, and a phenanthrene ring.

The number of carbon atoms of the aromatic heterocycle, from which the divalent aromatic heterocyclic group represented by $T_1$ is derived, is not particularly limited, but is preferably 4 to 18, and more preferably 4 to 10. Examples of the aromatic heterocycle include a thiophene ring, a thiazole ring, an imidazole ring, a pyridine ring, a pyridazine ring, a pyrimidine ring, a pyrazine ring, and a triazine ring.

Among those, from the viewpoint that the EL performance and/or LWR performance is more excellent, $T_1$ is preferably a divalent aromatic hydrocarbon ring group, and more preferably a divalent benzene ring group.

The divalent aromatic hydrocarbon ring group or divalent aromatic heterocyclic group represented by $T_1$ may have a substituent. The type of the substituent is not particularly limited, and examples thereof include the group exemplified in the above-mentioned substituent group T.

In General Formula (2), * represents a bonding position with X in General Formula (1). Further, ** represents a bonding position with $R_3$ in General Formula (1).

$R_3$ represents a divalent linking group including a non-aromatic group. Here, the "non-aromatic group" means a group not having aromaticity.

The divalent linking group including a non-aromatic ring represented by $R_3$ is not particularly limited as long as it is a divalent linking group having no aromatic group, but is preferably —O—, —CO—, —S—, —SO—, —SO$_2$—, —NR$_d$—, an alkylene group which may be substituted with a fluorine atom (preferably having 1 to 10 carbon atoms), or a group formed by combination of two or more of these groups from the viewpoint that the EL performance and/or LWR performance is more excellent. Further, $R_d$ is a hydrogen atom or an alkyl group.

Among those, from the viewpoint that the EL performance and/or LWR performance is more excellent, —O—, —CO—, —SO$_2$—, —CH$_2$—, —CHF—, —CF$_2$—, or a group formed by combination of two or more of these groups is more preferable.

In addition, since the pKa is set to be in a predetermined range, in a case where $Y^-$ which will be described later is —SO$_3^-$, it is preferable that a position for bonding with $Y^-$ of $R_3$ is not —CF$_2$—.

$Y^-$ represents an anionic moiety.

$Y^-$ is not particularly limited as long as it is a moiety having an anion, but examples thereof include —COO$^-$, —SO$_3^-$, —N$^-$—SO$_2$—CF$_2$, and —N$^-$—SO$_2$—CHF.

With regard to the compound represented by General Formula (1), the pKa of the compound represented by General Formula (1) as $Y^-$ is protonated is −2.0 to 1.5.

The pKa of the compound represented by General Formula (1) as the anionic moiety is protonated can be adjusted by the type of $Y^-$ and the type of $R_3$.

Among those, from the viewpoint that the EL performance and/or LWR performance is more excellent, the pKa of the compound represented by General Formula (1) as $Y^-$ is protonated is preferably −1.0 to 1.0. In addition, the acid dissociation constant (pKa) of the compound represented by General Formula (1) can be measured by the following method.

(Measurement of Acid Dissociation Constant pKa)

In the present specification, the acid dissociation constant pKa indicates an acid dissociation constant pKa in an aqueous solution, and is described, for example, in Chemical Handbook (II) (Revised 4$^{th}$ Edition, 1993, compiled by the Chemical Society of Japan, Maruzen Company, Ltd.), and a lower value thereof indicates higher acid strength. Specifically, the acid dissociation constant pKa in an aqueous solution may be measured by using an infinite-dilution aqueous solution and measuring the acid dissociation constant at 25° C., or a value based on the Hammett substituent constants and the database of publicly known literature data can also be obtained by computation using the following software package 1. All the values of pKa described in the present specification indicate values determined by computation using this software package.

Software package 1: Advanced Chemistry Development (ACD/Labs) Software V 8.14 for Solaris (1994-2007 ACD/Labs).

Among the compounds represented by General Formula (1), from the viewpoint that the EL performance and/or LWR performance is more excellent, a compound represented by General Formula (1A) is preferable.

<Compound Represented by General Formula (1A)>

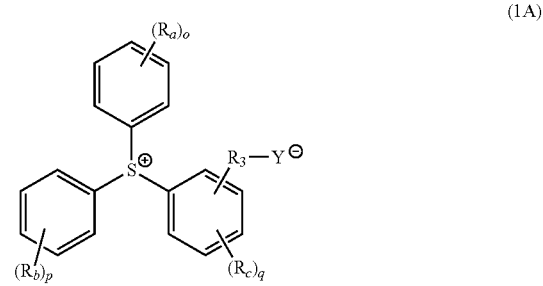

(1A)

$R_a$, $R_b$, and $R_c$ each independently represent a halogen atom, an alkyl group, a cycloalkyl group, an alkoxy group, an alkylcarbonyloxy group, an alkyloxycarbonyl group, or a alkylthio group. o, p, and q each independently represent an integer of 0 to 3. In a case where o is 2 or more, a plurality of $R_a$'s may be the same as or different from each other and at least two $R_a$'s may be bonded to each other to form a ring. In a case where p is 2 or more, a plurality of $R_b$'s may be the same as or different from each other and at least two $R_b$'s may be bonded to each other to form a ring. In a case where q is 2 or more, a plurality of $R_c$'s may be the same as or different from each other and at least two $R_c$'s may be bonded to each other to form a ring. $R_3$ represents a divalent linking group including a non-aromatic group. $Y^-$ represents an anionic moiety.

Here, the pKa of the compound represented by General Formula (1A) as $Y^-$ is protonated is −2.0 to 1.5.

In General Formula (1A), the halogen atom represented by each of $R_a$, $R_b$, and $R_c$ is not particularly limited, but examples thereof include a fluorine atom, a chlorine atom, a bromine atom and an iodine atom.

In General Formula (1A), the alkyl group represented by each of $R_a$, $R_b$, and $R_c$ is not particularly limited, but examples thereof include an alkyl group having 1 to 10 carbon atoms, and specifically a methyl group, an ethyl group, and a tert-butyl group.

In General Formula (1A), the cycloalkyl group represented by each of $R_a$, $R_b$, and $R_c$ is not particularly limited, but examples thereof include a cycloalkyl group having 1 to 10 carbon atoms, and specifically a cyclohexyl group and an adamantyl group.

In General Formula (1A), the alkoxy group represented by each of $R_a$, $R_b$, and $R_c$ is not particularly limited, but examples thereof include an alkoxy group having 1 to 10 carbon atoms, and specifically an ethoxy group, and a tert-butoxy group.

In General Formula (1A), examples of the alkylcarbonyloxy group represented by each of $R_a$, $R_b$, and $R_c$ include an alkylcarbonyloxy group having 1 to 10 carbon atoms, and specifically an acetoxy group and a propionyloxy group.

In General Formula (1A), examples of the alkyloxycarbonyl group represented by each of $R_a$, $R_b$, and $R_c$ include an alkyloxycarbonyl group having 1 to 10 carbon atoms, and specifically a methoxycarbonyl group and a butoxycarbonyl group.

In General Formula (1A), examples of the alkylthio group represented by each of $R_a$, $R_b$, and $R_c$ include an alkylthio group having 1 to 10 carbon atoms, and specifically a methylthio group and an ethylthio group.

o, p, and q each independently represent an integer of 0 to 3, and are preferably 0 to 2, and more preferably 0 or 1.

Furthermore, in a case where o is 2 or more, a plurality of $R_a$'s may be the same as or different from each other and at least two $R_a$'s may be bonded to each other to form a ring.

Moreover, in a case where p is 2 or more, a plurality of $R_b$'s may be the same as or different from each other and at least two $R_b$'s may be bonded to each other to form a ring.

In addition, in a case where q is 2 or more, a plurality of $R_c$'s may be the same as or different from each other and at least two $R_c$'s may be bonded to each other to form a ring.

$R_3$ and $Y^-$ in General Formula (1A) have the same definitions as $R_3$ and $Y^-$, respectively, in General Formula (1), and preferred aspects thereof are also the same.

In addition, from the viewpoint that the EL performance and/or LWR performance is more excellent, the pKa of the compound represented by General Formula (1A) as $Y^-$ is protonated is preferably −1.0 to 1.0.

The compound represented by General Formula (1) can be synthesized by, for example, a known method.

Hereinafter, specific examples of the compound represented by General Formula (1) are shown below, but the present invention is not limited thereto. Further, a pKa of any of the compounds exemplified below as the anionic moiety is protonated is −2.0 to 1.5.

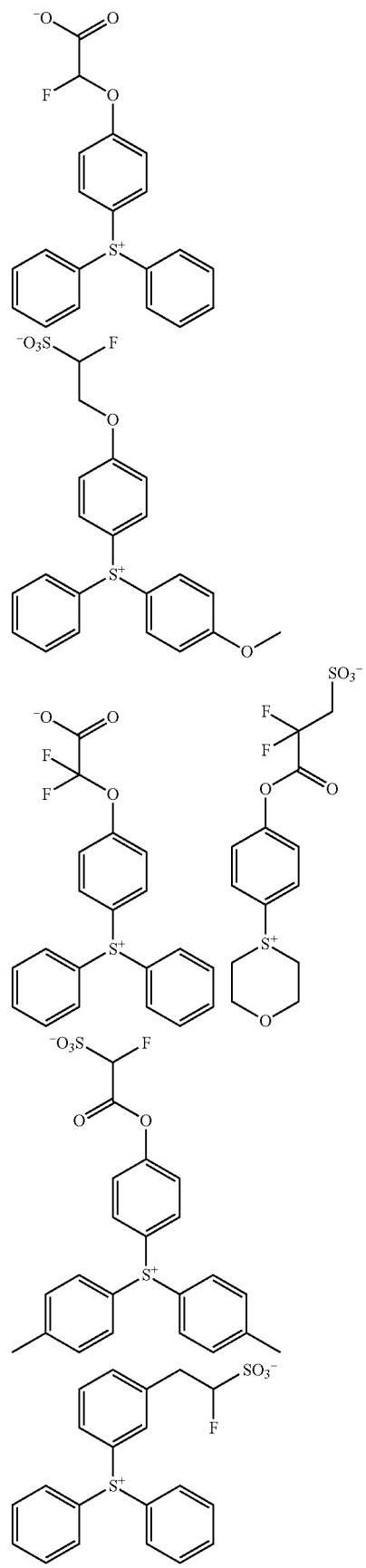

-continued

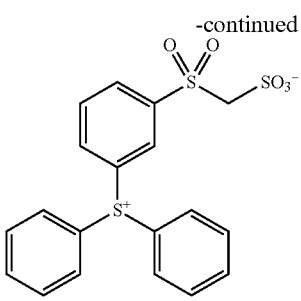

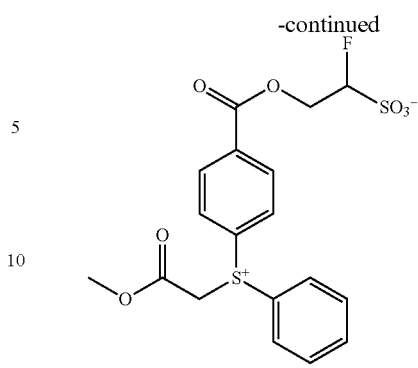

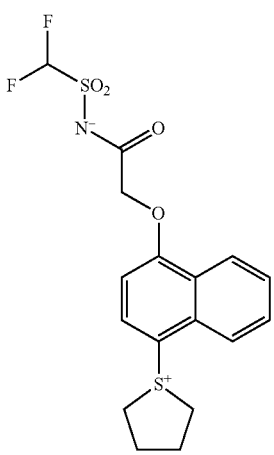

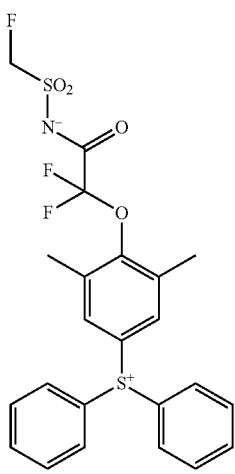

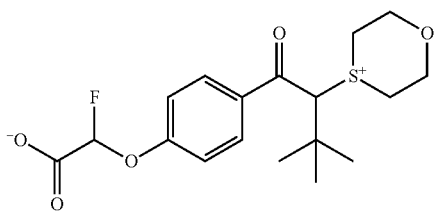

The content of the compound represented by General Formula (1) is preferably 0.1% to 15% by mass, and more preferably 0.3% to 10% by mass, with respect to the total solid content of the actinic ray-sensitive or radiation-sensitive resin composition.

In addition, the compound represented by General Formula (1) may be used alone or in combination of two or more kinds thereof. In a case where two or more kinds of the compounds represented by General Formula (1) are used in combination, the total content thereof is preferably within the range.

<Resin (A)>

The composition of the embodiment the present invention preferably contains a resin (hereinafter also referred to as an "acid-decomposable resin" or a "resin (A)") having a group (hereinafter also referred to as an "acid-decomposable group") group whose polarity increases through decomposition by the action of an acid.

In this case, in the pattern forming method of the embodiment of the present invention, typically, in a case where an alkali developer is adopted as the developer, a positive-tone pattern is suitably formed, and in a case where an organic developer is adopted as the developer, a negative-tone pattern is suitably formed.

The resin (A) preferably has a repeating unit having an acid-decomposable group.

As the resin (A), a known resin can be appropriately used. For example, known resins disclosed in paragraphs <0055> to <0191> of US2016/0274458A1A, paragraphs <0035> to <0085> of US2015/0004544A1, and paragraphs <0045> to <0090> of US2016/0147150A1 can be suitably used as the resin (A).

The acid-decomposable group preferably has a structure in which a polar group is protected with a group (leaving group) capable of decomposing by the action of an acid to leave.

Examples of the polar group an acidic group (a group that dissociates in a 2.38%-by-mass aqueous tetramethylammonium hydroxide solution such as a carboxy group, a phenolic hydroxyl group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl) imido group, a tris(alkylcarbonyl)methylene group, and a tris(alkylsulfonyl)methylene group, and an alcoholic hydroxyl group.

Furthermore, the alcoholic hydroxyl group refers to a hydroxyl group bonded to a hydrocarbon group, which is a hydroxyl group other than a hydroxyl group (phenolic hydroxyl group) directly bonded to an aromatic ring, from which an aliphatic alcohol (for example, a hexafluoroisopropanol group) having the α-position substituted with an electron withdrawing group such as a fluorine atom is excluded as a hydroxyl group. The alcoholic hydroxyl group is preferably a hydroxyl group having an acid dissociation constant (pKa) from 12 to 20.

Preferred examples of the polar group include a carboxyl group, a fluorinated alcohol group (preferably a hexafluoroisopropanol group), and a sulfonic acid group.

A group which is preferable as the acid-decomposable group is a group in which a hydrogen atom of the polar group is substituted with a group that leaves by the action of an acid.

Examples of the group (leaving group) that leaves by an acid include —C($R_{36}$)($R_{37}$)($R_{38}$), —C($R_{36}$)($R_{37}$)(O$R_{39}$), and —C($R_{01}$)($R_{02}$)(O$R_{39}$).

In the formulae. $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

As the alkyl group as each of $R_{36}$ to $R_{39}$, $R_{01}$, and $R_{02}$, an alkyl group having 1 to 8 carbon atoms is preferable, and examples thereof include a methyl group, an ethyl group, a propyl group, an n-butyl group, a sec-butyl group, a hexyl group, and an octyl group.

A cycloalkyl group as each of $R_{36}$ to $R_{39}$, $R_{01}$, and $R_{02}$ may be a monocyclic cycloalkyl group or a polycyclic cycloalkyl group. As the monocyclic cycloalkyl group, a cycloalkyl group having 3 to 8 carbon atoms is preferable, and examples thereof include a cyclopropyl group, a cyclobutyl group, a cyclopentyl group, a cyclohexyl group, and a cyclooctyl group. As the polycyclic cycloalkyl group, a cycloalkyl group having 6 to 20 carbon atoms is preferable, and examples thereof include an adamantyl group, a norbornyl group, an isobornyl group, a camphonyl group, a dicyclopentyl group, an α-pinene group, a tricyclodecanyl group, a tetracyclododecyl group, and an androstanyl group. Further, at least one carbon atom in the cycloalkyl group may be substituted with heteroatoms such as an oxygen atom.

An aryl group as each of $R_{36}$ to $R_{39}$, $R_{01}$, and $R_{02}$ is preferably an aryl group having 6 to 10 carbon atoms, and examples thereof include a phenyl group, a naphthyl group, and an anthryl group.

An aralkyl group as each of $R_{36}$ to $R_{39}$, $R_{01}$, and $R_{02}$ is preferably an aralkyl group having 7 to 12 carbon atoms, and examples thereof include a benzyl group, a phenethyl group, and a naphthylmethyl group.

An alkenyl group as each of $R_{36}$ to $R_{39}$, $R_{01}$, and $R_{02}$ is preferably an alkenyl group having 2 to 8 carbon atoms, and examples thereof include a vinyl group, an allyl group, a butenyl group, and a cyclohexenyl group.

A ring formed by the bonding of $R_{36}$ and $R_{37}$ is preferably a (monocyclic or polycyclic) cycloalkyl group. As the cycloalkyl group, monocyclic cycloalkyl groups such as a cyclopentyl group and a cyclohexyl group, and polycyclic cycloalkyl groups such as a norbornyl group, a tetracyclodecanyl group, a tetracyclododecanyl group, and an adamantyl group are preferable.

The acid-decomposable group is preferably a cumyl ester group, an enol ester group, an acetal group, an acetal ester group, a tertiary alkyl ester group, or the like, and more preferably an acetal ester group or a tertiary alkyl ester group.

The resin (A) preferably has a repeating unit represented by General Formula (AI) as the repeating unit having an acid-decomposable group.

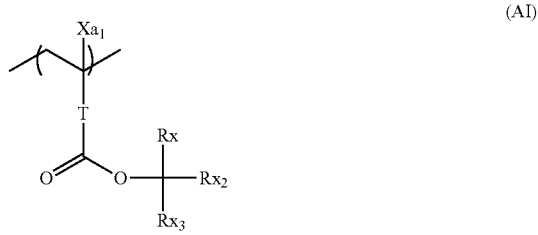

(AI)

In General Formula (AI).

$Xa_1$ represents a hydrogen atom, halogen atom, or a monovalent organic group.

T represents a single bond or a divalent linking group.

$Rx_1$ to $Rx_3$ each independently represent an alkyl group or a cycloalkyl group.

Any two of $Rx_1$ to $Rx_3$ may or may not be bonded to each other to form a ring structure.

Examples of the divalent linking group of T include an alkylene group, an arylene group, —COO-Rt-, and —O-Rt-, In the formula, Rt represents an alkylene group, a cycloalkylene group, or an arylene group.

T is preferably a single bond or —COO-Rt-. Rt is preferably an alkylene group having 1 to 5 carbon atoms, and more preferably a —$CH_2$— group, a —$(CH_2)_2$— group, or a —$(CH_2)_3$— group. T is more preferably a single bond.

$Xa_1$ is preferably a hydrogen atom or an alkyl group.

The alkyl group of $Xa_1$ may have a substituent, and examples of the substituent include a hydroxyl group and a halogen atom (preferably a fluorine atom).

The alkyl group of $Xa_1$ preferably has 1 to 4 carbon atoms, and examples thereof include a methyl group, an ethyl group, a propyl group, a hydroxymethyl group, and a trifluoromethyl group. The alkyl group of $Xa_1$ is preferably a methyl group.

The alkyl group of each of $Rx_1$, $Rx_2$, and $Rx_3$ may be linear or branched, and is preferably a methyl group, an ethyl group, an n-propyl group, an isopropyl group, an n-butyl group, an isobutyl group, a t-butyl group, or the like is preferable. The number of the carbon atoms of the alkyl group is preferably 1 to 10, more preferably 1 to 5, and still more preferably 1 to 3. The alkyl group of each of $Rx_1$, $Rx_2$, and $Rx_3$ may have some of carbon-carbon bonds that are double-bonded.

The cycloalkyl group of each of $Rx_1$, $Rx_2$, and $Rx_3$ is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group.

As the ring structure formed by the bonding of two of $Rx_1$, $Rx_2$, and $Rx_3$, a monocyclic cycloalkane ring such as a cyclopentyl ring, a cyclohexyl ring, a cycloheptyl ring, and a cyclooctane ring, and a polycyclic cycloalkyl group such as a norbomane ring, a tetracyclodecane ring, a tetracyclododecane ring, and an adamantane ring are preferable. Among those, the cyclopentyl ring, the cyclohexyl ring, or the adamantane ring is more preferable. As the ring structure formed by the bonding of two of $Rx_1$, $Rx_2$, and $Rx_3$, a structure shown below is also preferable.

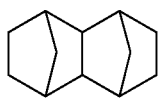

Specific examples of a monomer corresponding to the repeating unit represented by General Formula (AI) are shown below, but the present invention is not limited to these specific examples. The following specific examples correspond to a case where $Xa_1$ in General Formula (AI) is a methyl group, but $Xa_1$ can be optionally substituted with a hydrogen atom, a halogen atom, or a monovalent organic group.

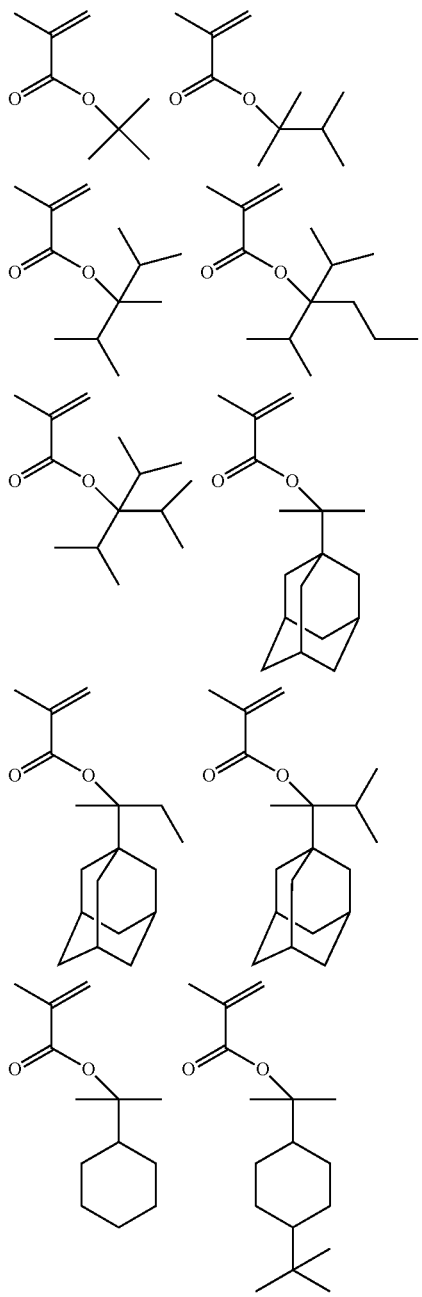

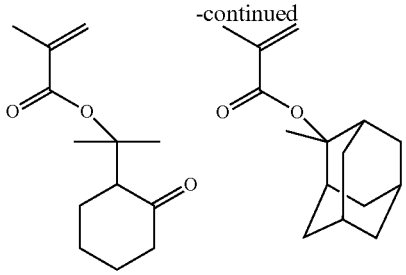

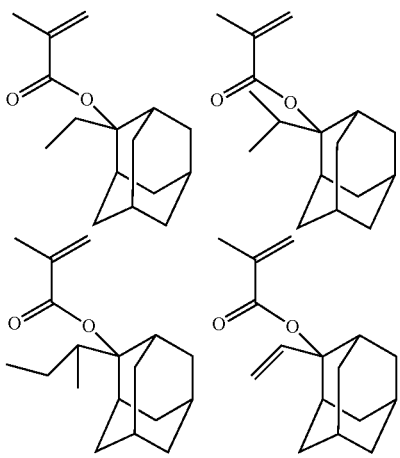

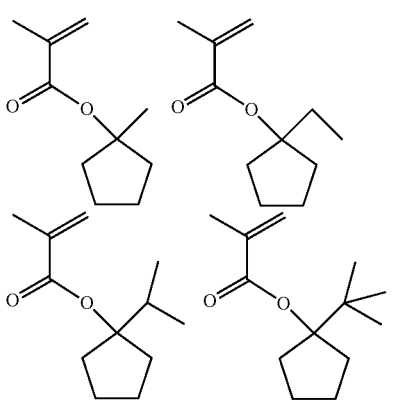

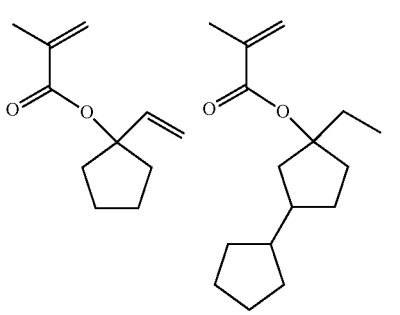

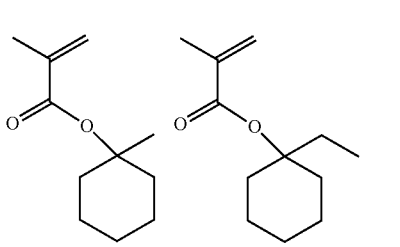

-continued

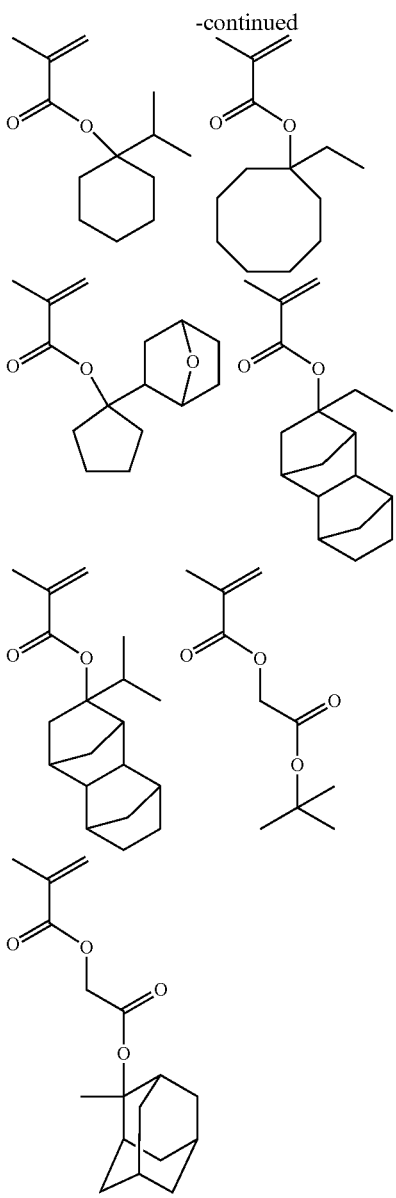

It is also preferable that the resin (A) has the repeating unit described in paragraphs <0336> to <0369> of US2016/0070167A1 as the repeating unit having an acid-decomposable group.

In addition, the resin (A) may have a repeating unit including a group capable of decomposing by the action of an acid to generate an alcoholic hydroxyl group described in paragraphs <0363> and <0364> of US2016/0070167A1 as the repeating unit having an acid-decomposable group.

The resin (A) may include only one kind or two or more kinds of the repeating units having an acid-decomposable group in combination.

The content of the repeating units having an acid-decomposable group included in the resin (A) (a total of the contents in a case where the repeating units having an acid-decomposable group are present in plural number) is preferably 10% to 90% by mole, more preferably 20% to 80% by mole, and still more preferably 30% to 70% by mole, with respect to all the repeating units in the resin (A).

The resin (A) preferably has a repeating unit having at least one selected from the group consisting of a lactone structure, a sultone structure, and a carbonate structure.

As the lactone structure or sultone structure, any structure may be used as long as it has a lactone structure or sultone structure, but the structure is preferably a 5- to 7-membered ring lactone structure or a 5- to 7-membered ring sultone structure, and more preferably a 5- to 7-membered ring lactone structure to which another ring structure is fused in the form of forming a bicyclo structure or a spiro structure or a 5- to 7-membered ring sultone structure to which another ring structure is fused in the form of forming a bicyclo structure or a spiro structure.

The resin (A) still more preferably has a repeating unit having a lactone structure represented by any one of General Formulae (LC1-1) to (LC1-21) or a sultone structure represented by any one of General Formulae (SL1-1) to (SL1-3). Further, the lactone structure or sultone structure may be bonded directly to the main chain. Preferred examples of the structure include a lactone structure represented by General Formula (LC1-1), General Formula (LC1-4), General Formula (LC1-5), General Formula (LC1-8), General Formula (LC1-16), or General Formula (LC1-21), or a sultone structure represented by General Formula (SL1-1).

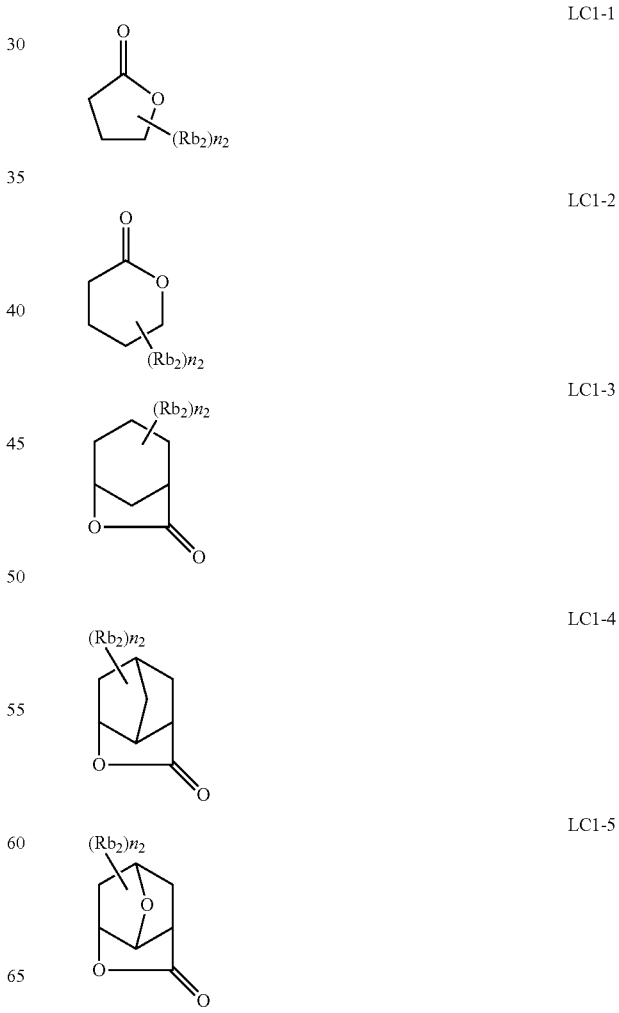

-continued
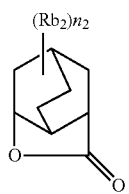
LC1-6
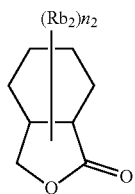
LC1-7
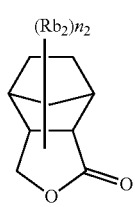
LC1-8
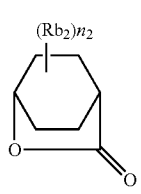
LC1-9
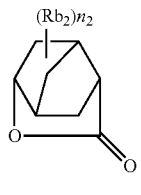
LC1-10
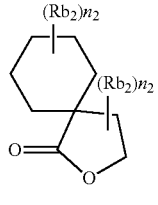
LC1-11
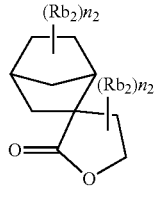
LC1-12
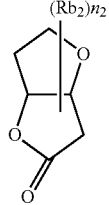
LC1-13
-continued
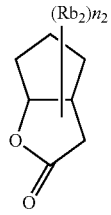
LC1-14
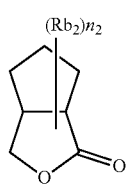
LC1-15
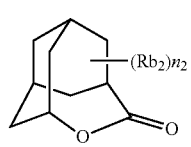
LC1-16
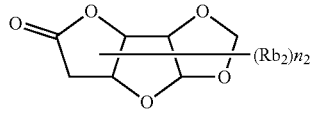
LC1-17
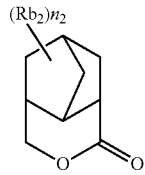
LC1-18
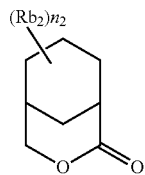
LC1-19
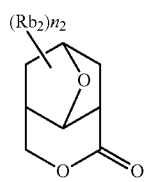
LC1-20
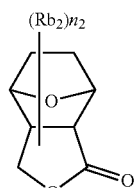
LC1-21
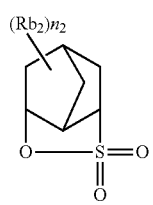
SL1-1

-continued

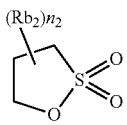
SL1-2

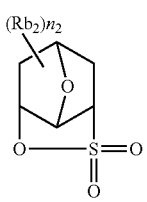
SL1-3

The lactone structural moiety or the sultone structural moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. Among these, an alkyl group having 1 to 4 carbon atoms, a cyano group, and an acid-decomposable group are more preferable, $n_2$ represents an integer of 0 to 4. In a case where $n_2$ is 2 or more, the substituents ($Rb_2$) which are present in plural number may be the same as or different from each other. Further, the substituents ($Rb_2$) which are present in plural number may be bonded to each other to form a ring.

As the repeating unit having a lactone structure or sultone structure, a repeating unit represented by General Formula (III) is preferable.

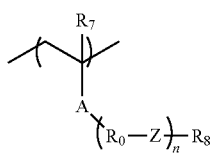
(III)

In General Formula (III),

A represents an ester bond (a group represented by —COO—) or an amide bond (a group represented by —CONH—).

n is the repetition number of the structure represented by —$R_0$—Z—, represents an integer of 0 to 5, and is preferably 0 or 1, and more preferably 0. In a case where n is 0, —$R_0$—Z— is not present, and is thus a single bond.

$R_0$ represents an alkylene group, a cycloalkylene group, or a combination thereof. In a case where $R_0$'s are present in plural number, they each independently represent an alkylene group, a cycloalkylene group, or a combination thereof.

Z represents a single bond, an ether bond, an ester bond, an amide bond, a urethane bond, or a urea bond. In a case where Z's are present in plural number, they each independently represent a single bond, an ether bond, an ester bond, an amide bond, or a urethane bond.

$R_8$ represents a monovalent organic group having a lactone structure or sultone structure.

$R_7$ represents a hydrogen atom, a halogen atom, or a monovalent organic group (preferably a methyl group).

The alkylene group or the cycloalkylene group of $R_0$ may have a substituent.

Z is preferably an ether bond or an ester bond, and more preferably an ester bond.

The resin (A) may have a repeating unit having a carbonate structure. The carbonate structure is preferably a cyclic carbonate ester structure.

The repeating unit having a cyclic carbonate ester structure is preferably a repeating unit represented by General Formula (A-1).

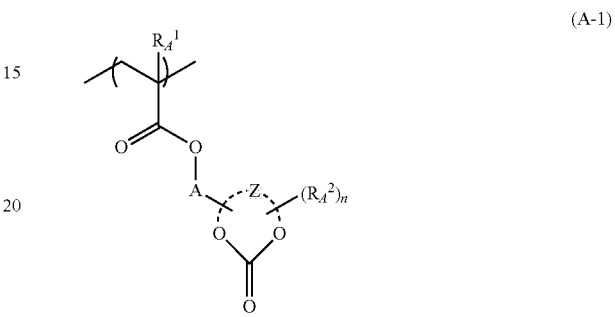
(A-1)

In General Formula (A-1), $R_A^1$ represents a hydrogen atom, a halogen atom, or a monovalent organic group (preferably a methyl group).

n represents an integer of 0 or more.

$R_A^2$ represents a substituent. In a case where n is 2 or more, $R_A^2$'s each independently represent a substituent.

A represents a single bond or a divalent linking group.

Z represents an atomic group which forms a monocyclic or polycyclic structure together with a group represented by —O—C(=O)—O— in the formula.

It is also preferable that the resin (A) has the repeating unit described in paragraphs <0370> to <0414> of US2016/0070167A1 as the repeating unit having at least one selected from the group consisting of a lactone structure, a sultone structure, and a carbonate structure.

The resin (A) may have only one kind or two or more kinds of the repeating units having at least one selected from the group consisting of a lactone structure, a sultone structure, and a carbonate structure.

Specific examples of a monomer corresponding to the repeating unit represented by General Formula (III) and a monomer corresponding to the repeating unit represented by General Formula (A-1) are shown below, but the present invention is not limited to these specific examples. The following specific examples correspond to a case where $R_7$ in General Formula (III) and $R_A^1$ in General Formula (A-1) are each a methyl group, but $R_7$ and $R_A^1$ may be optionally substituted with a hydrogen atom, a halogen atom, or a monovalent organic group.

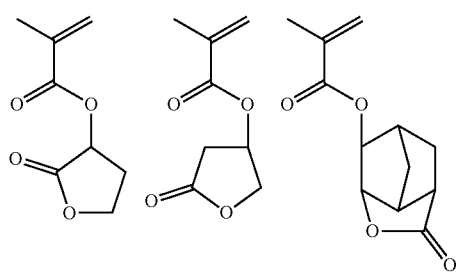

-continued
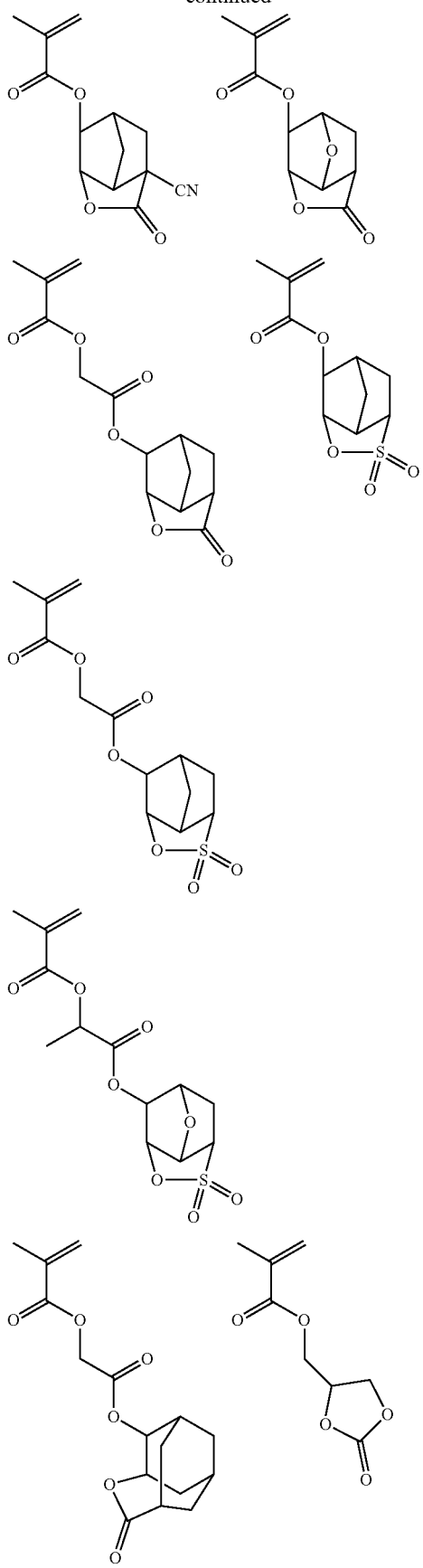
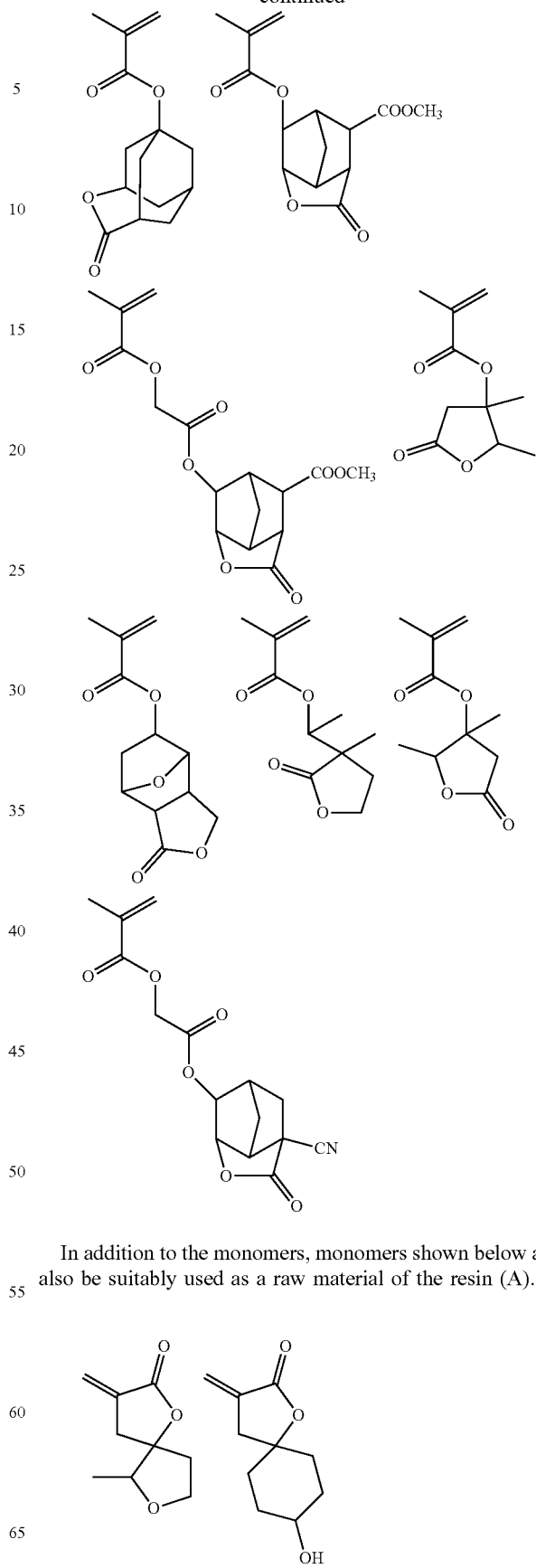
In addition to the monomers, monomers shown below are also be suitably used as a raw material of the resin (A).
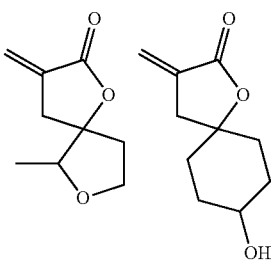

The content of the repeating unit having at least one selected from the group consisting of a lactone structure, a sultone structure, and a carbonate structure included in the resin (A) (a total of the contents in a case where the repeating units having at least one selected from the group consisting of a lactone structure, a sultone structure, and a carbonate structure are present in plural number) is preferably 5% to 70% by mole, more preferably 10% to 65% by mole, and still more preferably 20% to 60% by mole, with respect to all the repeating units in the resin (A).

The resin (A) preferably has a repeating unit having a polar group.

Examples of the polar group include a hydroxyl group, a cyano group, a carboxy group, and a fluorinated alcohol group.

As the repeating unit having a polar group, a repeating unit having an alicyclic hydrocarbon structure substituted with a polar group is preferable. Further, it is preferable that the repeating unit having a polar group does not have an acid-decomposable group. As the alicyclic hydrocarbon structure in the alicyclic hydrocarbon structure substituted with a polar group, an adamantyl group or a norbomane group is preferable.

Specific examples of a monomer corresponding to the repeating unit having a polar group are shown below, but the present invention is not limited to these specific examples.

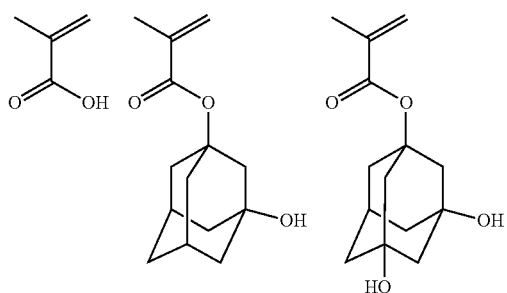

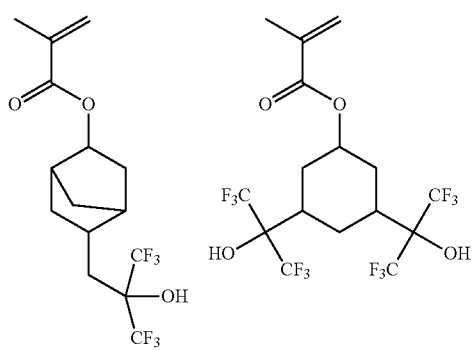

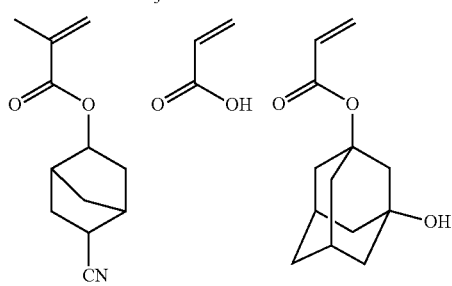

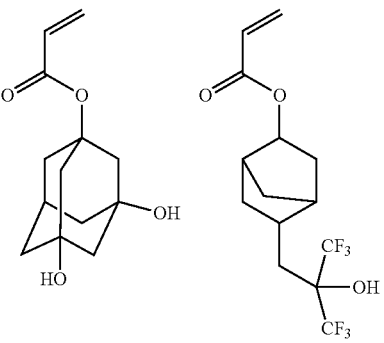

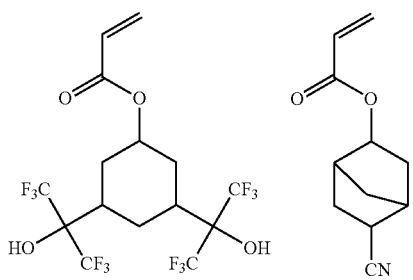

In addition to these, specific examples of the repeating unit having a polar group include the repeating units disclosed in paragraphs <0415> to <0433> of US2016/0070167A1.

The resin (A) may have only one kind or two or more kinds of the repeating units having a polar group in combination.

The content of the repeating unit having a polar group is preferably 5% to 40% by mole, more preferably 5% to 30% by mole, and still more preferably 10% to 25% by mole, with respect to all the repeating units in the resin (A).

The resin (A) may further have a repeating unit having neither an acid-decomposable group nor a polar group. The repeating unit having neither an acid-decomposable group nor a polar group preferably has an alicyclic hydrocarbon structure. Examples of the repeating unit having neither an acid-decomposable group nor a polar group include the repeating units described in paragraphs <0236> and <0237> of US2016/0026083A1. Preferred examples of a monomer corresponding to the repeating unit having neither an acid-decomposable group nor a polar group are shown below.

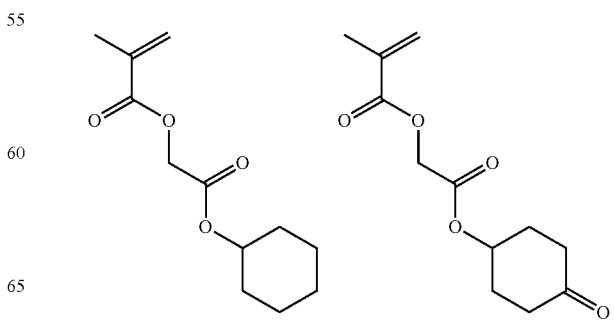

-continued

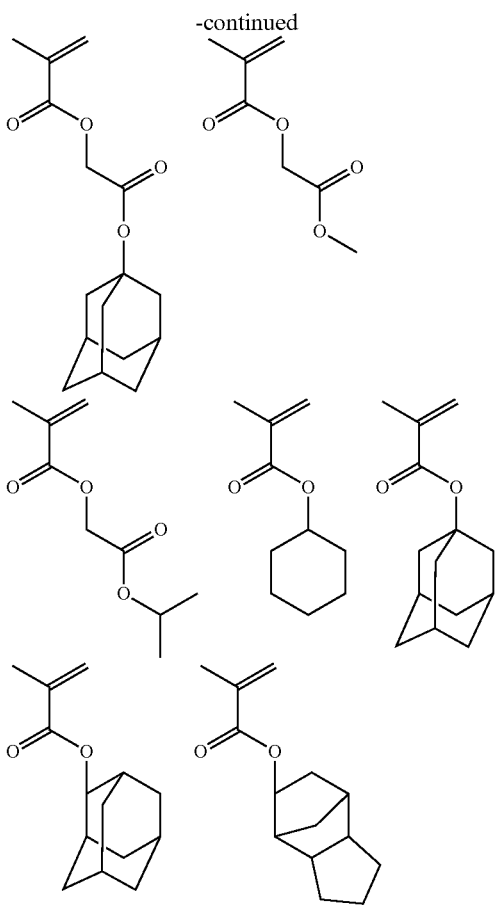

In addition to these, specific examples of the repeating unit having neither an acid-decomposable group nor a polar group include the repeating units disclosed in paragraph <0433> of US2016/0070167A1.

The resin (A) may have only one kind or two or more kinds of the repeating units having neither an acid-decomposable group nor a polar group in combination.

The content of the repeating unit having neither an acid-decomposable group nor a polar group is preferably 5% to 40% by mole, more preferably 5% to 30% by mole, and still more preferably 5% to 25% by mole, with respect to all the repeating units in the resin (A).

The resin (A) may include a variety of repeating structural units, in addition to the repeating structural units, for the purpose of controlling dry etching resistance, suitability for a standard developer, adhesiveness to a substrate, and a resist profile, resolving power, heat resistance, sensitivity, and the like which are general characteristics required for a resist.

Examples of such a repeating structural unit include, but are not limited to, repeating structural units corresponding to a predetermined monomer.

Examples of such a predetermined monomer include a compound having one addition-polymerizable unsaturated bond, which is selected from acrylic acid esters, methacrylic acid esters, acrylamides, methacrylamides, allyl compounds, vinyl ethers, vinyl esters, and the like.

In addition to these, an addition-polymerizable unsaturated compound that is copolymerizable with the monomers corresponding to various repeating structural units as described above may be copolymerized.

In the resin (A), the molar ratio of each repeating structural unit contained is appropriately set in order to control various types of performance.

In a case where the composition of the embodiment of the present invention is for ArF exposure, it is preferable that the resin (A) does not substantially have an aromatic group in terms of transparency to ArF light. More specifically, the proportion of repeating units having an aromatic group in all the repeating units of the resin (A) is preferably 5% by mole or less, and more preferably 3% by mole or less, and ideally 0% by mole of all the repeating units, that is, it is even more preferable that the resin (A) does not have a repeating unit having an aromatic group. Further, it is preferable that the resin (A) has a monocyclic or polycyclic alicyclic hydrocarbon structure.

The resin (A) is preferably a resin in which all the repeating units are constituted with (meth)acrylate-based repeating units. In this case, any of a resin in which all of the repeating units are methacrylate-based repeating units, a resin in which all of the repeating units are acrylate-based repeating units, and a resin in which all of the repeating units are methacrylate-based repeating units and acrylate-based repeating units can be used, but it is preferable that the acrylate-based repeating units account for 50% by mole or less of all of the repeating units of the resin (A).

In a case where the composition of the embodiment of the present invention is for KrF exposure, EB exposure, or EUV exposure, it is preferable that the resin (A) has a repeating unit having an aromatic hydrocarbon ring group. It is more preferable that the resin (A) has a repeating unit including a phenolic hydroxyl group. Examples of the repeating unit including containing a phenolic hydroxyl group include a hydroxystyrene repeating unit and a hydroxystyrene (meth)acrylate repeating unit.

In a case where the composition of the embodiment of the present invention is for KrF exposure, EB exposure, or EUV exposure, it is preferable that the resin (A) has a structure protected with a group in which a hydrogen atom of the phenolic hydroxyl group decomposes by the action of an acid to leave (leaving group).

The content of the repeating unit having the aromatic hydrocarbon ring group included in the resin (A) is preferably 30% to 100% by mole, more preferably 40% to 100% by mole, and still more preferably 50% to 100% by mole, with respect to all the repeating units in the resin (A).

The weight-average molecular weight of the resin (A) is preferably 1,000 to 200,000, more preferably 2,000 to 20,000, still more preferably 3,000 to 15,000, and particularly preferably 3,000 to 11,000. The dispersity (Mw/Mn) is usually 1.0 to 3.0, preferably 1.0 to 2.6, more preferably 1.0 to 2.0, and still particularly preferably 1.1 to 2.0.

The resin (A) may be used singly or in combination of two or more kinds thereof.

The content of the resin (A) in the composition of the embodiment of the present invention is generally 20% by mass or more with respect to the total solid content in many cases, and is preferably 40% by mass or more, more preferably 60% by mass or more, and still more preferably 80% by mass or more. The upper limit is not particularly limited, but is preferably 99.5% by mass or less, more preferably 99% by mass or less, and still more preferably 97% by mass or less.

<Resin (A1)>

In a case where the composition of the embodiment of the present invention includes a crosslinking agent (G) which will be described later, it is preferable that the composition of the embodiment of the present invention includes an alkali-soluble resin (A1) having a phenolic hydroxyl group (hereinafter also referred to as a "resin (A1)"). The resin (A1) preferably has a repeating unit having a phenolic hydroxyl group.

In this case, typically, the negative-tone pattern is suitably formed.

The crosslinking agent (G) may be in a form that is carried in the resin (A1).

The resin (A1) may have the above-mentioned acid-decomposable group.

The repeating unit having a phenolic hydroxyl group contained in the resin (A1) is preferably a repeating unit represented by General Formula (II).

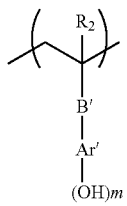

(II)

In General Formula (II), $R_2$ represents a hydrogen atom, an alkyl group (preferably a methyl group), or a halogen atom (preferably a fluorine atom).

B' represents a single bond or a divalent linking group.

Ar' represents an aromatic ring group.

m represents an integer of 1 or more.

The resin (A1) may be used singly or in combination of two or more kinds thereof.

The content of the resin (A1) in the total solid content of the composition of the embodiment of the present invention is generally 30% by mass or more in many cases, and is preferably 40% by mass or more, and more preferably 50% by mass or more. The upper limit is not particularly limited, but is preferably 99% by mass or less, more preferably 90% by mass or less, and still more preferably 85% by mass or less.

Suitable examples of the resin (A1) include the resins disclosed in paragraphs <0142> to <0347> of US2016/0282720A1.

The composition of the embodiment of the present invention may include both of the resin (A) and the resin (A1).

<Acid Generator (B)>

Typically, the composition of the embodiment of the present invention preferably includes an acid generator (B) (hereinafter also referred to as an "acid generator (B)"). Further, the acid generator (B) as mentioned herein does not include the above-mentioned compound represented by General Formula (1).

The acid generator (B) is a compound capable of generating an acid upon irradiation with actinic rays or radiation.

As the acid generator (B), a compound capable of generating an organic acid upon irradiation with actinic rays or radiation is preferable. Examples thereof include a sulfonium salt compound, an iodonium salt compound, a diazonium salt compound, a phosphonium salt compound, an imidesulfonate compound, an oximesulfonate compound, a diazodisulfone compound, a disulfone compound, and an o-nitrobenzylsulfonate compound.

As the acid generator (B), known compounds capable of generating an acid upon irradiation with actinic rays or radiation can be appropriately selected and used singly or as a mixture thereof. For example, the known compounds disclosed in paragraphs <0125> to <0319> of US2016/0070167A1, paragraphs <0086> to <0094> of US2015/0004544A1, and paragraphs <0323> to <0402> of US2016/0237190A1 can be suitably used as the acid generator (B).

As the acid generator (B), a compound represented by General Formula (ZI), General Formula (ZII), or General Formula (ZIII) is preferable.

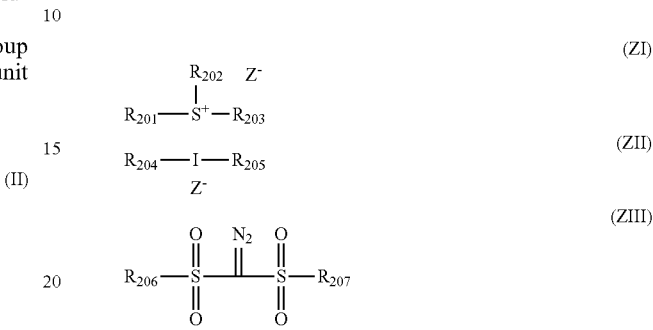

In General Formula (ZI), $R_{201}$, $R_{202}$, and $R_{203}$ each independently represent an organic group.

The number of carbon atoms of the organic group as $R_{201}$, $R_{202}$, and $R_{203}$ is generally 1 to 30, and preferably 1 to 20.

In addition, two of $R_{201}$ to $R_{203}$ may be bonded to each other to form a ring structure, and the ring may include an oxygen atom, a sulfur atom, an ester bond, an amide bond, or a carbonyl group, and examples of the group formed by the bonding of two of $R_{201}$ to $R_{203}$ include an alkylene group (for example, a butylene group and a pentylene group) and $-CH_2-CH_2-O-CH_2-CH_2-$.

$Z^-$ represents an anion.

Suitable aspects of the cation in General Formula (ZI) include groups corresponding to a compound (ZI-1), a compound (ZI-2), a compound (ZI-3), and a compound (ZI-4).

Incidentally, the acid generator (B) may be a compound having a plurality of the structures represented by General Formula (ZI). For example, it may be a compound having a structure in which at least one of $R_{201}$, . . . , or $R_{203}$ in the compound represented by General Formula (ZI) is bonded to at least one of $R_{201}$, . . . , or $R_{203}$ of another compound represented by General Formula (ZI) through a single bond or a linking group.

First, the compound (ZI-1) will be described.

The compound (ZI-1) is an arylsulfonium compound in which at least one of $R_{201}$, . . . , or $R_{203}$ in General Formula (ZI) is an aryl group, that is, a compound having arylsulfonium as a cation.

In the arylsulfonium compound, all of $R_{201}$ to $R_{203}$ may be aryl groups, or some of $R_{201}$ to $R_{203}$ may be aryl groups and the remainders may be alkyl groups or cycloalkyl groups, but all of $R_{201}$ to $R_{203}$ may be aryl groups.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group in the arylsulfonium compound is preferably a phenyl group or a naphthyl group, and more preferably a phenyl group. The aryl group may be an aryl group having a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium compound has two or more aryl groups, these two or more aryl groups may be the same as or different from each other.

The alkyl group or the cycloalkyl group which may be contained, as desired, in the arylsulfonium compound, is preferably a linear alkyl group having 1 to 15 carbon atoms, a branched alkyl group having 3 to 15 carbon atoms, or a cycloalkyl group having 3 to 15 carbon atoms, for example, a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of each of $R_{201}$ to $R_{203}$ may have an alkyl group (for example, an alkyl group having 1 to 15 carbon atoms), a cycloalkyl group (for example, a cycloalkyl group having 3 to 15 carbon atoms), an aryl group (for example, an aryl group having 6 to 14 carbon atoms), an alkoxy group (for example, an alkoxy group having 1 to 15 carbon atoms), a halogen atom, a hydroxyl group, or a phenylthio group as a substituent.

Next, the compound (ZI-2) will be described.

The compound (ZI-2) is a compound in which $R_{201}$ to $R_{203}$ in Formula (ZI) each independently represent an organic group not having an aromatic ring. Here, the aromatic ring also encompasses an aromatic ring containing a heteroatom.

The organic group, as each of $R_{201}$ to $R_{203}$, containing no aromatic ring has generally 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and particularly preferably a linear or branched 2-oxoalkyl group.

Preferred examples of the alkyl group and the cycloalkyl group of each of $R_{201}$ to $R_{203}$ include a linear alkyl group having 1 to 10 carbon atoms or a branched alkyl group having 3 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, and a norbomyl group).

$R_{201}$ to $R_{203}$ may further be substituted with a halogen atom, an alkoxy group (for example, an alkoxy group having 1 to 5 carbon atoms), a hydroxyl group, a cyano group, or a nitro group.

Next, the compound (ZI-3) will be described.

The compound (ZI-3) is a compound represented by General Formula (ZI-3), which has a phenacylsulfonium salt structure.

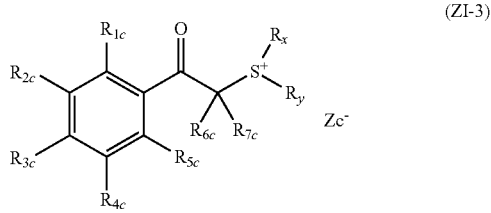

(ZI-3)

In General Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

Among any two or more of $R_{1c}$ to $R_{5c}$, $R_{5c}$ and $R_{6c}$, $R_{6c}$ and $R_{7c}$, $R_{5c}$ and $R_x$, and $R_x$ and $R_y$ each may be bonded to each other to form a ring structure, and the ring structure may each independently contain an oxygen atom, a sulfur atom, a ketone group, an ester bond, or an amide bond.

Examples of the ring structure include an aromatic or non-aromatic hydrocarbon ring, an aromatic or non-aromatic heterocycle, or a polycyclic fused ring composed of two or more of these rings. Examples of the ring structure include 3- to 10-membered rings, and the ring structures are preferably 4- to 8-membered ring, and more preferably 5- or 6-membered rings.

Examples of groups formed by the bonding of any two or more of $R_{1c}$ to $R_{5c}$, $R_{6c}$ and $R_{7c}$, and $R_x$ and $R_y$ include a butylene group and a pentylene group.

As groups formed by the bonding of $R_{5c}$ and $R_{6c}$, and $R_{5c}$ and $R_x$, a single bond or alkylene group is preferable, and examples thereof include a methylene group and an ethylene group.

$Zc^-$ represents an anion.

Next, the compound (ZI-4) will be described.

The compound (ZI-4) is represented by General Formula (ZI-4).

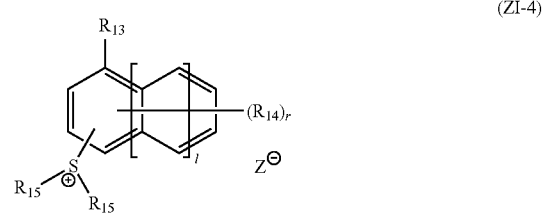

(ZI-4)

In General Formula (ZI-4), l represents an integer of 0 to 2.

r represents an integer of 0 to 8.

$R_{13}$ represents a hydrogen atom, a fluorine atom, a hydroxyl group, an alkyl group, a cycloalkyl group, an alkoxy group, an alkoxycarbonyl group, or a group having a cycloalkyl group. These groups may have a substituent.

$R_{14}$ represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent. In a case where $R_{14}$'s are present in plural number, they each independently represent the group such as a hydrogen as above.

$R_{15}$'s each independently represent an alkyl group, a cycloalkyl group, or a naphthyl group. These groups may have a substituent. Two $R_{15}$'s may be bonded to each other to form a ring. In a case where two $R_{15}$'s are bonded to form a ring, a the ring skeleton may include a heteroatom such as an oxygen atom and a nitrogen atom. In one aspect, it is preferable that two $R_{15}$'s are alkylene groups, and are bonded to each other to form a ring structure.

$Z^-$ represents an anion.

In General Formula (ZI-4), as the alkyl group of each of $R_{13}$, $R_{14}$, and $R_{15}$, an alkyl which is linear or branched. The number of carbon atoms of the alkyl group is preferably 1 to 10. As the alkyl group, a methyl group, an ethyl group, an n-butyl group, a t-butyl group, or the like is more preferable.

Next, General Formulae (ZII) and (ZIII) will be described.

In General Formulae (ZII) and (ZII), $R_{204}$ to $R_{207}$ each independently represent an aryl group, an alkyl group, or a cycloalkyl group.

As the aryl group of each of $R_{204}$ to $R_{207}$, a phenyl group or a naphthyl group is preferable, and the phenyl group is more preferable. The aryl group of each of $R_{204}$ to $R_{207}$ may be an aryl group having a heterocyclic structure having an oxygen atom, a nitrogen atom, a sulfur atom, or the like. Examples of the skeleton of the aryl group having a heterocyclic structure include pyrrole, furan, thiophene, indole, benzofuran, and benzothiophene.

Preferred examples of the alkyl group and the cycloalkyl group in each of $R_{204}$ to $R_{207}$ include a linear alkyl group having 1 to 10 carbon atoms or a branched alkyl group having 3 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, and a norbornyl group).

The aryl group, the alkyl group, and the cycloalkyl group of each of $R_{204}$ to $R_{207}$ may each independently have a substituent. Examples of the substituent which the aryl group, the alkyl group, or the cycloalkyl group of each of $R_{204}$ to $R_{207}$ may have include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents an anion.

As $Z^-$ in General Formula (ZI), $Z^-$ in General Formula (ZII), $Zc^-$ in General Formula (ZI-3), and $Z^-$ in General Formula (ZI-4), an anion represented by General Formula (3) is preferable.

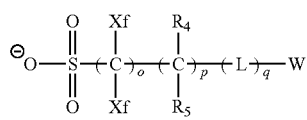

(3)

In General Formula (3), o represents an integer of 1 to 3. p represents an integer of 0 to 10. q represents an integer of 0 to 10.

Xf's each independently represent a fluorine atom or an alkyl group substituted with at least one fluorine atom. The number of carbon atoms of the alkyl group is preferably 1 to 10, and more preferably 1 to 4. Further, as the alkyl group substituted with at least one fluorine atom, a perfluoroalkyl group is preferable.

Xf is preferably a fluorine atom or a perfluoroalkyl group having 1 to 4 carbon atoms, and more preferably a fluorine atom or $CF_3$, and in particular, it is still more preferable that both Xf's are fluorine atoms.

$R_4$ and $R_5$ each independently represent a hydrogen atom, a fluorine atom, an alkyl group, or an alkyl group substituted with at least one fluorine atom, and in a case where $R_4$'s and $R_5$'s are each present in plural number, $R_4$'s and $R_5$'s may be the same as or different from each other.

The alkyl group represented by each of $R_4$ and $R_5$ may have a substituent, and preferably has 1 to 4 carbon atoms. $R_4$ and $R_5$ are each preferably a hydrogen atom.

Specific examples and suitable embodiments of the alkyl group substituted with at least one fluorine atom are the same as the specific examples and suitable embodiments of Xf in General Formula (3).

L represents a divalent linking group, and in a case where L's are present in plural number, they may be the same as or different from each other.

Examples of the divalent linking group include —COO— (—C(=O)—O—), —OCO—, —CONH—, —NHCO—, —CO—, —O—, —S—, —SO—, —SO$_2$—, an alkylene group (preferably having 1 to 6 carbon atoms), a cycloalkylene group (preferably having 3 to 15 carbon atoms), an alkenylene group (preferably having 2 to 6 carbon atoms), or a divalent linking group formed by combination of these plurality of groups. Among these, —COO—, —OCO—, —CONH—, —NHCO—, —CO—, —O—, —SO$_2$—, —COO-alkylene group-, —OCO-alkylene group-, —CONH-alkylene group-, or —NHCO— alkylene group- is preferable, and —COO—, —OCO—, —CONH—, —SO$_2$—, —COO-alkylene group-, or —OCO-alkylene group- is more preferable.

W represents an organic group including a cyclic structure. Among the organic groups, a cyclic organic group is preferable.

Examples of the cyclic organic group include an alicyclic group, an aryl group, and a heterocyclic group.

The alicyclic group may be monocyclic or polycyclic, and examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among these, an alicyclic group having a bulky structure having 7 or more carbon atoms, such as a norbornyl group, a tricyclodecanyl group, a tetracyclodecanyl group, a tetracyclododecanyl group, and an adamantyl group is preferable.

The aryl group may be monocyclic or polycyclic. Examples of the aryl group include a phenyl group, a naphthyl group, a phenanthryl group, and an anthryl group.

The heterocyclic group may be monocyclic or polycyclic, but in a case where it is polycyclic, it is possible to suppress acid diffusion. Further, the heterocyclic group may have aromaticity or may not have aromaticity. Examples of the heterocycle having aromaticity include a furan ring, a thiophene ring, a benzofuran ring, a benzothiophene ring, a dibenzofuran ring, a dibenzothiophene ring, and a pyridine ring. Examples of the heterocycle not having an aromaticity include a tetrahydropyran ring, a lactone ring, a sultone ring, and a decahydroisoquinoline ring. Examples of the lactone ring and the sultone ring include the above-mentioned lactone structures and sultone structures exemplified in the resin. As the heterocycle in the heterocyclic group, a furan ring, a thiophene ring, a pyridine ring, or a decahydroisoquinoline ring is particularly preferable.

The cyclic organic group may have a substituent. Examples of the substituent include, an alkyl group (which may be linear or branched, and preferably has 1 to 12 carbon atoms), a cycloalkyl group (which may be monocyclic, polycyclic, or spiro ring, and preferably has 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic acid ester group. Incidentally, the carbon constituting the cyclic organic group (carbon contributing to ring formation) may be carbonyl carbon.

As the anion represented by General Formula (3), $SO_3^-$—$CF_2$—$CH_2$—OCO-(L)q'-W, $SO_3^-$—$CF_2$—CHF—$CH_2$—OCO-(L)q'-W, $SO_3^-$—$CF_2$—COO-(L)q'-W, $SO_3^-$—$CF_2$—$CF_2$—$CH_2$—$CH_2$-(L)q-W, or $SO_3^-$—$CF_2$—$CH(CF_3)$—OCO-(L)q'-W is preferable. Here, L, q, and W are each the same as in General Formula (3). q' represents an integer of 0 to 10.

In one aspect, as $Z^-$ in General Formula (ZI), $Z^-$ in General Formula (ZII), $Zc^-$ in General Formula (ZI-3), and $Z^-$ in General Formula (ZI-4), an anion represented by General Formula (4) is also preferable.

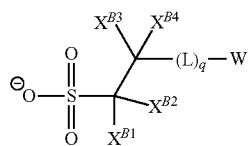

(4)

In General Formula (4).

$X^{B1}$ and $X^{B2}$ each independently represent a hydrogen atom or a monovalent organic group having no fluorine atom. $X^{B1}$ and $X^{B2}$ are each preferably a hydrogen atom.

$X^{B3}$ and $X^{B4}$ each independently represent a hydrogen atom or a monovalent organic group. It is preferable that at least one of $X^{B3}$ or $X^{B4}$ is a fluorine atom or a monovalent organic group having a fluorine atom, it is more preferable that both of $X^{B3}$ and $X^{B4}$ are both a fluorine atom or a monovalent organic group having a fluorine atom, and it is still more preferable that both of $X^{B3}$ and $X^{B4}$ are both an alkyl group substituted with fluorine atom.

L, q, and W are the same as in General Formula (3).

$Z^-$ in General Formula (ZI), $Z^-$ in General Formula (ZII), $Zc^-$ in General Formula (ZI-3) and $Z^-$ in General Formula (ZI-4) may be a benzenesulfonic acid anion, and is preferably a benzenesulfonic acid anion substituted with a branched alkyl group or a cycloalkyl group.

As $Z^-$ in General Formula (ZI), $Z^-$ in General Formula (ZII), $Zc^-$ in General Formula (ZI-3), and $Z^-$ in General Formula (ZI-4), an aromatic sulfonic acid anion represented by General Formula (SA1) is also preferable.

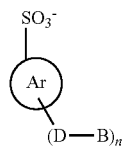

(SA1)

In Formula (SA1),

Ar represents an aryl group and may further have a substituent other than a sulfonic acid anion and a -(D-B) group. Examples of the substituent that may further be contained include a fluorine atom and a hydroxyl group.

n represents an integer of 0 or more. n is preferably 1 to 4, more preferably 2 or 3, and still more preferably 3.

D represents a single bond or a divalent linking group. Examples of the divalent linking group include an ether group, a thioether group, a carbonyl group, a sulfoxide group, a sulfone group, a sulfonic acid ester group, an ester group, and a group formed by combination of two or more kinds of these groups.

B represents a hydrocarbon group.

It is preferable that D is a single bond and B is an aliphatic hydrocarbon structure. It is more preferable that B is an isopropyl group or a cyclohexyl group.

Preferred examples of the sulfonium cation in General Formula (ZI) and the iodonium cation in General Formula (ZII) are shown below.

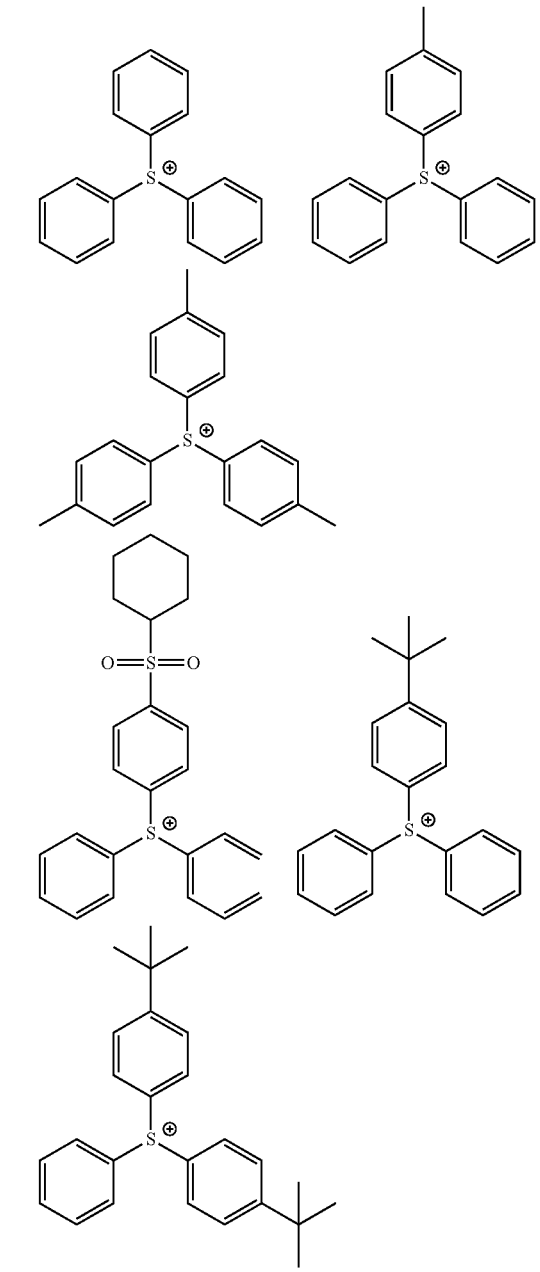

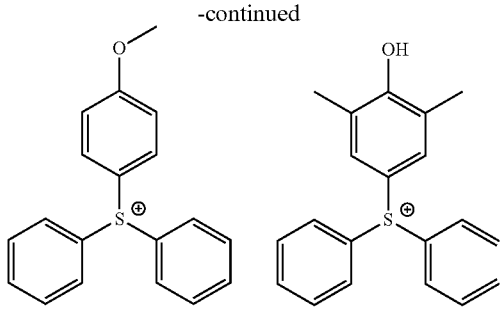
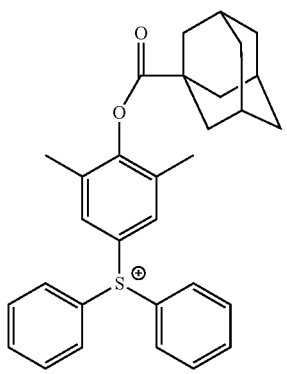
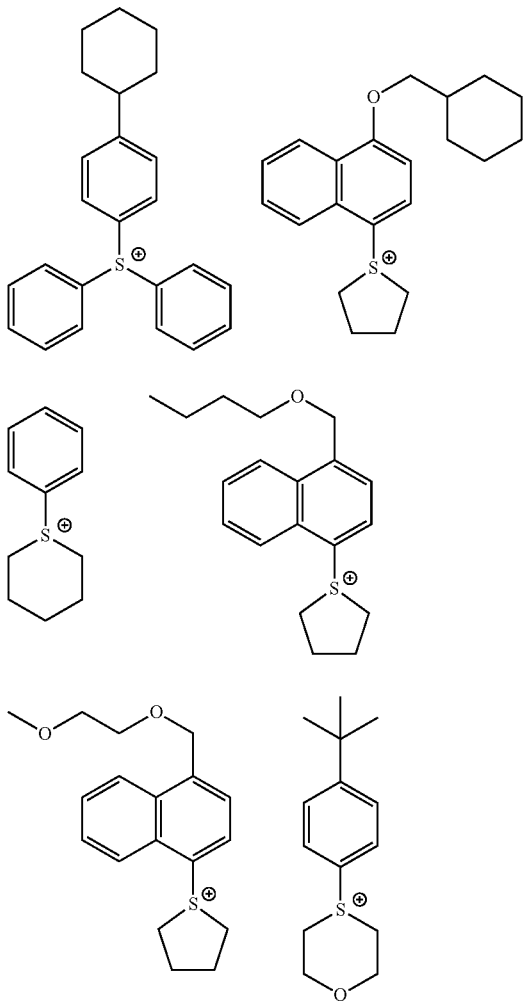
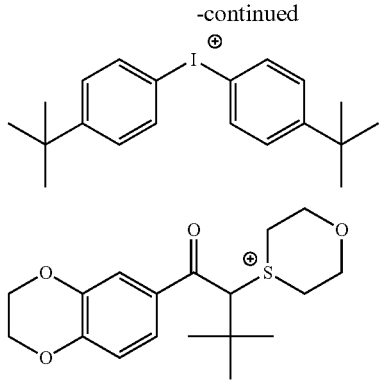
Preferred examples of the anion $Z^-$ in General Formula (ZI) and General Formula (ZII), $Zc^-$ in General Formula (ZI-3), and $Z^-$ in General Formula (ZI-4) are shown below.
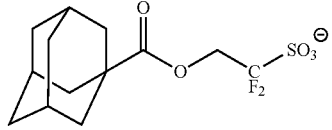
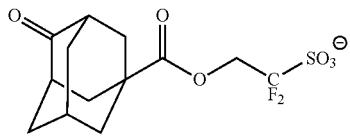
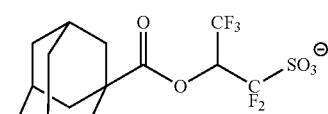
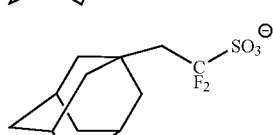
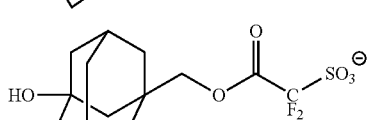
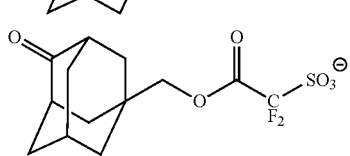

-continued
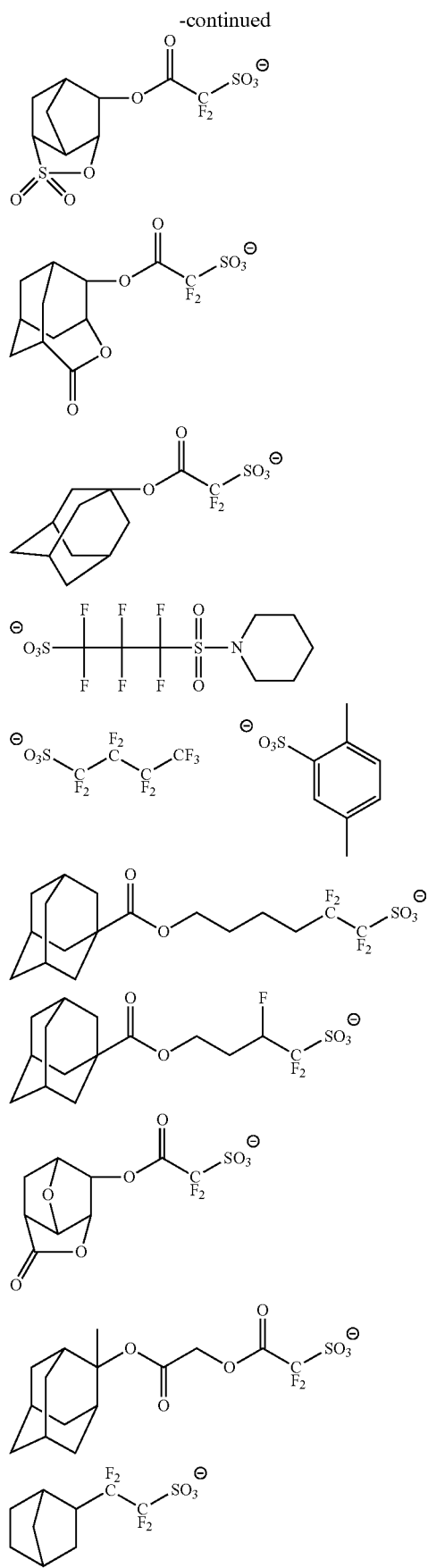
-continued
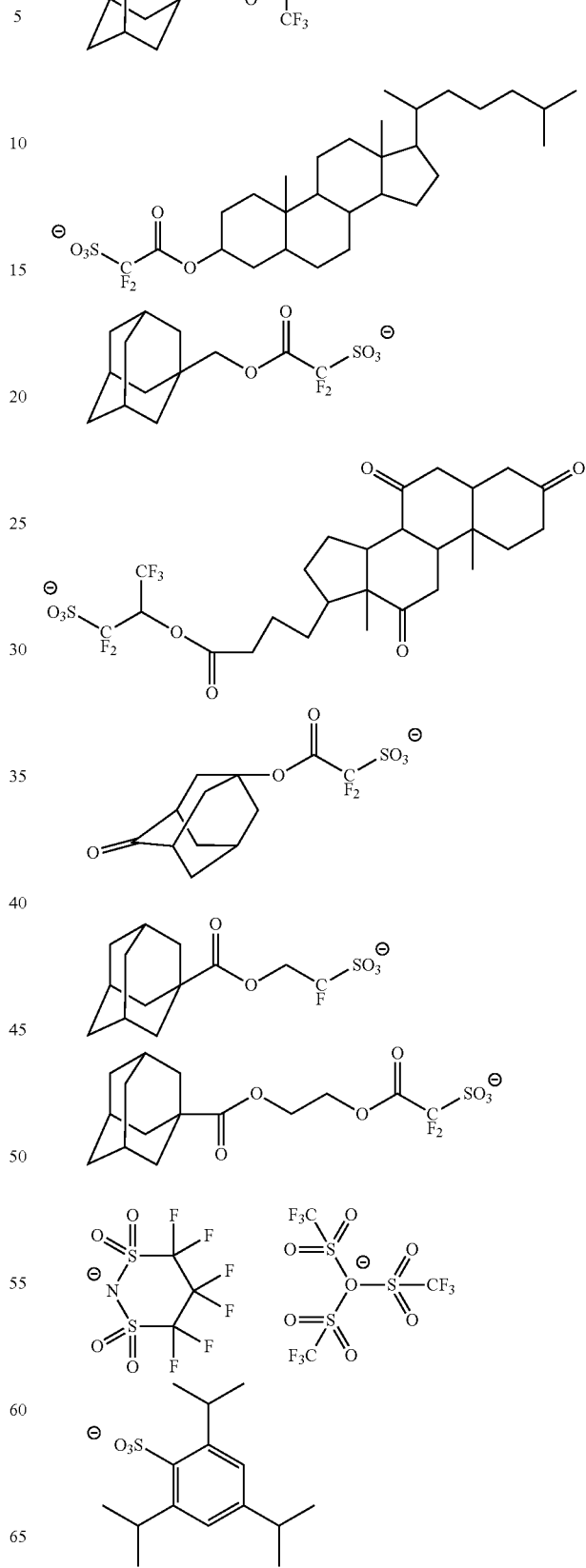

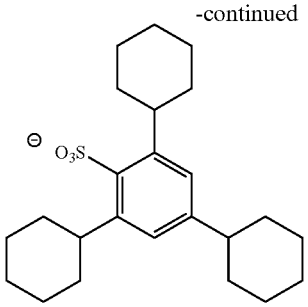

The cation and the anion can be optionally combined and be used as an acid generator (B).

The acid generator (B) may be in a form of a low-molecular-weight compound or in a form incorporated into a part of a polymer. Further, a combination of the form of a low-molecular-weight compound and the form incorporated into a part of a polymer may also be used.

In the present invention, the acid generator (B) is preferably a low-molecular-weight compound.

In a case where the acid generator (B) is in the form of the low-molecular-weight compound, the molecular weight is preferably 3,000 or less, more preferably 2,000 or less, and still more preferably 1,000 or less.

In a case where the acid generator (B) is in the form incorporated into a part of a polymer, it may be incorporated into the above-mentioned resin (A) which will be described later or into a resin other than the resin (A).

The acid generator (B) may be used singly or in combination of two or more kinds thereof.

The content of the acid generator (B) (a total of contents in a case where the acid generators are present in plural kinds) in the composition is preferably 0.1% to 20% by mass, more preferably 0.5% to 15% by mass, and still more preferably 1% to 15% by mass, with respect to the total solid contents of the composition.

Furthermore, the acid dissociation constant pKa of a compound generated by decomposition of the acid generator (B) upon irradiation with actinic rays or radiation is preferably smaller than the pKa of the compound represented by General Formula (1) as $Y^-$ is protonated. The acid generated by the compound represented by General Formula (1) has substantially the same pKa as the pKa of the compound represented by General Formula (1). In this regard, the acid dissociation constant pKa of a compound generated by decomposition of the acid generator (B) upon irradiation with actinic rays or radiation is preferably smaller than the pKa of the compound represented by General Formula (1) as $Y^-$ is protonated, and more preferably satisfies pKa<−2.5.

In addition, in a case where the compound represented by General Formula (1) and the acid generator (B) are used in combination, the content ratio in terms of a mass ratio is, for example, 99/1 to 1/99, preferably 90/10 to 30/70, and more preferably 85/15 to 40/60.

<Acid Diffusion Control Agent (D)>

The composition of the embodiment of the present invention preferably includes an acid diffusion control agent (D). The acid diffusion control agent (D) acts as a quencher that inhibits a reaction of the acid-decomposable resin in the unexposed area by excessive generated acids by trapping the acids generated from an acid generator or the like upon exposure. For example, a basic compound (DA), a basic compound (DB) whose basicity is reduced or lost upon irradiation with actinic rays or radiation, an onium salt (DC) which becomes a relatively weak acid with respect to an acid generator, a low-molecular-weight compound (DD) which has a nitrogen atom and a group that leaves by the action of an acid, an onium compound (DE) having a nitrogen atom in a cationic moiety, or the like can be used as the acid diffusion control agent. In the composition of the embodiment of the present invention, a known acid diffusion control agent can be appropriately used. For example, the known compounds disclosed in paragraphs <0627> to <0664> of US2016/0070167A1, paragraphs <0095> to <0187> of US2015/0004544A1, paragraphs <0403> to <0423> of US2016/0237190A1, and paragraphs <0259> to <0328> of US2016/0274458A1 can be suitably used as the acid diffusion control agent (D).

As the basic compound (DA), compounds having structures represented by Formulae (A) to (E) are preferable.

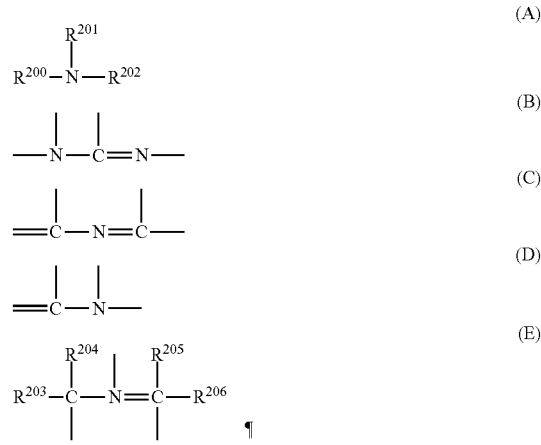

In General Formulae (A) and (E), $R^{200}$, $R^{201}$, and $R^{202}$ may be the same as or different from each other, and each represent a hydrogen atom, an alkyl group (preferably having 1 to 20 carbon atoms), a cycloalkyl group (preferably having 3 to 20 carbon atoms), or an aryl group (having 6 to 20 carbon atoms), and $R^{201}$ and $R^{202}$ may be bonded to each other to form a ring.

$R^{203}$, $R^{204}$, $R^{205}$, and $R^{206}$ may be the same as or different from each other, and each represent an alkyl group having 1 to 20 carbon atoms.

The alkyl group in each of General Formulae (A) and (E) may have a substituent or may be unsubstituted.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl groups in each of General Formulae (A) and (E) are more preferably unsubstituted.

As the basic compound (DA), guanidine, aminopyrrolidine, pyrazole, pyrazoline, piperazine, aminomorpholine, aminoalkylmorpholine, piperidine, or the like is preferable; and a compound having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, and an aniline derivative having a hydroxyl group and/or an ether bond, or the like is more preferable.

The basic compound (DB) whose basicity is reduced or lost upon irradiation with actinic rays or radiation (hereinafter also referred to as a "compound (DB)") is a compound which has a proton-accepting functional group, and decomposes under irradiation with actinic rays or radiation to exhibit deterioration in proton-accepting properties, no proton-accepting properties, or a change from the proton-accepting properties to acidic properties.

The proton-accepting functional group refers to a functional group having a group or an electron which is capable of electrostatically interacting with a proton, and for example, means a functional group with a macrocyclic structure, such as a cyclic polyether, or a functional group having a nitrogen atom having an unshared electron pair not contributing to π-conjugation. The nitrogen atom having an unshared electron pair not contributing to π-conjugation is, for example, a nitrogen atom having a partial structure represented by the following formula.

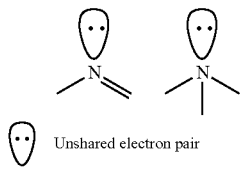

Preferred examples of the partial structure of the proton-accepting functional group include crown ether, azacrown ether, primary to tertiary amines, pyridine, imidazole, and pyrazine structures.

The compound (DB) decomposes upon irradiation with actinic rays or radiation to generate a compound exhibiting deterioration in proton-accepting properties, no proton-accepting properties, or a change from the proton-accepting properties to acidic properties. Here, exhibiting deterioration in proton-accepting properties, no proton-accepting properties, or a change from the proton-accepting properties to acidic properties means a change of proton-accepting properties due to the proton being added to the proton-accepting functional group, and specifically a decrease in the equilibrium constant at chemical equilibrium in a case where a proton adduct is generated from the compound (DB) having the proton-accepting functional group and the proton.

The proton-accepting properties can be confirmed by performing pH measurement.

In the present invention, the acid dissociation constant pKa of the compound generated by the decomposition of the compound (DB) upon irradiation with actinic rays or radiation preferably satisfies pKa<−1, more preferably −13<pKa<−1, and still more preferably −13<pKa<−3.

Furthermore, the acid dissociation constant pKa can be determined by the above-mentioned method.

In the composition of the embodiment of the present invention, an onium salt (DC) which becomes a relatively weak acid with respect to the acid generator can be used as an acid diffusion control agent.

In a case of mixing the acid generator and the onium salt capable of generating an acid which is a relatively weak acid with respect to an acid generated from the acid generator, and then using the mixture, in a case where the acid generated from the acid generator upon irradiation with actinic rays or radiation collides with an onium salt having an unreacted weak acid anion, a weak acid is discharged by salt exchange, thereby generating an onium salt having a strong acid anion. In this process, the strong acid is exchanged with a weak acid having a lower catalytic ability, and therefore, the acid is deactivated in appearance, and thus, it is possible to carry out the control of acid diffusion.

As the onium salt which becomes a relatively weak acid with respect to the acid generator, compounds represented by General Formulae (dl-1) to (dl-3) are preferable.

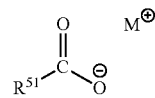

(dl-1)

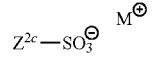

(dl-2)

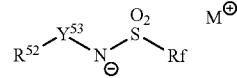

(dl-3)

In the formulae. $R^{51}$ is a hydrocarbon group which may have a substituent, $Z^{2c}$ is a hydrocarbon group (provided that carbon adjacent to S is not substituted with a fluorine atom) having 1 to 30 carbon atoms, which may have a substituent, $R^{52}$ is an organic group, $Y^3$ is a linear, branched, or cyclic alkylene group or arylene group, Rf is a hydrocarbon group including a fluorine atom, and $M^+$'s are each independently an ammonium cation, a sulfonium cation, or an iodonium cation.

Preferred examples of the sulfonium cation or the iodonium cation represented by $M^4$ include the sulfonium cations exemplified for General Formula (ZI) and the iodonium cations exemplified for General Formula (ZII) of the acid generator.

The low-molecular-weight compound (DD) (hereinafter referred to as a "compound (DD)") which has a nitrogen atom and a group that leaves by the action of an acid is preferably an amine derivative having a group that leaves by the action of an acid on a nitrogen atom.

As the group that leaves by the action of an acid, an acetal group, a carbonate group, a carbamate group, a tertiary ester group, a tertiary hydroxyl group, or a hemiaminal ether group are preferable, and a carbamate group or a hemiaminal ether group is particularly preferable.

The molecular weight of the compound (DD) is preferably 100 to 1,000, more preferably 100 to 700, and still more preferably 100 to 500.

The compound (DD) may have a carbamate group having a protecting group on a nitrogen atom. The protecting group constituting the carbamate group can be represented by General Formula (d-1).

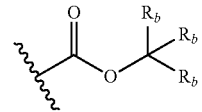

(d-1)

In General Formula (d-1), $R_b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). $R_b$'s may be linked to each other to form a ring.

The alkyl group, the cycloalkyl group, the aryl group, or the aralkyl group represented by $R_b$ may be substituted with a functional group such as a hydroxyl group, a cyano group, an amino group, a pyrrolidino group, a piperidino group, a morpholino group, and an oxo group, an alkoxy group, or a halogen atom. This shall apply to the alkoxyalkyl group represented by $R_b$.

$R_b$ is preferably a linear or branched alkyl group, a cycloalkyl group, or an aryl group, and more preferably a linear or branched alkyl group, or a cycloalkyl group.

Examples of the ring formed by the mutual linking of two $R_b$'s include an alicyclic hydrocarbon group, an aromatic hydrocarbon group, a heterocyclic hydrocarbon group, and derivatives thereof.

Examples of the specific structure of the group represented by General Formula (d-1) include, but are not limited to, the structures disclosed in paragraph <0466> in US2012/0135348A1.

It is preferable that the compound (DD) has a structure represented by General Formula (6).

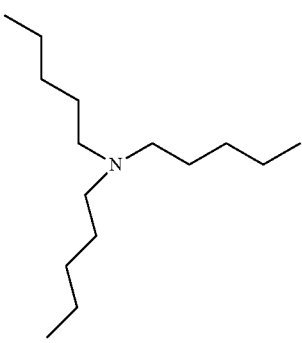
(6)

In General Formula (6), l represents an integer of 0 to 2, and m represents an integer of 1 to 3, satisfying l+m=3.

$R_a$ represents a hydrogen atom, an alkyl group, a cycloalkyl group, an aryl group, or an aralkyl group. In a case where l is 2, two $R_a$'s may be the same as or different from each other. Two $R_a$'s may be linked to each other to form a heterocycle may be bonded to each other to form, together with a carbon atom to which they are bonded with the nitrogen atom in the formula. The heterocycle may include a heteroatom other than the nitrogen atom in the formula.

$R_b$ has the same meaning as $R_b$ in General Formula (d-1), and preferred examples are also the same.

In General Formula (6), the alkyl group, the cycloalkyl group, the aryl group, and the aralkyl group as $R_a$ may be substituted with the same groups as the group mentioned above as a group which may be substituted in the alkyl group, the cycloalkyl group, the aryl group, and the aralkyl group as $R_b$.

Specific examples of the alkyl group, the cycloalkyl group, the aryl group, and the aralkyl group (these groups may be substituted with the groups as described above) of $R_a$ include the same groups as the specific examples as described above with respect to $R_b$.

Specific examples of the particularly preferred compound (DD) in the present invention include, but are not limited to, the compounds disclosed in paragraph <0475> in US2012/0135348A1.

The onium salt compound (DE) (hereinafter also referred to as a "compound (DE)") having a nitrogen atom in a cation portion is preferably a compound having a basic moiety including a nitrogen atom in a cation portion. The basic moiety is preferably an amino group, and more preferably an aliphatic amino group. It is more preferable that all of the atoms adjacent to the nitrogen atom in the basic moiety are hydrogen atoms or carbon atoms. Further, from the viewpoint of improvement of basicity, it is preferable that an electron-withdrawing functional group (a carbonyl group, a sulfonyl group, a cyano group, a halogen atom, and the like) is not directly linked to the nitrogen atom.

Specific preferred examples of the compound (DE) include, but are not limited to, the compounds disclosed in paragraph <0203> of US2015/0309408A1.

Preferred examples of the acid diffusion control agent (D) are shown below.

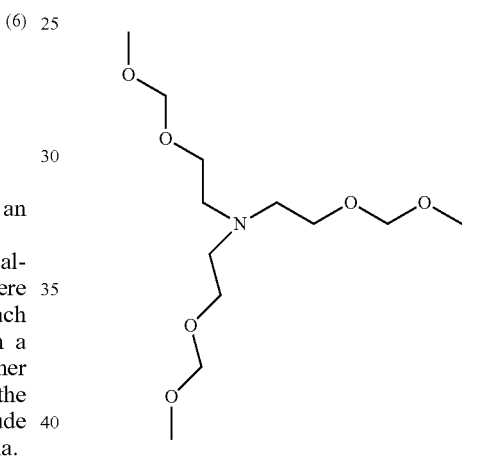

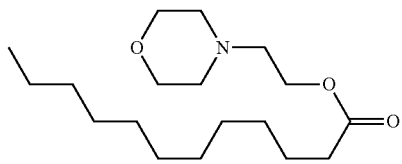

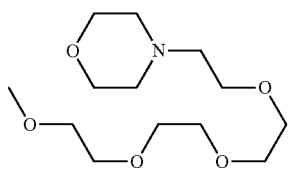

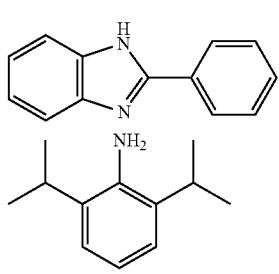

-continued
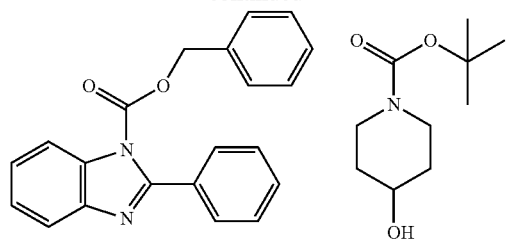
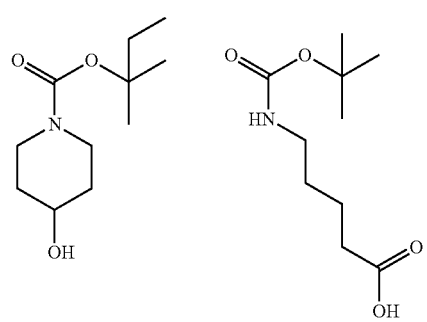
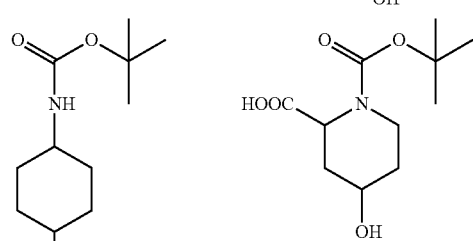
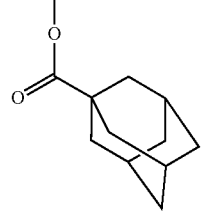
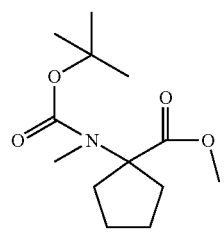
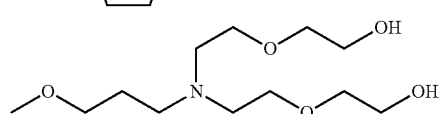
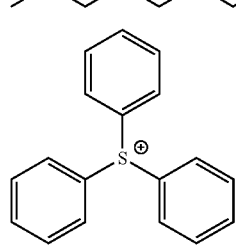
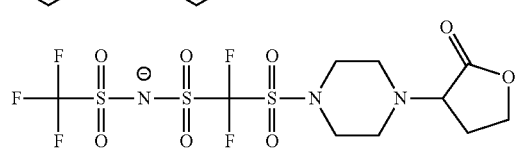
-continued
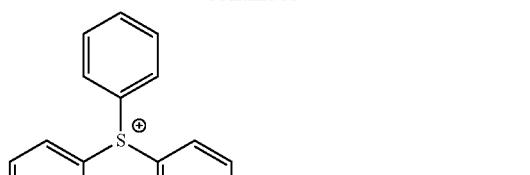
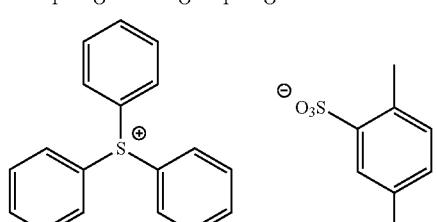
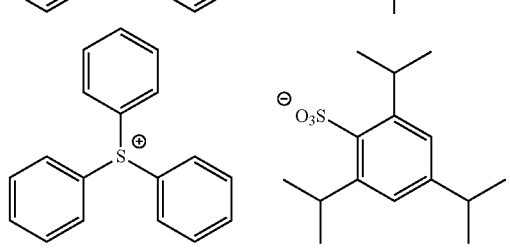
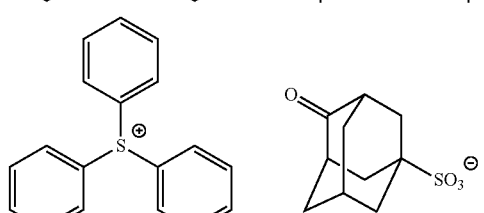
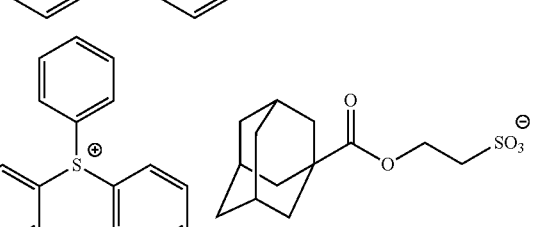
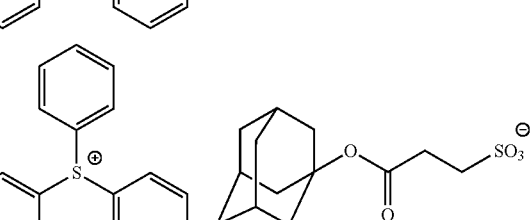
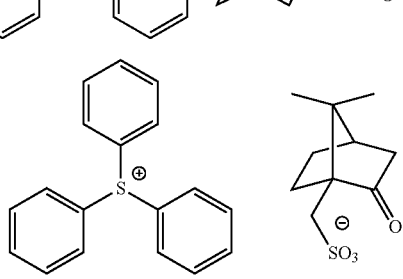

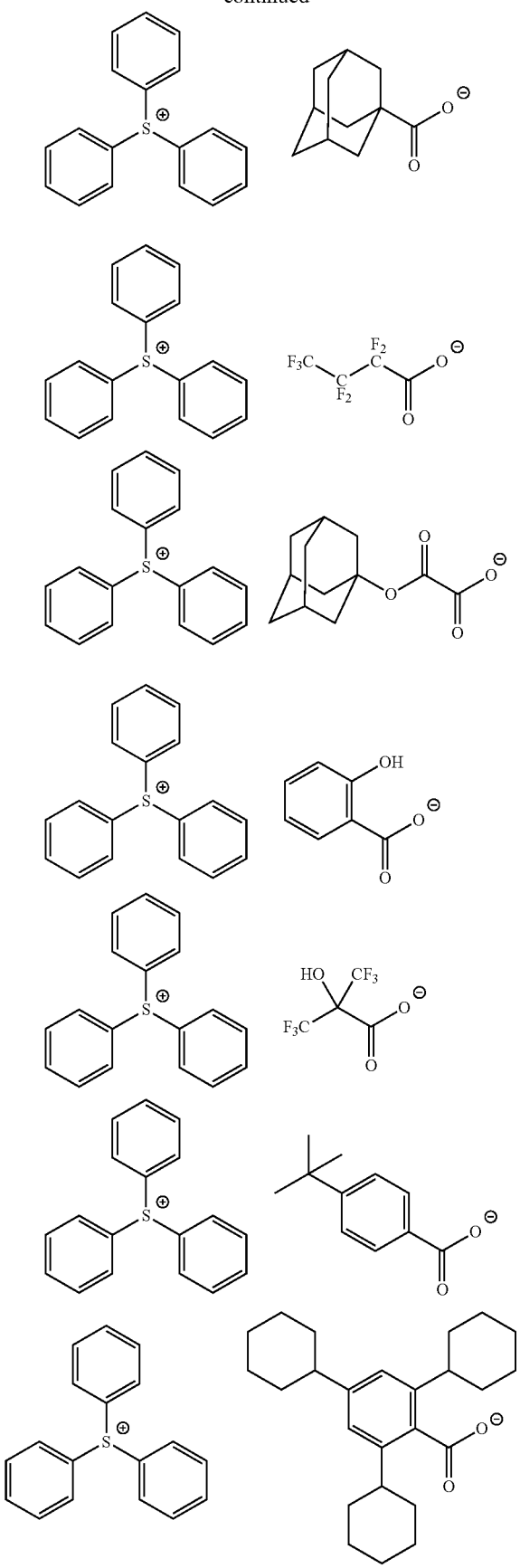
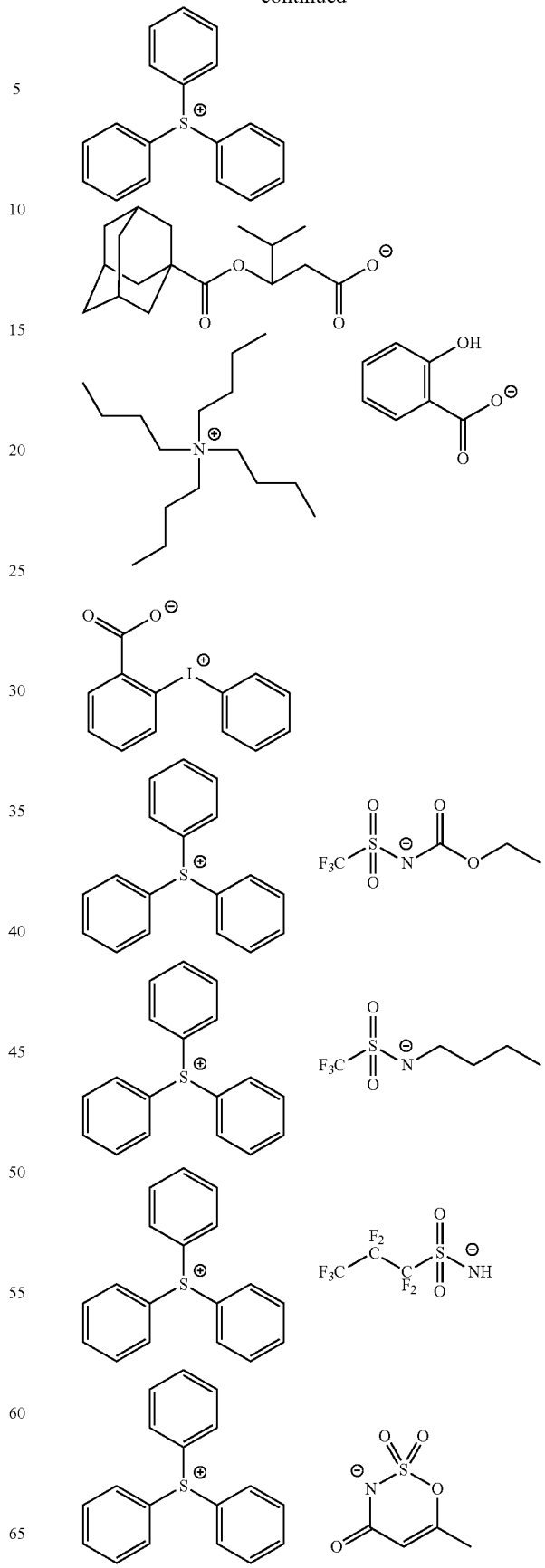

In the composition of the embodiment of the present invention, the acid diffusion control agent (D) may be used singly or in combination of two or more kinds thereof.

The content of the acid diffusion control agent (D) (a total of the contents in a case where the acid diffusion control agents (D) are present in plural number) in the composition is preferably 0.1% to 10% by mass, and more preferably 0.1% to 5% by mass, with respect to the total solid content of the composition.

<Hydrophobic Resin (E)>

The composition of the embodiment of the present invention may include a hydrophobic resin (E). Further, the hydrophobic resin (E) is preferably a resin which is different from the resin (A) and the resin (B).

By incorporating the hydrophobic resin (E) into the composition of the embodiment of the present invention, it is possible to improve the static/dynamic contact angle at a surface of an actinic ray-sensitive or radiation-sensitive film. Thus, it becomes possible to improve development characteristics, suppress generation of out gas, improve immersion liquid tracking properties upon immersion liquid exposure, and reduce liquid immersion defects, for example.

It is preferable that the hydrophobic resin (E) is designed to be unevenly distributed on a surface of a resist film, but unlike the surfactant, the hydrophobic resin (E) does not necessarily have a hydrophilic group in a molecule thereof and does not necessarily contribute to uniform mixing of polar/non-polar materials.

The hydrophobic resin (E) is preferably a resin having a repeating unit having at least one selected from a "fluorine atom", a "silicon atom", or a "$CH_3$ partial structure which is contained in a side chain portion of a resin" from the viewpoint of uneven distribution on a film surface layer, and more preferably has two or more types.

In a case where the hydrophobic resin (E) includes a fluorine atom and/or a silicon atom, the fluorine atom and/or the silicon atom described above in the hydrophobic resin (E) may be included in the main chain of a resin or may be included in a side chain.

In a case where the hydrophobic resin (E) includes a fluorine atom, it is preferably a resin which has an alkyl group having a fluorine atom, a cycloalkyl group having a fluorine atom, or an aryl group having a fluorine atom as a partial structure having a fluorine atom.

It is preferable that the hydrophobic resin (E) has at least one group selected from the following (x) to (z) groups:

(x) an acid group, (y) a group whose solubility in an alkali developer through decomposition by the action of the alkali developer (hereinafter also referred to as a polarity converting group), and (z) a group capable of decomposing by the action of an acid.

Examples of the acid group (x) include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

As the acid group, a fluorinated alcohol group (preferably hexafluoroisopropanol), a sulfonimido group, or a bis(alkylcarbonyl)methylene group is preferable.

Examples of the group (y) whose solubility in an alkali developer through decomposition by the action of the alkali developer include a lactone group, a carboxylic acid ester group (—COO—), an acid anhydride group (—C(O)OC(O)—), an acid imido group (—NHCONH—), a carboxylic acid thioester group (—COS—), a carbonate ester group (—OC(O)O—), a sulfuric acid ester group (—OSO$_2$O—), and a sulfonic acid ester group (—SO$_2$O—), and the lactone group or the carboxylic acid ester group (—COO—) is preferable.

Examples of the repeating unit including the group include a repeating unit in which the group is directly bonded to the main chain of a resin, such as a repeating unit with an acrylic acid or a methacrylic acid. In this repeating unit, the group may be bonded to the main chain of the resin through a linking group, or the group may also be incorporated into a terminal of the resin by using a polymerization initiator or chain transfer agent having the group during polymerization.

Examples of the repeating unit having a lactone group include the same ones as the repeating unit having a lactone structure as described earlier in the section of the resin (A).

The content of the group (y) whose solubility in an alkali developer through decomposition by the action of the alkali developer is preferably 1% to 100% by mole, more preferably 3% to 98% by mole, and still more preferably 5% to 95% by mole, with respect to all the repeating units in the hydrophobic resin (E).

With respect to the hydrophobic resin (E), examples of the repeating unit having a group (z) capable of decomposing by the action of an acid include the same ones as the repeating units having an acid-decomposable group, as exemplified in the resin (A). The repeating unit having a group (z) capable of decomposing by the action of an acid may have at least one of a fluorine atom or a silicon atom. The content of the repeating units having a group (z) capable of decomposing by the action of an acid is preferably 1% to 80% by mole, more preferably 10% to 80% by mole, and still more preferably 20% to 60% by mole, with respect to all the repeating units in the hydrophobic resin (E).

The hydrophobic resin (E) may have a repeating unit which is different from the above-mentioned repeating units.

The content of the repeating units including a fluorine atom is preferably 10% to 100% by mole, and more preferably 30% to 100% by mole, with respect to all the repeating units in the hydrophobic resin (E). Further, the content of the repeating units including a silicon atom is preferably 10% to 100% by mole, and more preferably 20% to 100% by mole, with respect to all the repeating units in the hydrophobic resin (E).

On the other hand, in a case where the hydrophobic resin (E) includes a $CH_3$ partial structure in the side chain moiety thereof, it is also preferable that the hydrophobic resin (E) has a form not having substantially any one of a fluorine atom and a silicon atom. Further, it is preferable that the hydrophobic resin (E) is substantially constituted with only repeating units, which are composed of only atoms selected from a carbon atom, an oxygen atom, a hydrogen atom, a nitrogen atom, and a sulfur atom.

The weight-average molecular weight of the hydrophobic resin (E) in terms of standard polystyrene is preferably 1,000 to 100,000, and more preferably 1,000 to 50,000.

The total content of residual monomers and/or oligomer components included in the hydrophobic resin (E) is preferably 0.01% to 5% by mass, and more preferably 0.01% to 3% by mass. Further, the dispersity (Mw/Mn) is preferably in the range of 1 to 5, and more preferably in the range of 1 to 3.

As the hydrophobic resin (E), known resins can be appropriately selected and used singly or as a mixture. For example, the known resins disclosed in paragraphs <0451> to <0704> of US2015/0168830A1 and paragraphs <0340> to <0356> of US2016/0274458A1 can be suitably used as the hydrophobic resin (E). Further, the repeating units disclosed in paragraphs <0177> to <0258> of US2016/0237190A1 are also preferable as a repeating unit constituting the hydrophobic resin (E).

Preferred examples of a monomer corresponding to the repeating unit constituting the hydrophobic resin (E) are shown below.

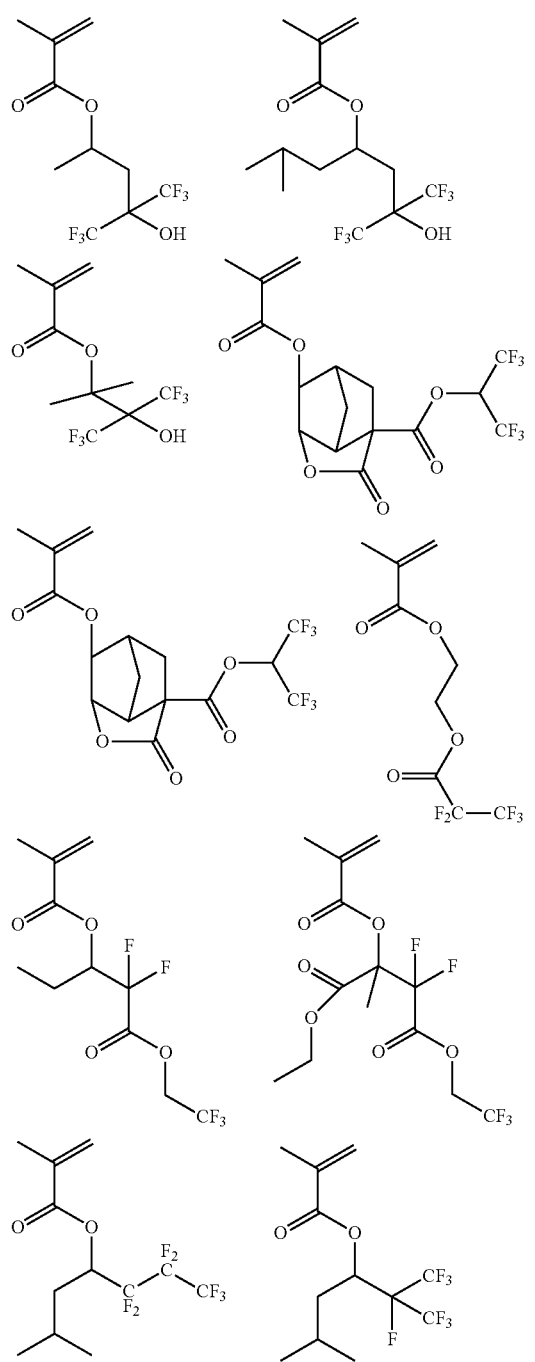

-continued

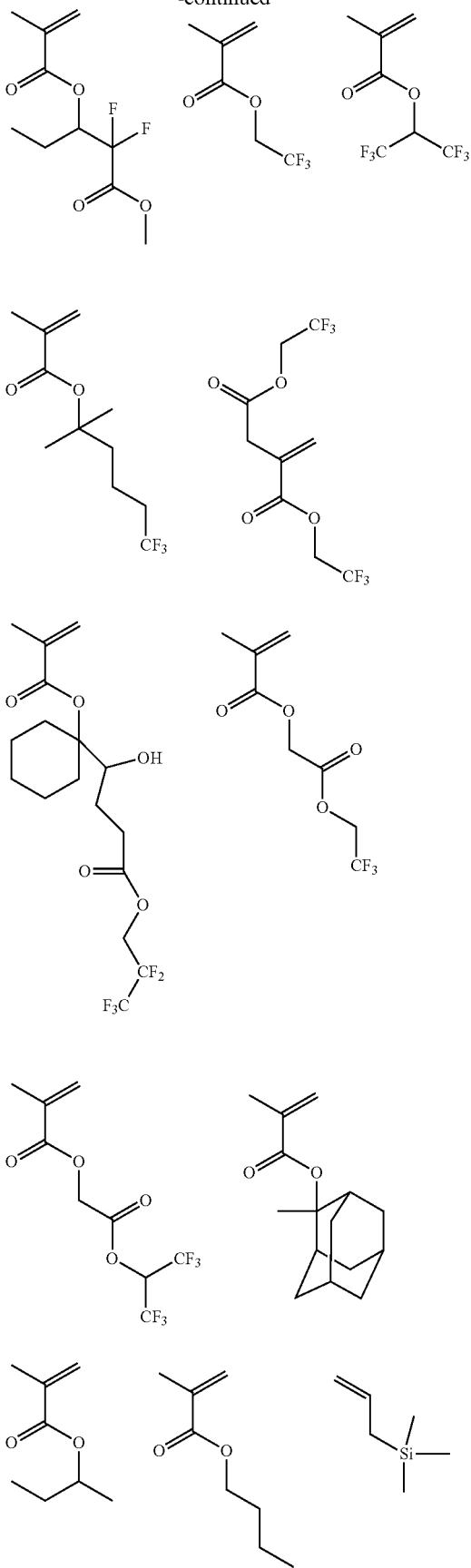

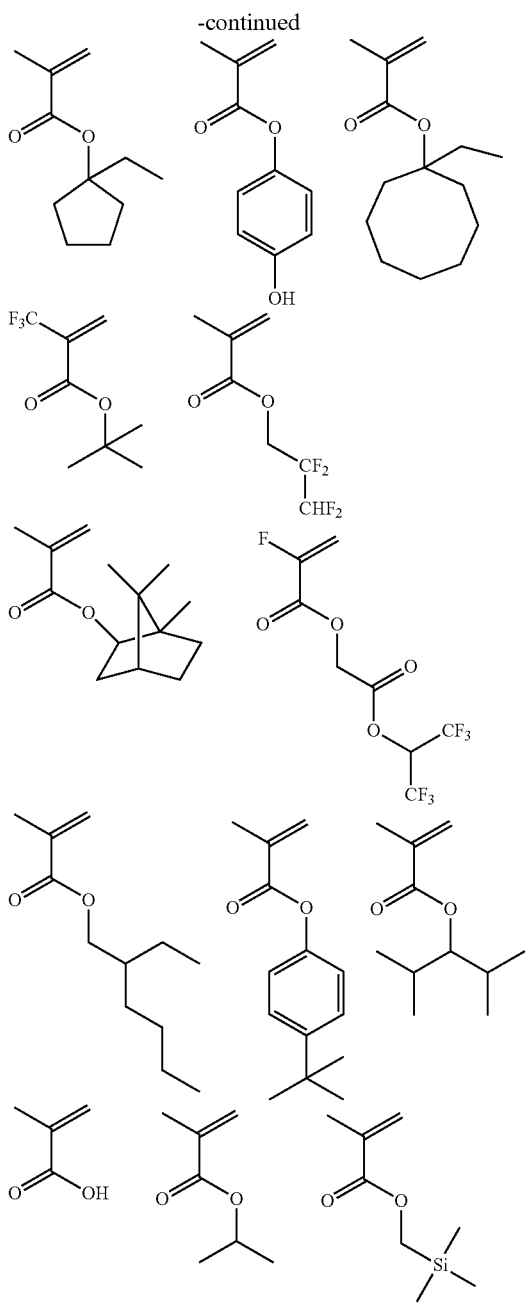

-continued

The hydrophobic resin (E) may be used singly or in combination of two or more kinds thereof.

It is preferable to use a mixture of two or more kinds of the hydrophobic resins (E) having different levels of surface energy from the viewpoint of satisfying both the immersion liquid tracking properties and the development characteristics upon liquid immersion exposure.

The content of the hydrophobic resin (E) in the composition is preferably 0.01% to 10% by mass, and more preferably 0.05% to 8% by mass, with respect to the total solid content in the composition.

<Solvent (F)>

The composition of the embodiment of the present invention may include a solvent.

In the composition of the embodiment of the present invention, a known resist solvent can be appropriately used.

For example, the known solvents disclosed in paragraphs <0665> to <0670> of US2016/0070167A1, paragraphs <0210> to <0235> of US2015/0004544A1, paragraphs <0424> to <0426> of US2016/0237190A1, and paragraphs <0357> to <0366> of US2016/0274458A1 can be suitably used.

Examples of the solvent which can be used in the preparation of the composition include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

A mixed solvent obtained by mixing a solvent having a hydroxyl group in the structure and a solvent having no hydroxyl group in the structure may be used as the organic solvent.

As the solvent having a hydroxyl group and the solvent having no hydroxyl group, the above-mentioned exemplary compounds can be appropriately selected, but as the solvent including a hydroxyl group, alkylene glycol monoalkyl ether, alkyl lactate, or the like is preferable, and propylene glycol monomethyl ether (PGME), propylene glycol monoethyl ether (PGEE), methyl 2-hydroxyisobutyrate, or ethyl lactate is more preferable. Further, as the solvent having no hydroxyl group, alkylene glycol monoalkyl ether acetate, alkyl alkoxy propionate, a monoketone compound which may contain a ring, cyclic lactone, alkyl acetate, and the like are preferable. Among those, propylene glycol monomethyl ether acetate (PGMEA), ethyl ethoxypropionate, 2-heptanone, γ-butyrolactone, cyclohexanone, and butyl acetate are more preferable, and propylene glycol monomethyl ether acetate, γ-butyrolactone, ethyl ethoxypropionate, cyclohexanone, cyclopentanone, or 2-heptanone is still more preferable. As the solvent having no hydroxyl group propylene carbonate is also preferable.

The mixing ratio (mass) of the solvent having a hydroxyl group and the solvent having no hydroxyl group is 1/99 to 99/1, preferably 10/90 to 90/10, and more preferably 20/80 to 60/40. A mixed solvent including 50% by mass or more of the solvent containing no hydroxyl group is preferable from the viewpoint of coating evenness.

The solvent preferably includes propylene glycol monomethyl ether acetate, and may be a single solvent formed of propylene glycol monomethyl ether acetate or a mixed solvent of two or more kinds of solvents containing propylene glycol monomethyl ether acetate.

<Crosslinking Agent (G)>

The composition of the embodiment of the present invention may include a compound capable of crosslinking a resin by the action of an acid (hereinafter also referred to as a crosslinking agent (G)). As the crosslinking agent (G), a known compound can be appropriately used. For example, the known compounds disclosed in paragraphs <0379> to <0431> of US2016/0147154A1 and paragraphs <0064> to <0141> of US2016/0282720A1 can be suitably used as the crosslinking agent (G).

The crosslinking agent (G) is a compound having a crosslinkable group which can crosslink a resin, and examples of the crosslinkable group include a hydroxymethyl group, an alkoxymethyl group, an acyloxymethyl group, an alkoxymethyl ether group, an oxirane ring, and an oxetane ring.

The crosslinkable group is preferably a hydroxymethyl group, an alkoxymethyl group, an oxirane ring, or an oxetane ring.

The crosslinking agent (G) is preferably a compound (which also includes a resin) having two or more crosslinkable groups.

The crosslinking agent (G) is preferably a phenol derivative, a urea-based compound (compound having a urea structure), or a melamine-based compound (compound having a melamine structure), which has a hydroxymethyl group or an alkoxymethyl group.

The crosslinking agent may be used singly or in combination of two or more kinds thereof.

The content of the crosslinking agent (G) is preferably 1% to 50% by mass, more preferably 3% to 40% by mass, and still more preferably 5% to 30% by mass.

<Surfactant (H)>

The composition of the embodiment of the present invention may include a surfactant.

In a case where the composition includes the surfactant, a fluorine-based and/or silicon-based surfactant (specifically a fluorine-based surfactant, a silicon-based surfactant, or a surfactant having both of a fluorine atom and a silicon atom) is preferable.

By incorporating the surfactant into the composition of the embodiment of the present invention, it becomes possible to form a pattern which has excellent adhesiveness and decreased development defects with good sensitivity and resolution in a case of using an exposure light source of 250 nm or less, and particularly 220 nm or less.

Examples of the fluorine-based and/or silicon-based surfactant include the surfactants described in paragraph <0276> of US2008/0248425A.

In addition, another surfactant other than the fluorine-based and/or silicon-based surfactant, described in paragraph <0280> of US2008/0248425A can also be used.

These surfactants may be used alone or in combination of two or more kinds thereof.

In a case where the composition of the embodiment of the present invention includes a surfactant, the content of the surfactant is preferably 0.0001% to 2% by mass, and more preferably 0.0005% to 1% by mass, with respect to the total solid content of the composition.

On the other hand, by setting the amount of the surfactant to 10 ppm or more with respect to the total solid content of the composition, the hydrophobic resin (E) is further unevenly distributed on the surface. Thus, a surface of the actinic ray-sensitive or radiation-sensitive film can be made more hydrophobic, which can enhance water tracking properties upon liquid immersion exposure.

(Other Additives)

The composition of the embodiment of the present invention may further include an acid proliferation agent, a dye, a plasticizer, a light sensitizer, a light absorber, an alkali-soluble resin, a dissolution inhibitor, a dissolution promotor, or the like.

<Preparation Method>

The concentration of the solid content of the composition of the embodiment of the present invention is generally 1.0% to 10% by mass, preferably 2.0% to 5.7% by mass, and more preferably 2.0% to 5.3% by mass. The concentration of the solid content refers to a mass percentage of resist components excluding the solvent, with respect to the total mass of the composition.

In addition, the film thickness of the actinic ray-sensitive or radiation-sensitive film including the composition of the embodiment of the present invention is preferably 90 nm or less, and more preferably 85 nm or less, from the viewpoint of improving resolving power. By setting the concentration of the solid content in the composition to be in an appropriate range to provide an appropriate viscosity and improve the coatability or film forming properties, such a film thickness can be obtained.

The composition of the embodiment of the present invention is used after being applied onto a predetermined support (substrate) to be used after dissolving the above-mentioned components in a predetermined organic solvent, preferably the mixed solvent, and filtering. A pore size of the filter is preferably 0.1 μm or less, more preferably 0.05 μm or less, and still more preferably 0.03 μm or less. The filter is preferably a polytetrafluoroethylene-, polyethylene- or nylon-made filter. In the filtration using a filter, as described in, for example, JP2002-062667A, circulating filtration may be performed or the filtration may be performed by connecting plural kinds of filters in series or in parallel. In addition, the composition may be filtered in plural times. Furthermore, the composition may be subjected to a deaeration treatment or the like before or after filtration using a filter.

<Applications>

The composition of the embodiment of the present invention relates to an actinic ray-sensitive or radiation-sensitive resin composition whose properties change by undergoing a reaction upon irradiation with actinic rays or radiation. More specifically, the composition of the embodiment of the present invention relates to an actinic ray-sensitive or radiation-sensitive resin composition which can be used in a step of manufacturing a semiconductor such as an integrated circuit (IC), for manufacture of a circuit board for a liquid crystal, a thermal head, or the like, the manufacture of a mold structure for imprinting, other photofabrication processes, a planographic printing plate, or an acid-curable composition. A pattern formed in the present invention can be used in an etching step, an ion implantation step, a bump electrode forming step, a rewiring forming step, a micro-electromechanical system (MEMS), or the like.

<Pattern Forming Method>

The present invention also relates to a pattern forming method using the actinic ray-sensitive or radiation-sensitive resin composition. Hereinafter, the pattern forming method of the embodiment of the present invention will be described. Further, the actinic ray-sensitive or radiation-sensitive film of the present invention will also be described, together with the pattern forming method.

The pattern forming method of the embodiment of the present invention includes:

(i) a step of forming a resist film (actinic ray-sensitive or radiation-sensitive film) on a support using the above-mentioned actinic ray-sensitive or radiation-sensitive resin composition (resist film forming step), (ii) a step of exposing the resist film (irradiating actinic rays or radiation) (exposing step), and (iii) a step of developing the exposed resist film using a developer (developing step).

The pattern forming method of the embodiment of the present invention is not particularly limited as long as it includes the (i) to (iii) steps, and may further include the following steps.

In the pattern forming method of the embodiment of the present invention, the exposing method in the (ii) exposing step may be liquid immersion exposure.

The pattern forming method of the embodiment of the present invention preferably includes a (iv) prebaking (PB) step before the (ii) exposing step.

The pattern forming method of the embodiment of the present invention preferably includes a (v) post-exposure baking (PEB) step after the (ii) exposing step and before the (iii) developing step.

The pattern forming method of the embodiment of the present invention may include the (ii) exposing step a plurality of times.

The pattern forming method of the embodiment of the present invention may include the (iv) prebaking heating step a plurality of times.

The pattern forming method of the embodiment of the present invention may include the (v) post-exposure baking step a plurality of times.

In the pattern forming method of the embodiment of the present invention, the above-mentioned (i) film forming step, (ii) exposing step, and (iii) developing step can be performed by a generally known method.

In addition, a resist underlayer film (for example, spin on glass (SOG), spin on carbon (SOC), and an antireflection film) may be formed between the resist film and the support, as desired. As a material constituting the resist underlayer film, known organic or inorganic materials can be appropriately used.

A protective film (topcoat) may be formed on the upper layer of the resist film. As the protective film, a known material can be appropriately used. For example, the compositions for forming a protective film disclosed in US2007/0178407A, US2008/0085466A, US2007/0275326A, US2016/0299432A, US2013/0244438A, or WO2016/157988A can be suitably used. The composition for forming a protective film preferably includes the above-mentioned acid diffusion control agent.

A protective film may be formed on the upper layer of the resist film containing the above-mentioned hydrophobic resin.

The support is not particularly limited, and a substrate which is generally used in a process for manufacturing a semiconductor such as an IC, and a process for manufacturing a circuit board for a liquid crystal, a thermal head, or the like, and other lithographic processes of photofabrication can be used. Specific examples of the support include an inorganic substrate such as silicone, $SiO_2$, and SiN.

For any of the (iv) prebaking step and the (v) post-exposure baking step, the heating temperature is preferably 70° C. to 130° C., and more preferably 80° C. to 120° C.

For any of the (iv) prebaking step and the (v) post-exposure baking step, the heating time is preferably 30 to 300 seconds, more preferably 30 to 180 seconds, and still more preferably 30 to 90 seconds.

Heating may be performed using a means comprised in an exposure device and a development device, or may also be performed using a hot plate or the like.

The light source wavelength used in the exposing step is not particularly limited, and examples thereof include infrared rays, visible light, ultraviolet rays, far ultraviolet rays, extreme ultraviolet rays (EUV), X-rays, and electron beams. Among those, far ultraviolet rays are preferable, whose wavelength is preferably 250 nm or less, more preferably 220 nm or less, and still more preferably 1 to 200 nm. Specific examples thereof include a KrF excimer laser (248 nm), an ArF excimer laser (193 nm), an $F_2$ excimer laser (157 nm), X-rays, EUV (13 nm), and electron beams, and the KrF excimer laser, the ArF excimer laser, EUV, or the electron beams are preferable.

In the (iii) developing step, the developer may be either an alkali developer or a developer including an organic solvent (hereinafter also referred to as an organic developer).

As the alkali developer, a quaternary ammonium salt typified by tetramethylammonium hydroxide is usually used, but in addition to the developer, an aqueous alkali solution such as an inorganic alkali, primary to tertiary amines, alcohol amine, and cyclic amine can also be used.

In addition, the alkali developer may include an appropriate amount of alcohols and/or a surfactant. The alkali concentration of the alkali developer is usually 0.1% to 20% by mass. The pH of the alkali developer is usually 10 to 15.

The time for performing development using the alkali developer is usually 10 to 300 seconds.

The alkali concentration, the pH, and the development time using the alkali developer can be appropriately adjusted depending on a pattern formed.

As the organic developer, a developer including at least one organic solvent selected from the group consisting of a ketone-based solvent, an ester-based solvent, an alcohol-based solvent, an amide-based solvent, an ether-based solvent, and hydrocarbon-based solvents is preferable.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butanoate, methyl 2-hydroxyisobutyrate, isoamyl acetate, isobutyl isobutyrate, and butyl propionate.

As the alcohol-based solvent, the amide-based solvent, the ether-based solvent, and the hydrocarbon-based solvent, the solvents disclosed in paragraphs <0715> to <0718> of US2016/0070167A1 can be used.

A plurality of the solvents may be mixed or the solvent may be used in admixture with a solvent other than those described above or water. The moisture content in the entire developer is preferably less than 50% by mass, more preferably less than 20% by mass, and still more preferably less than 10% by mass, and particularly preferably, moisture is not substantially included.

The content of the organic solvent with respect to the organic developer is preferably 50% to 100% by mass, more preferably 80% to 100% by mass, still more preferably 90% to 100% by mass, and particularly preferably 95% to 100%) by mass, with respect to the total amount of the developer.

The organic developer may include an appropriate amount of a known surfactant, as desired.

The content of the surfactant is usually 0.001% to 5% by mass, preferably 0.005% to 2% by mass, and still more preferably 0.01% to 0.5% by mass, with respect to the total amount of the developer.

The organic developer may include the above-mentioned acid diffusion control agent.

Examples of the developing method include a method in which a substrate is immersed in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), and a method in which a developer is continuously discharged onto a substrate spun at a constant rate while scanning a developer discharging nozzle at a constant rate (a dynamic dispense method).

A combination of a step of performing development using an aqueous alkali solution (an alkali developing step) and a step of performing development using a developer including an organic solvent (an organic solvent developing step) may be used, whereby a finer pattern can be formed since a pattern can be formed by keeping only a region with an intermediate exposure intensity from not being dissolved.

It is preferable that after the (iii) developing step, a step of performing washing using a rinsing liquid (a rinsing step) is included.

As the rinsing liquid used in the rinsing step after the developing step using an alkali developer, for example, pure water can be used. Pure water may include an appropriate amount of a surfactant. In this case, after the developing step or the rinsing step, a treatment for removing the developer or the rinsing liquid adhering on a pattern by a supercritical fluid may be added. In addition, after the rinsing treatment or the treatment using a supercritical fluid, a heating treatment for removing moisture remaining in the pattern may be performed.

The rinsing liquid used in the rinsing step after the step of performing development using a developer including an organic solvent is not particularly limited as long as the rinsing liquid does not dissolve the resist pattern, and a solution including a common organic solvent can be used. As the rinsing liquid, a rinsing liquid including at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent are the same solvents as those described for the developer including an organic solvent.

As the rinsing liquid used in the rinsing step in this case, a rinsing liquid including a monohydric alcohol is more preferable.

Here, examples of the monohydric alcohol used in the rinsing step include linear, branched, or cyclic monohydric alcohols, and specifically, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, and methyl isobutyl carbinol. Examples of the monohydric alcohol having 5 or more carbon atoms include 1-hexanol, 2-hexanol, 4-methyl-2-pentanol, 1-pentanol, 3-methyl-1-butanol, and methyl isobutyl carbinol.

The respective components in plural number may be mixed or the components may be used in admixture with an organic solvent other than the above solvents.

The moisture content in the rinsing liquid is preferably 10% by mass or less, more preferably 5% by mass or less, and still more preferably 3% by mass or less. By setting the moisture content to 10% by mass or less, good development characteristics can be obtained.

The rinsing liquid may include an appropriate amount of a surfactant.

In the rinsing step, the substrate that has been subjected to development using an organic developer is subjected to a washing treatment using a rinsing liquid including an organic solvent. A method for the washing treatment method is not particularly limited, but examples thereof include a method in which a rinsing liquid is continuously discharged on a substrate rotated at a constant rate (a rotation application method), a method in which a substrate is immersed in a tank filled with a rinsing liquid for a certain period of time (a dip method), and a method in which a rinsing liquid is sprayed on a substrate surface (a spray method). Among those, it is preferable that a washing treatment is carried out using the rotation application method, and a substrate is rotated at a rotation speed of 2,000 to 4,000 rpm after washing, thereby removing the rinsing liquid from the substrate. Furthermore, it is also preferable that the method includes a baking step after the rinsing step (post-baking). The developer and the rinsing liquid remaining between and inside the patterns are removed by the baking step. In the heating step after the rinsing step, the heating temperature is usually 40° C. to 160° C., and preferably 70° C. to 95° C., and typically for 10 seconds to 3 minutes, and preferably for 30 seconds to 90 seconds.

It is preferable that various materials (for example, a resist solvent, a developer, a rinsing liquid, a composition for forming an antireflection film, and a composition for forming a topcoat) used in the actinic ray-sensitive or radiation-sensitive resin composition of the embodiment of the present invention, and the pattern forming method of the embodiment of the present invention do not include impurities such as metals. The content of the impurities included in these materials is preferably 1 ppm by mass or less, more preferably 100 ppt by mass or less, and still more preferably 10 ppt by mass or less, and particularly preferably, the impurities are not substantially included (no higher than a detection limit of a measurement device).

Examples of a method for removing impurities such as metals from the various materials include filtration using a filter. As for the filter pore diameter, the pore size is preferably 10 nm or less, more preferably 5 nm or less, and still more preferably 3 nm or less. As for the materials of a filter, a polytetrafluoroethylene-made filter, a polyethylene-made filter, and a nylon-made filter are preferable. As the filter, a filter which had been washed with an organic solvent in advance may be used. In the step of filtration using a filter, plural kinds of filters connected in series or in parallel may be used. In a case of using the plural kinds of filters, a combination of filters having different pore diameters and/or materials may be used. In addition, various materials may be filtered plural times, and the step of filtering plural times may be a circulatory filtration step. As the filter, a filter having a reduced amount of elutes as disclosed in JP2016-201426A is preferable.

In addition to the filtration using a filter, removal of impurities by an adsorbing material may be performed, or a combination of filtration using a filter and an adsorbing material may be used. As the adsorbing material, known adsorbing materials can be used, and for example, inorganic adsorbing materials such as silica gel and zeolite, and organic adsorbing materials such as activated carbon can be used. Examples of the metal adsorbing agent include those disclosed in JP2016-206500A.

In addition, as a method for reducing the impurities such as metals included in various materials, metal content selects the less material as a raw material constituting the various materials, performing filtering using a filter of the raw material constituting the various materials, equipment the inner and a method such as performing distillation under conditions suppressing as much as possible equal to contamination is lined with TEFLON (registered trademark). Preferred conditions in the filtering using a filter to be performed on the raw material constituting the various materials are similar to the above-mentioned conditions.

In order to prevent impurities from being incorporated, it is preferable that various materials are stored in the container described in US2015/0227049A, JP2015-123351A. or the like.

A method for improving the surface roughness of a pattern may be applied to a pattern formed by the pattern forming method of the embodiment of the present invention. Examples of the method for improving the surface roughness of a pattern include the method of treating a resist pattern by plasma of a hydrogen-containing gas disclosed in US2015/0104957A. In addition, known methods as described in JP2004-235468A, US2010/0020297A, and Proc. of SPIE Vol. 832883280N-1 "EUV Resist Curing Technique for LWR Reduction and Etch Selectivity Enhancement" may be applied.

In addition, a pattern formed by the method can be used as a core material (core) of the spacer process disclosed in JP1991-270227A (JP-H03-270227A) and US2013/0209941A.

[Method for Manufacturing Electronic Device]

In addition, the present invention further relates to a method for manufacturing an electronic device, including the above-described pattern forming method, and an electronic device manufactured by the method for manufacturing an electronic device.

The electronic device of the present invention is suitably mounted on electric or electronic equipment (for example, home electronics, office automation (OA)-related equipment, media-related equipment, optical equipment, and telecommunication equipment).

EXAMPLES

Hereinbelow, the present invention will be described in more detail with reference to Examples. The materials, the amounts of materials used, the proportions, the treatment details, the treatment procedure, or the like shown in the Examples below may be modified if appropriate as long as the modifications do not depart from the spirit of the present invention. Therefore, the scope of the present invention should not be construed as being limited to the Examples shown below.

[Preparation of Actinic Ray-Sensitive or Radiation-Sensitive Resin Composition]

Various components included in an actinic ray-sensitive or radiation-sensitive resin composition shown in Table 4 are shown below.

<Resin (A)>

Resins A-1 to A-10 shown in Table 4, which had been synthesized in accordance with a synthesis method (Synthesis Example 1) for the resin A-1 which will be described later, were used. The molar ratios, the weight-average molecular weight (Mw), and the dispersity (Mw/Mn) of the repeating units in the resins A-1 to A-10 shown in Table 4 are shown in Table 1.

Furthermore, the weight-average molecular weight (Mw) and the dispersity (Mw/Mn) of the resins A-1 to A-10 were measured by GPC (carrier: tetrahydrofuran (THF)) (in terms of polystyrene). Further, the compositional ratios (ratio in % by mole) of the resins were measured by $^{13}$C-NMR (nuclear magnetic resonance).

TABLE 1

|  | Molar ratio of repeating unit 1 | | Molar ratio of repeating unit 2 | | Molar ratio of repeating unit 3 | | Molar ratio of repeating unit 4 | | Mw | Mw/Mn |
|---|---|---|---|---|---|---|---|---|---|---|
| Resin A-1 | MA-2 | 10 | MA-5 | 50 | MB-3 | 40 | | | 12,000 | 1.5 |
| Resin A-2 | MA-1 | 40 | MA-3 | 20 | MB-2 | 40 | | | 15,000 | 1.7 |
| Resin A-3 | MA-4 | 40 | MA-7 | 10 | MB-3 | 30 | MB-2 | 20 | 8,000 | 1.5 |
| Resin A-4 | MA-6 | 50 | MB-1 | 30 | MB-5 | 20 | | | 14,000 | 1.6 |
| Resin A-5 | MA-5 | 40 | MA-8 | 20 | MB-7 | 20 | MB-8 | 20 | 9,500 | 1.5 |
| Resin A-6 | MA-2 | 20 | MA-6 | 30 | MB-2 | 40 | MB-6 | 10 | 18,000 | 1.7 |
| Resin A-7 | MA-1 | 70 | MB-4 | 30 | | | | | 8,500 | 1.6 |
| Resin A-8 | MA-6 | 50 | MC-1 | 10 | MB-2 | 40 | | | 9,000 | 1.7 |
| Resin A-9 | MA-3 | 40 | MA-4 | 10 | MB-8 | 40 | MC-2 | 10 | 75,000 | 1.5 |
| Resin A-10 | MA-5 | 50 | MB-5 | 50 | | | | | 20,000 | 1.9 |

The monomer structures used for the synthesis of the resins A-1 to A-10 shown in Table 4 are shown below.

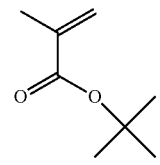

MA-1

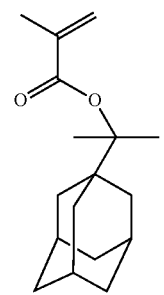

MA-2

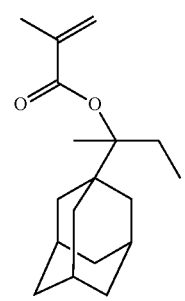

MA-3

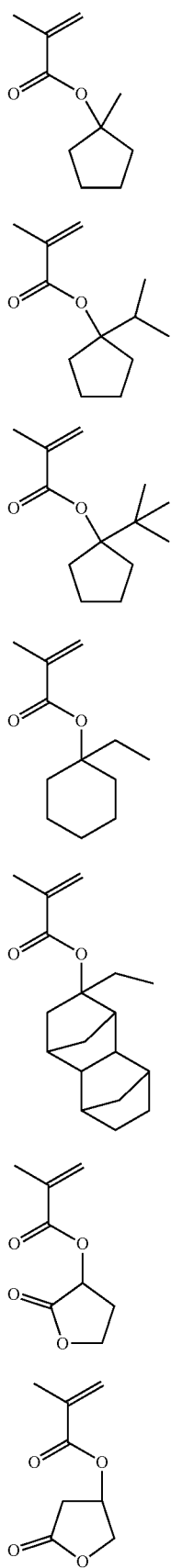
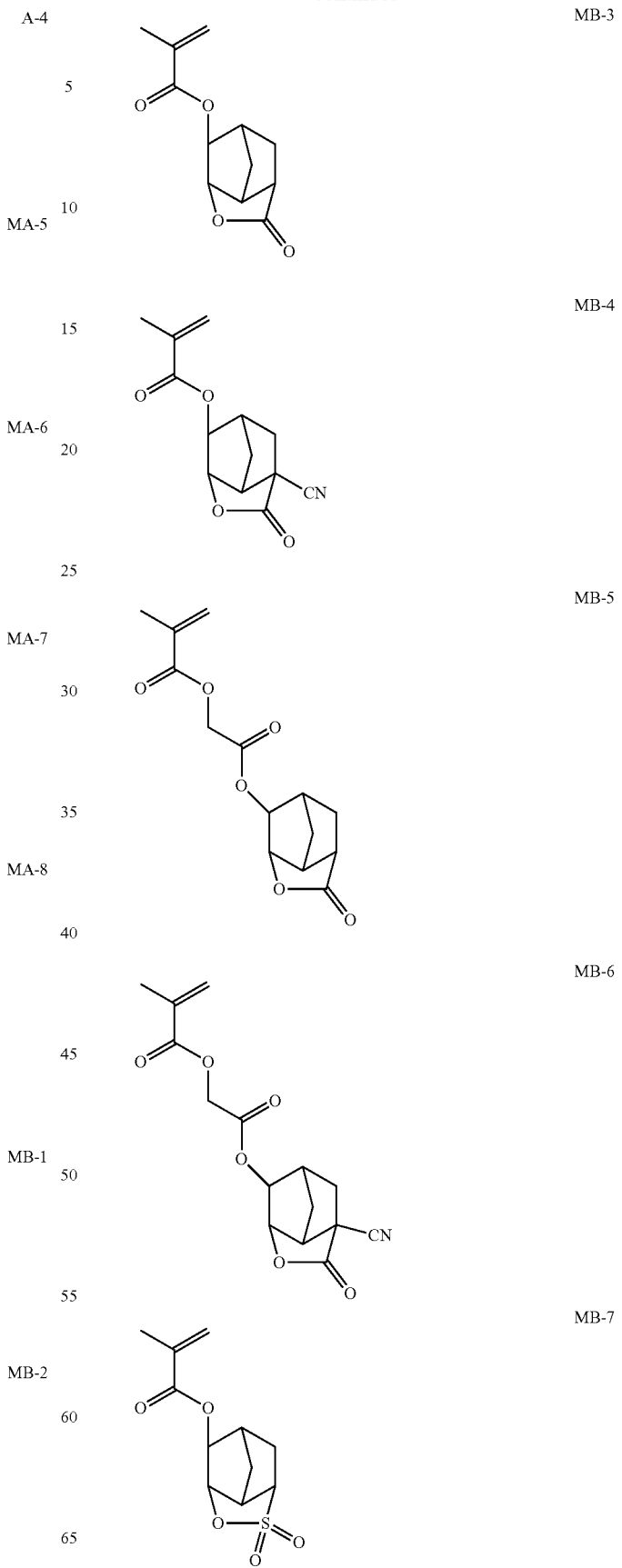

-continued

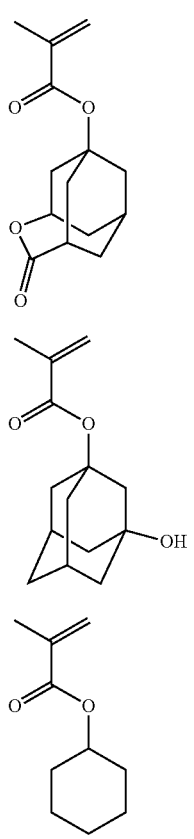

MB-8

MC-1

MC-2

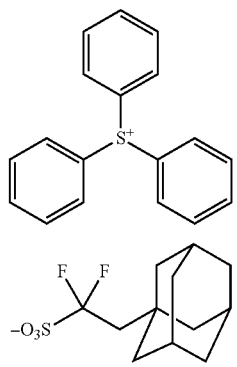

B-1

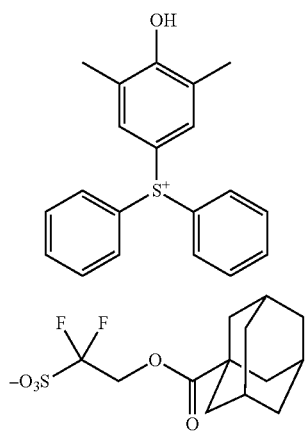

B-2

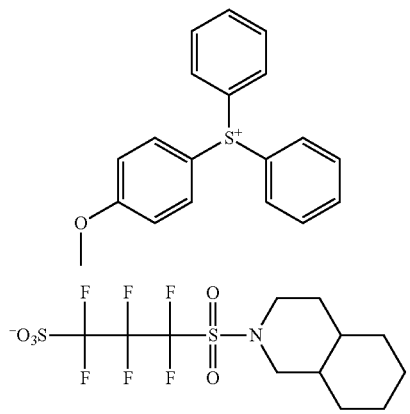

B-3

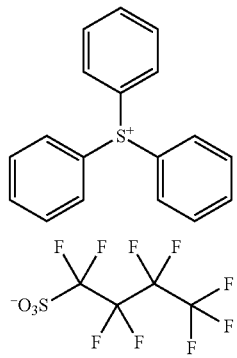

B-4

Synthesis Example 1: Synthesis of Resin A-1

102.3 parts by mass of cyclohexanone were heated to 80° C. under a nitrogen gas stream. While stirring the liquid, a mixed solution of 6.6 parts by mass of a monomer represented by Structural Formula MA-2, 24.5 parts by mass of a monomer represented by Structural Formula MA-5, 22.2 parts by mass of a monomer represented by Structural Formula MB-3, 196.4 parts by mass of cyclohexanone, and 2.30 parts by mass of dimethyl 2,2'-azobisisobutyrate [V-601, manufactured by Wako Pure Chemical Industries, Ltd.] was added dropwise thereto for 5 hours to obtain a reaction solution. After finishing the dropwise addition, the reaction solution was further stirred at 80° C. for 2 hours. The obtained reaction solution was left to be cooled and re-precipitated with a large amount of hexane/ethyl acetate (mass ratio 9:1), followed by filtering. The obtained solid was vacuum-dried to obtain 44.1 parts by mass of the resin A-1.

The weight-average molecular weight (Mw: in terms of polystyrene) and the dispersity (Mw/Mn) of the obtained resin A-1 as determined by GPC (carrier: tetrahydrofuran (THF)) were 12,000 and 1.5, respectively. The compositional ratio in terms of a molar ration as measured by $^{13}$C-NMR (nuclear magnetic resonance) was 10/50/40.

<Acid Generator (B)>

The structures of the acid generators (B) (compounds B-1 to B-8) (acid generators other than the betaine-based acid generator (C) which will be described later) shown in Table 4 are shown below.

-continued

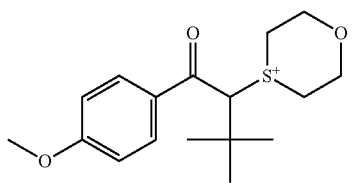
B-5

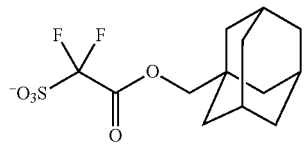
B-6

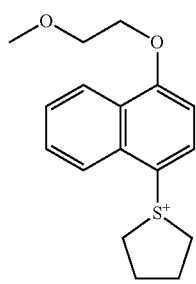

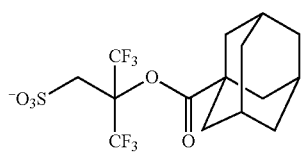
B-7

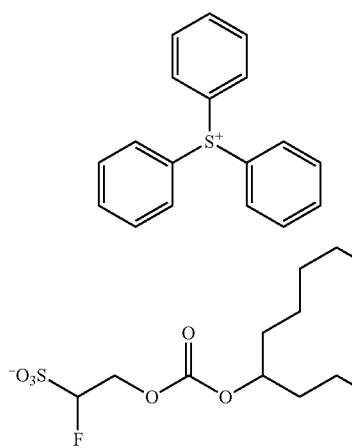

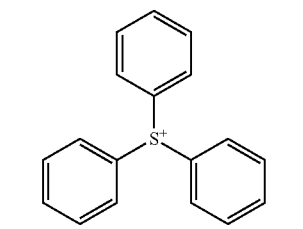
B-8

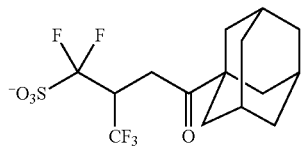

<Betaine-Based Acid Generator (C)>

The structures of the compounds represented by General Formula (1) (compounds C-1 to C-11) and comparative betaine-based acid generators (compounds C-12 to C-14) shown in Table 4 are shown below. Further, a synthesis example for Compound C-1 is shown as an example.

Synthesis Example 2: Synthesis of Compound C-1

2.0 g of Structural Formula C-1' and 1.24 g of ethyl bromofluoroacetate were dissolved in 20 g of acetonitrile, and a solution thus obtained was cooled to 0° C. Then, 1 g of carbonate potassium was added to the solution at 0° C. Thereafter, the solution was warmed to a temperature for heating and refluxing, and stirred for 2 hours. Subsequently, 20 g of water was added to the solution and the mixture was further stirred at room temperature for 2 hours to obtain a reaction solution. 30 g of ethyl acetate and 40 g of water were added to the obtained reaction solution, and the organic phase was removed by a liquid separation operation. The aqueous layer was purified by ion exchange ring chromatography (ion-exchange resin: AG501-X8 manufactured by Bio-Rad Laboratories, Inc.) and then the solvent was evaporated under reduced pressure to obtain 1.55 g of a compound C-1.

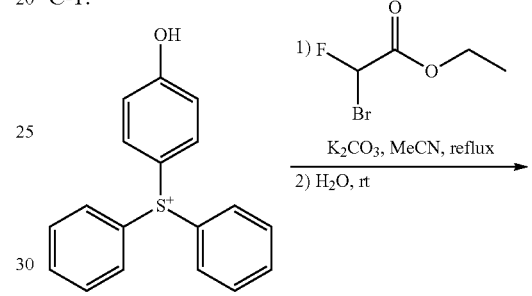

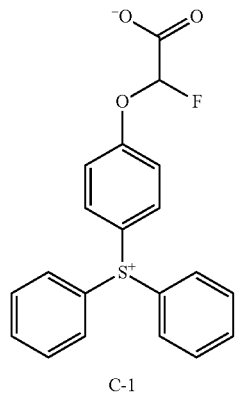

In addition, the same operation as in the synthesis example for the compound C-1 (Synthesis Example 2) was performed to synthesize compounds C-2 to C-14 described below.

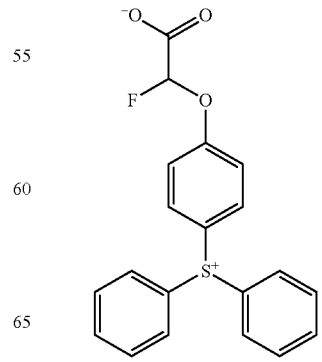
C-1

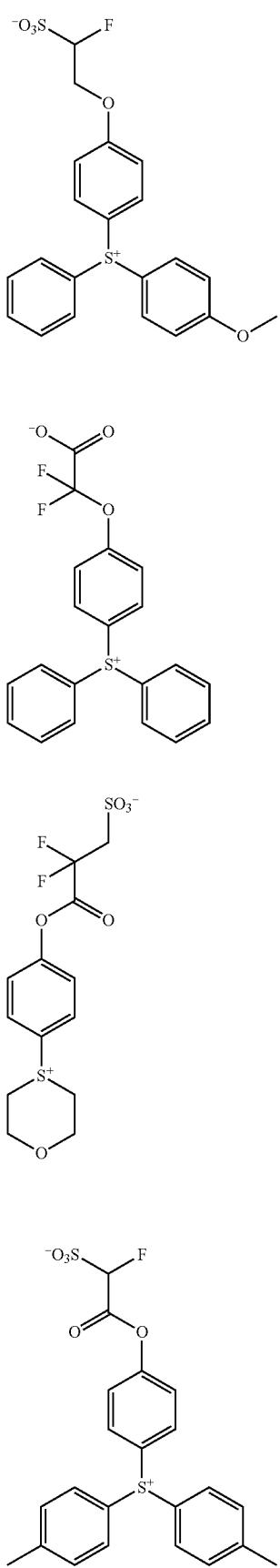
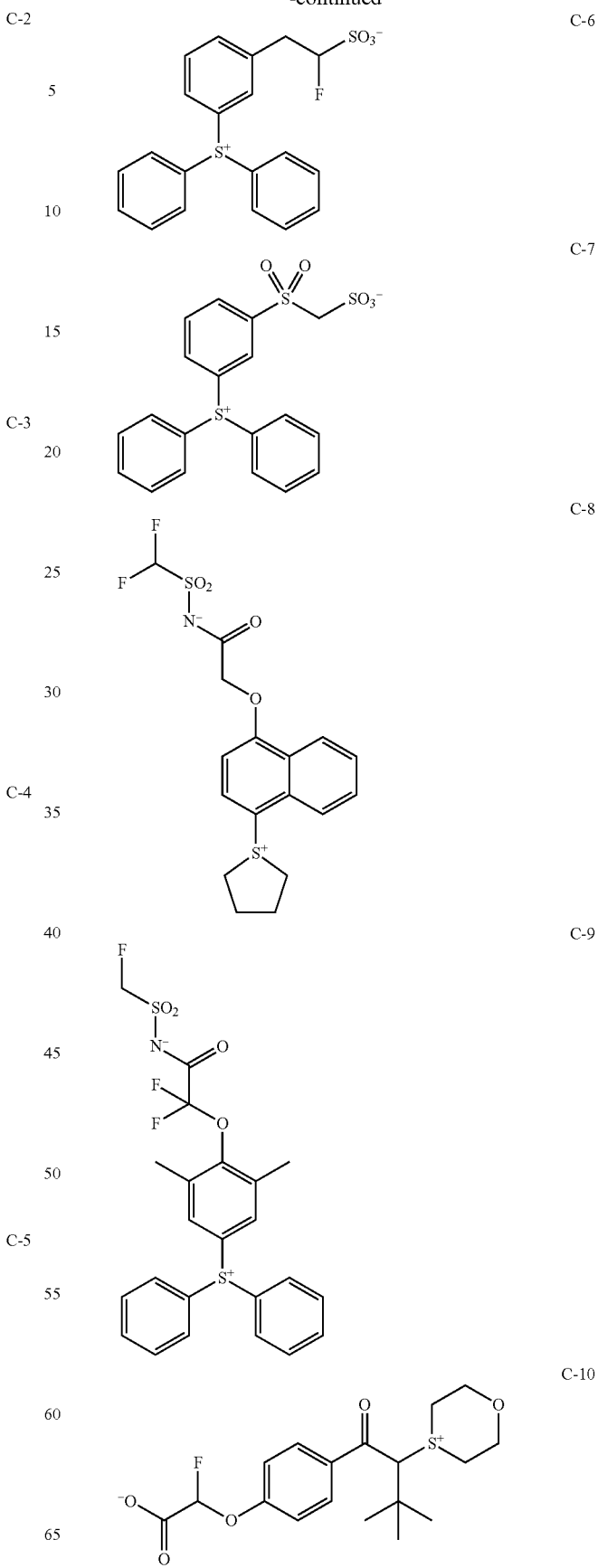

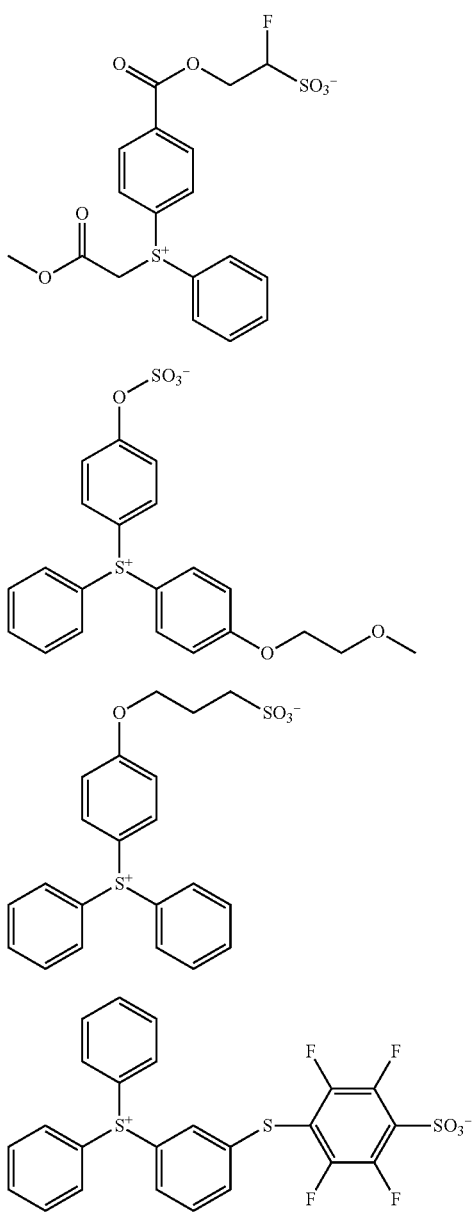

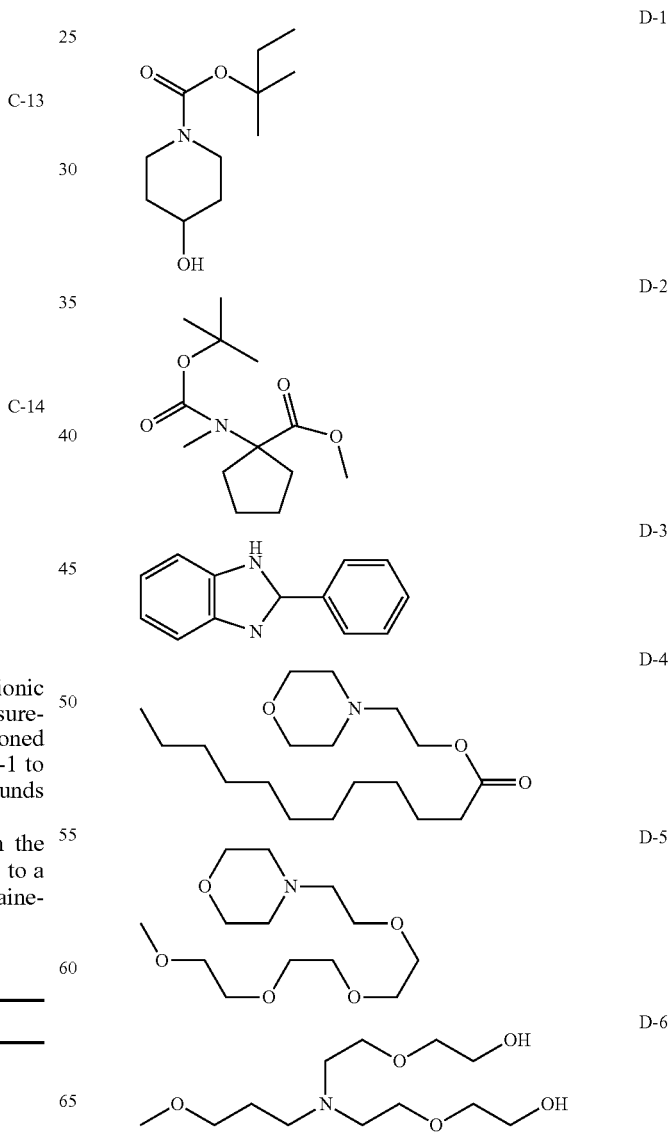

The pKa's of the compounds C-1 to C-14 as the anionic moieties were protonated are shown in Table 2. Measurement of the pKa was performed by the above-mentioned method. Further, acids generated by the compounds C-1 to C-14 had substantially the same pKa's as the compounds C-1 to C-14 as the anionic moieties were protonated.

In addition, the pKa's of the acids generated from the above-mentioned acid generators (B) (a compound B-1 to a compound B-8) (acid generators other than the betaine-based acid generator (C)) are also shown in Table 2.

TABLE 2

| Compound | pKa | Compound | pKa |
|---|---|---|---|
| C-1 | 0.5 | B-1 | −1.86 |
| C-2 | −0.8 | B-2 | −2.7 |
| C-3 | −1.6 | B-3 | −3.27 |
| C-4 | 0.35 | B-4 | −3.57 |
| C-5 | −1.8 | B-5 | −3.26 |
| C-6 | −1.0 | B-6 | 0.2 |
| C-7 | −1.1 | B-7 | −0.82 |
| C-8 | 0.0 | B-8 | −3.1 |
| C-9 | 0.6 | | |
| C-10 | −1.5 | | |
| C-11 | −0.9 | | |
| C-12 | −5.7 | | |
| C-13 | −3 | | |
| C-14 | −2.44 | | |

<Acid Diffusion Control Agent (D)>

The structures of the acid diffusion control agents (D) shown in Table 4 are shown below.

-continued

D-7

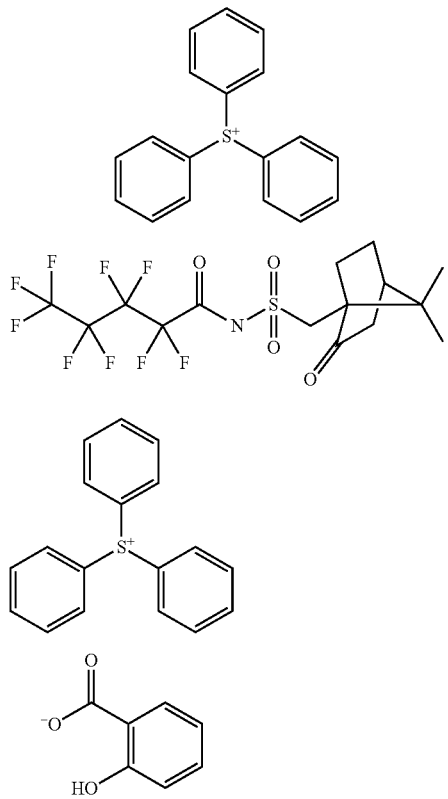

D-8

-continued

D-9

<Hydrophobic Resin (E) and Resin (PT) for Topcoat>

As the hydrophobic resins E-1 to E-11 shown in Table 4 and the resins PT-1 to PT-3 for a topcoat shown in Table 5, synthesized resins were used.

The molar ratios, the weight-average molecular weight (Mw), and the dispersity (Mw/Mn) of the repeating units in the hydrophobic resins shown in Table 4 and the resins for a topcoat shown in Table 5 are shown in Table 3.

Furthermore, the weight-average molecular weight (Mw) and the dispersity (Mw/Mn) of the hydrophobic resins E-1 to E-11 and the resins PT-1 to PT-3 for a topcoat were measured by GPC (carrier: tetrahydrofuran (THF)) (in terms of polystyrene). Further, the compositional ratios (ratio in % by mole) of the resins were measured by $^{13}$C-NMR (nuclear magnetic resonance).

TABLE 3

|  | Molar ratio of repeating unit 1 | | Molar ratio of repeating unit 2 | | Molar ratio of repeating unit 3 | | Molar ratio of repeating unit 4 | | Mw | Mw/Mn |
|---|---|---|---|---|---|---|---|---|---|---|
| Resin E-1 | ME-3 | 60 | ME-4 | 40 | | | | | 10,000 | 1.4 |
| Resin E-2 | ME-15 | 50 | ME-1 | 50 | | | | | 12,000 | 1.5 |
| Resin E-3 | ME-2 | 40 | ME-13 | 50 | ME-9 | 5 | ME-20 | 5 | 6,000 | 1.3 |
| Resin E-4 | ME-19 | 50 | ME-14 | 50 | | | | | 9,000 | 1.5 |
| Resin E-5 | ME-10 | 50 | ME-2 | 50 | | | | | 15,000 | 1.5 |
| Resin E-6 | ME-17 | 50 | ME-15 | 45 | ME-12 | 5 | | | 10,000 | 1.5 |
| Resin E-7 | ME-7 | 100 | | | | | | | 23,000 | 1.7 |
| Resin E-8 | ME-5 | 100 | | | | | | | 13,000 | 1.5 |
| Resin E-9 | ME-6 | 50 | ME-16 | 50 | | | | | 10,000 | 1.7 |
| Resin E-10 | ME-13 | 10 | ME-18 | 85 | ME-9 | 5 | | | 11,000 | 1.4 |
| Resin E-11 | ME-8 | 80 | ME-11 | 20 | | | | | 13,000 | 1.4 |
| Resin PT-1 | ME-2 | 40 | ME-11 | 30 | ME-9 | 30 | | | 8,000 | 1.6 |
| Resin PT-2 | ME-2 | 50 | ME-8 | 40 | ME-3 | 10 | | | 5,000 | 1.5 |
| Resin PT-3 | ME-3 | 30 | ME-4 | 70 | | | | | 8,500 | 1.7 |

The monomer structures used for the synthesis of the hydrophobic resins E-1 to E-11 shown in Table 4 and the resins PT-1 to PT-3 for a topcoat shown in Table 5 are shown below.

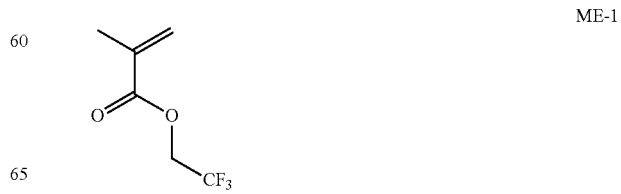

ME-1

-continued
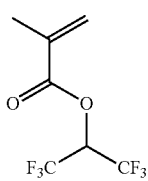
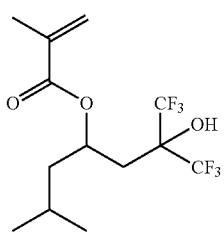
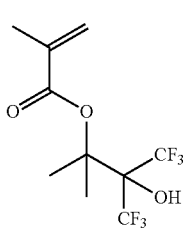
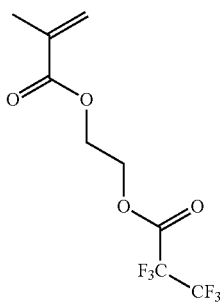
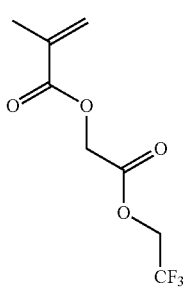
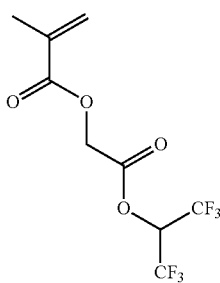
ME-2
ME-3
ME-4
ME-5
ME-6
ME-7
-continued
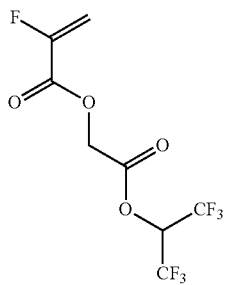
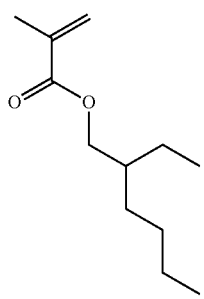
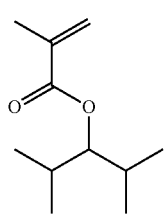
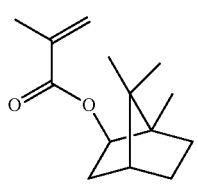
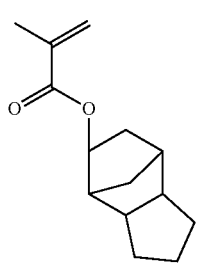
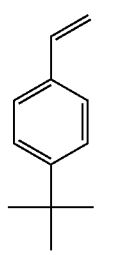
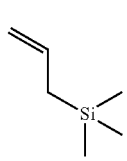
ME-8
ME-9
ME-10
ME-11
ME-12
ME-13
ME-14

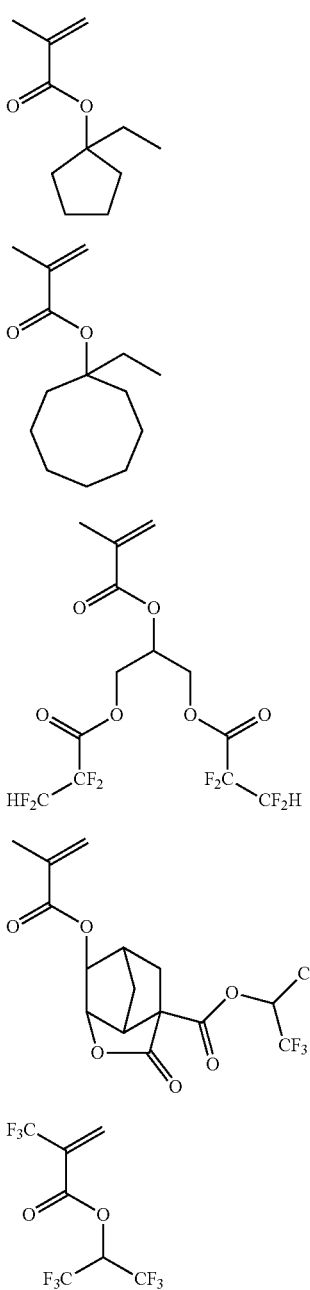
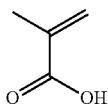

ME-15
ME-16
ME-17
ME-18
ME-19
ME-20

<Surfactant (H)>

The surfactants shown in Table 4 are shown below

H-1: MEGAFACE F176 (manufactured by DIC Corporation, fluorine-based surfactant)

H-2: MEGAFACE R08 (manufactured by DIC Corporation, fluorine- and silicon-based surfactant)

H-3: PF656 (manufactured by OMNOVA Solutions Inc., fluorine-based surfactant)

<Solvents (F)>

The solvents (F) shown in Table 4 are shown below.

F-1: Propylene glycol monomethyl ether (PGME)

F-2: Propylene glycol monomethyl ether acetate (PGMEA)

F-3: Propylene glycol monoethyl ether (PGEE)

F-4: Cyclohexanone

F-5: Cyclopentanone

F-6: 2-Heptanone

F-7: Ethyl lactate

F-8: γ-Butyrolactone

F-9: Propylene carbonate

<Preparation of Actinic Ray-Sensitive or Radiation-Sensitive Resin Composition>

The respective components shown in Table 4 were mixed until the concentration of the solid content became 4% by mass. Then, the obtained mixed liquid was first filtered through a polyethylene-based filter having a pore diameter of 50 nm, then filtered through a nylon-based filter having a pore diameter of 10 nm, and lastly filtered through a polyethylene-based filter having a pore diameter of 5 nm to prepare an actinic ray-sensitive or radiation-sensitive resin composition (hereinafter also referred to as a resin composition). Further, in the resin composition, the solid content means all components except for the solvent (F). The obtained resin composition was used in Examples and Comparative Examples.

In addition, in Table 4, the contents (% by mass) of the respective components mean contents with respect to the solid contents.

TABLE 4

| | Actinic ray-sensitive or radiation-sensitive resin composition (composition) | | | | | | |
|---|---|---|---|---|---|---|---|
| | Resin (A) | | Acid generator (B) | | Betaine compound (C) | | Acid diffusion control agent (D) | |
| | Type | % by mass | Type | % by mass | Type | % by mass | Type | % by mass |
| Re-1 | A-1 | 87.7 | B-6 | 8.6 | C-1 | 1.8 | D-1 | 1.3 |
| Re-2 | A-5 | 88.6 | B-4 | 4.5 | C-2 | 2.6 | D-9 | 4.8 |
| Re-3 | A-3 | 88.9 | B-3 | 5.1 | C-3 | 3.0 | D-8 | 2.1 |
| Re-4 | A-4 | 89.4 | B-1 | 2.7 | C-4 | 3.3 | D-4 | 1.5 |
| Re-5 | A-2 | 83.3 | B-5 | 8.9 | C-5 | 4.0 | D-5 | 2.7 |

TABLE 4-continued

| | | | | | | | | |
|---|---|---|---|---|---|---|---|---|
| Re-6 | A-6/A-1 | 44.2/44.1 | B-2 | 5.7 | C-6 | 3.5 | D-2 | 1.6 |
| Re-7 | A-9 | 86.5 | B-3 | 4.3 | C-7 | 3.4 | D-7 | 5.0 |
| Re-8 | A-9 | 94.6 | B-8 | 2.0 | C-8 | 0.4 | — | — |
| Re-9 | A-7 | 82.8 | B-7/B-6 | 4.9/6.4 | C-9 | 2.9 | — | — |
| Re-10 | A-10 | 81.5 | B-2/B-5 | 5.7/5.7 | C-10 | 3.0 | D-3/D-7 | 0.5/1.6 |
| Re-11 | A-8 | 89.0 | — | | C-11 | 8.1 | D-3 | 1.1 |
| Re-12 | A-2 | 90.4 | — | | C-10 | 6.7 | D-6 | 1.4 |
| Re-A | A-4 | 85.7 | B-1 | 3.3 | C-12 | 7.8 | D-2 | 2.2 |
| Re-B | A-3 | 95.4 | B-8 | 3.3 | C-13 | 0.7 | — | — |
| Re-C | A-5 | 86.4 | B-4 | 4.5 | C-14 | 4.7 | D-8 | 2.4 |

| | Actinic ray-sensitive or radiation-sensitive resin composition (composition) | | | | | | |
|---|---|---|---|---|---|---|---|
| | Hydrophobic resin (E) | | Surfactant (H) | | Solvent (F) | | |
| | Type | % by mass | Type | % by mass | Type | Mixing ratio | Note |
| Re-1 | E-1/E-2 | 0.3/0.3 | — | — | F-1/F-2 | 80/20 | Example |
| Re-2 | E-3 | 1.5 | — | — | F-1/F-2/F-8 | 70/25/5 | Example |
| Re-3 | E-4 | 0.9 | — | — | F-1/F-8 | 70/30 | Example |
| Re-4 | E-8 | 3.1 | — | — | F-1/F-7 | 80/20 | Example |
| Re-5 | E-1 | 0.8 | H-1/H-2 | 0.2/0.1 | F-1/F-4 | 70/30 | Example |
| Re-6 | E-3 | 0.8 | H-3 | 0.1 | F-1/F-5 | 50/50 | Example |
| Re-7 | E-5 | 0.8 | — | — | F-1/F-8 | 90/10 | Example |
| Re-8 | E-9 | 3.0 | — | — | F-6/F-8 | 60/40 | Example |
| Re-9 | E-10 | 3.0 | — | — | F-3/F-8 | 50/50 | Example |
| Re-10 | E-11 | 2.0 | — | — | F-7/F-9 | 60/40 | Example |
| Re-11 | E-7 | 1.8 | — | — | F-1/F-8 | 50/50 | Example |
| Re-12 | E-1 | 1.5 | — | — | F-7/F-5 | 70/30 | Example |
| Re-A | E-4 | 1.0 | — | — | F-2/F-8 | 60/40 | Comparative Example |
| Re-B | E-8 | 0.6 | — | — | F-1/F-8 | 70/30 | Comparative Example |
| Re-C | E-6 | 2.0 | — | — | F-1/F-8 | 50/50 | Comparative Example |

[Preparation of Topcoat Composition]

Various components included in the topcoat composition show in Table 5 are shown below.

<Resin (PT)>

As the resin (PT) shown in Table 5, resins PT-1 to PT-3 shown in Table 3 were used.

<Additive (DT)>

The structures of the additives (DT) shown in Table 5 are shown below.

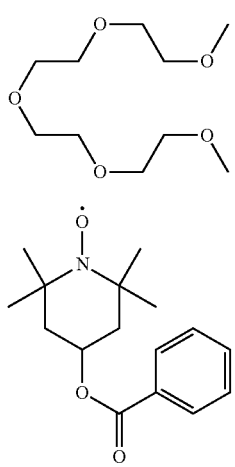

DT-1

DT-2

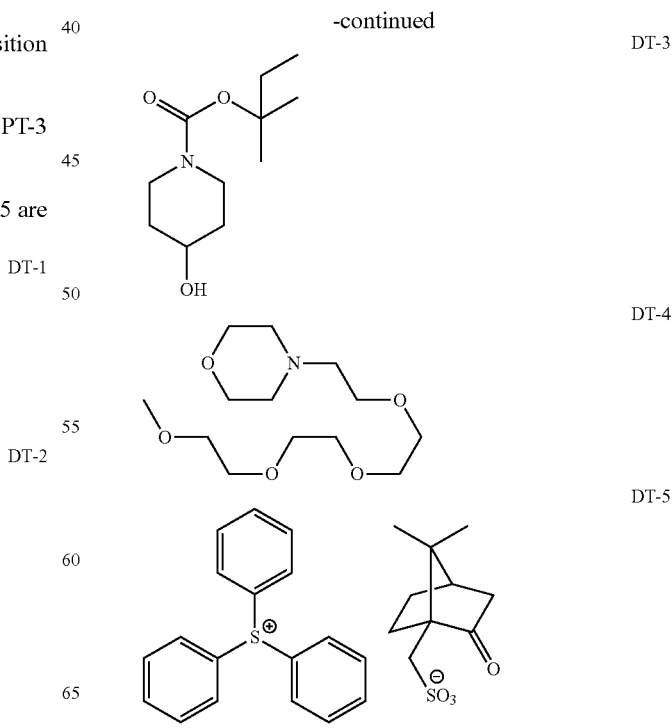

DT-3

DT-4

DT-5

<Surfactant (H)>

As the surfactant (H) shown in Table 5, a surfactant H-3 shown in Table 4 was used.

<Solvents (FT)>

The solvents (FT) shown in Table 5 are shown below.
FT-1: 4-Methyl-2-pentanol (MIBC)
FT-2: n-Decane
FT-3: Diisoamyl ether <Preparation of Topcoat Composition>

The respective components shown in Table 5 were mixed until the concentration of the solid content became 3% by mass. Then, the obtained mixed liquid was first filtered through a polyethylene-based filter having a pore diameter of 50 nm, then filtered through a nylon-based filter having a pore diameter of 10 nm, and lastly filtered through a polyethylene-based filter having a pore diameter of 5 nm to prepare a topcoat composition. Further, a solid content as mentioned herein means all the components except for the solvent (FT). The obtained topcoat composition was used in Examples and Comparative Examples.

TABLE 5

| | Topcoat composition | | | | | | |
|---|---|---|---|---|---|---|---|
| Resin (PT) | | Additive (DT) | | Surfactant (H) | | Solvent (FT) | |
| Type | Mass [g] | Type | Mass [g] | Type | Mass [g] | Type | Mixing ratio (mass) |
| TC-1 PT-1 | 10 | DT-1/DT-2 | 1.3/0.06 | | | FT-1/FT-2 | 70/30 |
| TC-2 PT-2 | 10 | DT-3/DT-4 | 0.04/0.06 | H-3 | 0.005 | FT-1/FT-3 | 75/25 |
| TC-3 PT-3 | 10 | DT-5 | 0.05 | | | FT-1/FT-3 | 10/90 |

[Pattern Formation and Various Evaluations]
<Pattern Formation: ArF Liquid Immersion Exposure and Organic Solvent Development>

A composition for forming an organic antireflection film, ARC29SR (manufactured by Brewer Science Ltd.) was applied onto a silicon wafer and baked at 205° C. for 60 seconds to form an antireflection film having a film thickness of 98 nm. A resist composition shown in Table 6 was applied thereonto (here, the composition is shown in Table 4) and baked at 100° C. for 60 seconds to form a resist film having a film thickness of 90 nm (actinic ray-sensitive or radiation-sensitive film). Further, with respect to Example 1-5, Example 1-6, and Example 1-9, a topcoat film was formed on the upper layer of the actinic ray-sensitive or radiation-sensitive film (the type of the topcoat composition used is shown in Table 6). The film thickness of the topcoat film was set to 100 nm in any case.

The actinic ray-sensitive or radiation-sensitive film was exposed through a 6% halftone mask with a 1:1 line-and-space pattern with a line width 45 nm, using an ArF excimer laser liquid immersion scanner (manufactured by ASML; XT1700i, NA1.20, Dipole, outer sigma 0.950, inner sigma 0.850, Y deflection). As the immersion liquid, ultrapure water was used.

The actinic ray-sensitive or radiation-sensitive film after exposure was baked at 120° C. for 60 seconds, developed with n-butyl acetate for 30 seconds, rinsed with 4-methyl-2-pentanol for 30 seconds, and then spin-dried to obtain a negative-tone pattern.

(Performance Evaluations)

Evaluations of the obtained pattern were performed by methods shown below. The evaluation results are shown in Table 6.

Exposure Latitude (EL, %) (Evaluation Item 1)

The line width was observed using a critical dimension scanning electron microscope (SEM, S-9380II manufactured by Hitachi High Technologies Corporation), and an optimal exposure dose upon resolution of a line pattern with an average line width of 45 nm was taken as a sensitivity ($E_{opt}$) (mJ/cm$^2$). On the basis of the determined optimal exposure dose ($E_{opt}$), an exposure dose at which the line width became a desired value, 45 nm±10% (that is, 40.5 nm and 49.5 nm) was determined. Further, an exposure latitude (EL, %) as defined by the following formula was calculated. As the EL value is larger, a change in performance due to a change in the exposure dose is smaller, which is thus good. Incidentally, EL (%) is preferably 20% or more, more preferably 25% or more, and still more preferably 27% or more.

[EL (%)]=[(Exposure dose at which the line width becomes 40.5 nm)−(Exposure dose at which the line width becomes 49.5 nm)]/$E_{opt}$×100

Furthermore, with regard to the exposure latitude evaluation, the evaluation was performed on the basis of the following standard.

"A": EL (%) is 27 or more
"B": EL (%) is 25 or more and less than 27
"C": EL (%) is 20 or more and less than 25
"D": EL (%) is less than 20

Line Width Roughness (LWR, nm) (Evaluation Item 2)

Upon observation of a 45 nm (1:1) line-and-space pattern resolved at an optimal exposure dose for resolution of a line pattern having an average line width of 45 nm from the upper part of the pattern, using a critical dimension scanning electron microscope (SEM S-9380II, manufactured by Hitachi High Technologies Corporation), the values of line width were measured at optional points and a standard deviation thereof was evaluated as 3σ. A smaller value thereof indicates better performance. Incidentally. LWR (nm) is preferably 2.8 nm or less, more preferably 2.5 nm or less, and still more preferably 2.3 nm or less.

TABLE 6

| | Actinic ray-sensitive or radiation-sensitive resin composition | Topcoat composition | Evaluation item 1 EL [%] | | Evaluation item 2 LWR [nm] |
|---|---|---|---|---|---|
| Example 1-1 | Re-1 | | 27 | A | 2.2 |
| Example 1-2 | Re-2 | | 28 | A | 2.1 |
| Example 1-3 | Re-3 | | 25 | B | 2.4 |
| Example 1-4 | Re-4 | | 24 | C | 2.5 |

TABLE 6-continued

| | Actinic ray-sensitive or radiation-sensitive resin composition | Topcoat composition | Evaluation item 1 EL [%] | | Evaluation item 2 LWR [nm] |
|---|---|---|---|---|---|
| Example 1-5 | Re-5 | TC-1 | 25 | B | 2.5 |
| Example 1-6 | Re-6 | TC-2 | 27 | A | 2.1 |
| Example 1-7 | Re-7 | | 25 | B | 2.4 |
| Example 1-8 | Re-8 | | 24 | C | 2.5 |
| Example 1-9 | Re-9 | TC-3 | 28 | A | 2.3 |
| Example 1-10 | Re-10 | | 23 | C | 2.6 |
| Example 1-11 | Re-11 | | 22 | C | 2.6 |
| Example 1-12 | Re-12 | | 20 | C | 2.8 |
| Comparative Example 1-1 | Re-A | | 17 | D | 2.9 |
| Comparative Example 1-2 | Re-B | | 18 | D | 3 |
| Comparative Example 1-3 | Re-C | | 19 | D | 3.2 |

<Pattern Formation (2): ArF Liquid Immersion Exposure and Aqueous Alkali Solution Development>

A composition for forming an organic antireflection film, ARC29SR (manufactured by Brewer Science Ltd.) was applied onto a silicon wafer and baked at 205° C. for 60 seconds to form an antireflection film having a film thickness of 98 nm. A resist composition shown in Table 7 was applied thereonto (here, the composition is shown in Table 4) and baked at 100° C. for 60 seconds to form an actinic ray-sensitive or radiation-sensitive film having a film thickness of 90 nm. Further, with respect to Example 2-5 and Example 2-6, a topcoat film was formed on the upper layer of the actinic ray-sensitive or radiation-sensitive film (the type of the topcoat composition used is shown in Table 7). The film thickness of the topcoat film was set to 100 nm in any case.

The actinic ray-sensitive or radiation-sensitive film was exposed through a 6% halftone mask with a 1:1 line-and-space pattern with a line width 45 nm, using an ArF excimer laser liquid immersion scanner (manufactured by ASML; XT1700i, NA1.20, Dipole, outer sigma 0.950, inner sigma 0.890, Y deflection). As the immersion liquid, ultrapure water was used.

The actinic ray-sensitive or radiation-sensitive film after exposure was baked at 120° C. for 60 seconds, developed with an aqueous tetramethylammonium hydroxide solution (2.38% by mass) for 30 seconds, rinsed with pure water for 30 seconds, and then spin-dried to obtain a positive-tone pattern.

(Performance Evaluation)

Evaluations of the obtained pattern were performed by methods shown below. The evaluation results are shown in Table 7.

Exposure Latitude (EL, %) (Evaluation Item 1)

The line width was observed using a critical dimension scanning electron microscope (SEM, S-9380II manufactured by Hitachi High Technologies Corporation), and an optimal exposure dose upon resolution of a line pattern with an average line width of 45 nm was taken as a sensitivity ($E_{opt}$) (mJ/cm$^2$). On the basis of the determined optimal exposure dose ($E_{opt}$), an exposure dose at which the line width became a desired value, 45 nm±10% (that is, 40.5 nm and 49.5 nm) was determined. Further, an exposure latitude (EL, %) as defined by the following formula was calculated. As the EL value is larger, a change in performance due to a change in the exposure dose is smaller, which is thus good. Incidentally, EL (%) is preferably 20% or more, more preferably 23% or more, and still more preferably 25% or more.

[EL (%)]=[(Exposure dose at which the line width becomes 40.5 nm)−(Exposure dose at which the line width becomes 49.5 nm)]/$E_{opt}$×100

Furthermore, with regard to the exposure latitude evaluation, the evaluation was performed on the basis of the following standard.

"A": EL (%) is 25 or more
"B": EL (%) is 23 or more and less than 25
"C": EL (%) is 20 or more and less than 23
"D": EL (%) is less than 20

Line Width Roughness (LWR nm) (Evaluation Item 2)

Upon observation of a 45 nm (1:1) line-and-space pattern resolved at an optimal exposure dose for resolution of a line pattern having an average line width of 45 nm from the upper part of the pattern, using a critical dimension scanning electron microscope (SEM S-9380II, manufactured by Hitachi High Technologies Corporation), the values of line width were measured at optional points and a standard deviation thereof was evaluated as 3σ. A smaller value thereof indicates better performance. Incidentally, LWR (nm) is preferably 3.0 nm or less, more preferably 2.5 nm or less, and still more preferably 2.3 nm or less.

TABLE 7

| | Actinic ray-sensitive or radiation-sensitive resin composition | Topcoat composition | Evaluation item 1 EL [%] | | Evaluation item 2 LWR [nm] |
|---|---|---|---|---|---|
| Example 2-1 | Re-1 | | 25 | A | 2.1 |
| Example 2-2 | Re-2 | | 26 | A | 2.3 |
| Example 2-3 | Re-3 | | 23 | B | 2.5 |
| Example 2-4 | Re-4 | | 23 | B | 2.6 |
| Example 2-5 | Re-5 | TC-3 | 23 | B | 2.4 |
| Example 2-6 | Re-6 | TC-3 | 26 | A | 2.1 |
| Example 2-7 | Re-7 | | 23 | B | 2.5 |
| Example 2-8 | Re-8 | | 23 | B | 2.6 |
| Example 2-9 | Re-9 | | 26 | A | 2.2 |
| Example 2-10 | Re-10 | | 22 | C | 2.5 |
| Example 2-11 | Re-11 | | 22 | C | 2.7 |
| Example 2-12 | Re-12 | | 20 | C | 2.7 |
| Comparative Example 2-1 | Re-A | | 15 | D | 3.2 |
| Comparative Example 2-2 | Re-B | | 17 | D | 3.3 |
| Comparative Example 2-3 | Re-C | | 18 | D | 3.3 |

From the results in Table 6 and 7, it is clear that the actinic ray-sensitive or radiation-sensitive resin compositions of Examples have excellent exposure latitudes (EL).

In addition, from the comparisons of Examples 1-1 to 1-10 and the comparisons of Examples 2-1 to 2-10, it was confirmed that in a case where the betaine compound (C) is a compound represented by General Formula (1), R$_2$ in the compound is a divalent linking group represented by General Formula (2), and L$_1$ is a single bond, EL performance and/or LWR performance is more excellent (a comparison of Examples 1-1 to 1-9 vs. Example 1-10, and a comparison of Examples 2-1 to 2-9 vs. Example 2-10).

In addition, from the comparisons of Examples 1-1 to 1-10 and the comparisons of Examples 2-1 to 2-10, it was confirmed that in a case where the betaine compound (C) is a compound represented by General Formula (1A), EL performance and/or LWR performance is more excellent (a comparison of Examples 1-1 to 1-3, Examples 1-5 to 1-7 and Example 1-9 vs. Example 1-4 and Example 1-8, and a comparison of Examples 2-1 to 2-3, Examples 2-5 to 2-7 and Example 2-9 vs. Example 2-4 and Example 2-8). Among those, in a case where the betaine compound (C) is a compound represented by General Formula (1A) and has a pKa of −1.0 to 1.0 as the anionic moiety is protonated, EL performance and/or LWR performance is more excellent (Examples 1-1, 1-2, 1-6, and 1-9, and Examples 2-1, 2-2, 2-6, and 2-9).

In addition, from a comparison of Example 1-1 to 1-10 vs. Examples 1-11 and 1-12, and a comparison of Examples 2-1 to 2-10 vs. Examples 2-11 and 2-12, it was confirmed that by using the compound represented by General Formula (1) and another acid generator in combination, LWR is more excellent.

On the other hand, it was clarified that a desired effect is not obtained with the actinic ray-sensitive or radiation-sensitive resin compositions of Comparative Examples.

What is claimed is:

1. An actinic ray-sensitive or radiation-sensitive resin composition comprising a compound represented by General Formula (1),

(1)

in General Formula (1), X represents a sulfur atom or an iodine atom; m represents 1 or 2, in a case where X is a sulfur atom, m is 2, and in a case where X is an iodine atom, m is 1; each $R_1$ independently represents an alkyl group or alkenyl group which may have a heteroatom, an aromatic heterocyclic group, or an aromatic hydrocarbon ring group; in a case where m is 2, two $R_1$'s may be bonded to each other to form a ring; $R_2$ represents a divalent linking group; $R_3$ represents a divalent linking group having no aromatic group; and $Y^-$ represents an anionic moiety, and the pKa of the compound represented by General Formula (1) as $Y^-$ is protonated is −1 to 1.0.

2. The actinic ray-sensitive or radiation-sensitive resin composition according to claim 1,
wherein X is a sulfur atom.

3. The actinic ray-sensitive or radiation-sensitive resin composition according to claim 1,
wherein $R_2$ is a divalent linking group represented by General Formula (2),

(2)

in General Formula (2), $L_1$ represents a single bond or a divalent linking group; $T_1$ represents a divalent aromatic hydrocarbon ring group or a divalent aromatic heterocyclic group; * represents a bonding position with X; and ** represents a bonding position with $R_3$.

4. The actinic ray-sensitive or radiation-sensitive resin composition according to claim 3,
wherein $L_1$ is a single bond.

5. The actinic ray-sensitive or radiation-sensitive resin composition according to claim 1, further comprising an acid generator other than the compound represented by General Formula (1).

6. The actinic ray-sensitive or radiation-sensitive resin composition according to claim 5,
wherein the pKa of an acid generated from the acid generator other than the compound represented by General Formula (1) is lower than the pKa of the compound represented by General Formula (1) as $Y^-$ is protonated.

7. The actinic ray-sensitive or radiation-sensitive resin composition according to claim 1,
wherein the compound represented by General Formula (1) is a compound represented by General Formula (1A),

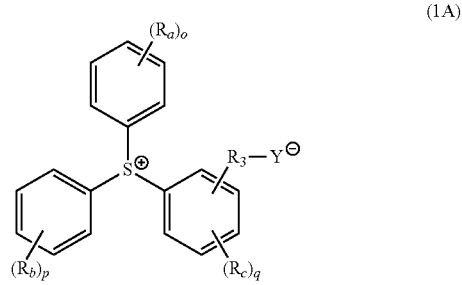

(1A)

in which $R_a$, $R_b$, and $R_c$ each independently represents a halogen atom, an alkyl group, a cycloalkyl group, an alkoxy group, an alkylcarbonyloxy group, an alkyloxycarbonyl group, or an alkylthio group; o, p, and q each independently represents an integer of 0 to 3; in a case where o is 2 or more, a plurality of $R_a$'s may be the same as or different from each other and at least two $R_a$'s may be bonded to each other to form a ring; in a case where p is 2 or more, a plurality of $R_b$'s may be the same as or different from each other and at least two $R_b$'s may be bonded to each other to form a ring; in a case where q is 2 or more, a plurality of $R_c$'s may be the same as or different from each other and at least two $R_c$'s may be bonded to each other to form a ring; $R_3$ represents a divalent linking group having no aromatic group; and $Y^-$ represents an anionic moiety, and the pKa of the compound represented by General Formula (1A) as $Y^-$ is protonated is −1.0 to 1.0.

8. The actinic ray-sensitive or radiation-sensitive resin composition according to claim 1,
wherein $R_3$ is —O—, —CO—, —S—, —SO—, —SO$_2$—, —NR$_d$—, an alkylene group which may be substituted with a fluorine atom, or a group formed by combination of two or more of these groups, and $R_d$ is a hydrogen atom or an alkyl group.

9. The actinic ray-sensitive or radiation-sensitive resin composition according to claim 1, further comprising a resin having a repeating unit having a group whose polarity increases through decomposition by the action of an acid.

10. A resist film formed using the actinic ray-sensitive or radiation-sensitive resin composition according to claim 1.

11. A pattern forming method comprising:
forming a resist film using the actinic ray-sensitive or radiation-sensitive resin composition according to claim 1;
exposing the resist film; and
developing the exposed resist film using a developer.

12. A method for manufacturing an electronic device, comprising the pattern forming method according to claim 11.

* * * * *